United States Patent
Komatsu

(10) Patent No.: US 10,474,393 B2
(45) Date of Patent: Nov. 12, 2019

(54) MULTI-RANK SDRAM CONTROL METHOD AND SDRAM CONTROLLER

(71) Applicant: FANUC CORPORATION, Minamitsuru-gun, Yamanashi (JP)

(72) Inventor: Takaaki Komatsu, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/928,394

(22) Filed: Mar. 22, 2018

(65) Prior Publication Data

US 2018/0275924 A1    Sep. 27, 2018

(30) Foreign Application Priority Data

Mar. 23, 2017  (JP) ................. 2017-057033

(51) Int. Cl.
| | |
|---|---|
| G06F 12/00 | (2006.01) |
| G06F 13/00 | (2006.01) |
| G06F 13/28 | (2006.01) |
| G06F 3/06 | (2006.01) |
| G06F 11/10 | (2006.01) |
| G11C 29/52 | (2006.01) |

(Continued)

(52) U.S. Cl.
CPC .......... *G06F 3/0659* (2013.01); *G06F 3/0619* (2013.01); *G06F 3/0673* (2013.01); *G06F 11/1068* (2013.01); *G06F 12/0884* (2013.01); *G06F 13/4204* (2013.01); *G11C 29/52* (2013.01)

(58) Field of Classification Search
CPC ............... G06F 9/3885; G06F 12/0884; G06F 13/4204; G06F 17/30985
USPC .......................................................... 711/104
See application file for complete search history.

(56) References Cited

U.S. PATENT DOCUMENTS

| | | | | |
|---|---|---|---|---|
| 2002/0003741 A1* | 1/2002 | Maesako | ................ | G11C 7/103 |
| | | | | 365/230.03 |
| 2007/0058410 A1* | 3/2007 | Rajan | ....................... | G11C 5/02 |
| | | | | 365/63 |

(Continued)

FOREIGN PATENT DOCUMENTS

| | | |
|---|---|---|
| CN | 1734670 | 2/2006 |
| CN | 102497567 | 6/2012 |

(Continued)

OTHER PUBLICATIONS

Notice of Reasons for Rejection dated May 8, 2018 in Japanese Application No. 2017-057033, with English translation.

(Continued)

*Primary Examiner* — Edward J Dudek, Jr.
*Assistant Examiner* — Sidney Li
(74) *Attorney, Agent, or Firm* — Wenderoth, Lind & Ponack, L.L.P.

(57) ABSTRACT

To provide a multi-rank SDRAM control method and an SDRAM controller that prevent performance degradation and minimize increase in parts count even in a multi-rank SDRAM configuration. A multi-rank SDRAM control method controls a multi-rank SDRAM formed by connecting data buses of multiple SDRAM devices. In each of the multiple SDRAM devices, only a data mask signal for a rank of the SDRAM device, which is to be accessed, is negated, whereby an access to the rank is executed.

5 Claims, 48 Drawing Sheets

(51) Int. Cl.
    *G06F 12/0884*    (2016.01)
    *G06F 13/42*    (2006.01)

(56) References Cited

U.S. PATENT DOCUMENTS

| | | | | |
|---|---|---|---|---|
| 2007/0153588 A1* | 7/2007 | Janzen | ............. | G11C 5/02 |
| | | | | 365/189.03 |
| 2007/0260841 A1* | 11/2007 | Hampel | ............. | G06F 13/1684 |
| | | | | 711/167 |
| 2008/0183985 A1* | 7/2008 | Bellows | ............. | G06F 13/1694 |
| | | | | 711/158 |

FOREIGN PATENT DOCUMENTS

| | | |
|---|---|---|
| JP | 11-297085 | 10/1999 |
| JP | 2008-21364 | 1/2008 |
| JP | 2008-276343 | 11/2008 |
| JP | 2008-293413 | 12/2008 |
| JP | 2009-301415 | 12/2009 |

OTHER PUBLICATIONS

Office Action dated Feb. 20, 2019 in Chinese Application No. 201810229116.0.

\* cited by examiner

FOURTH EMBODIMENT

SEVENTH EMBODIMENT  TO FIG. 14A

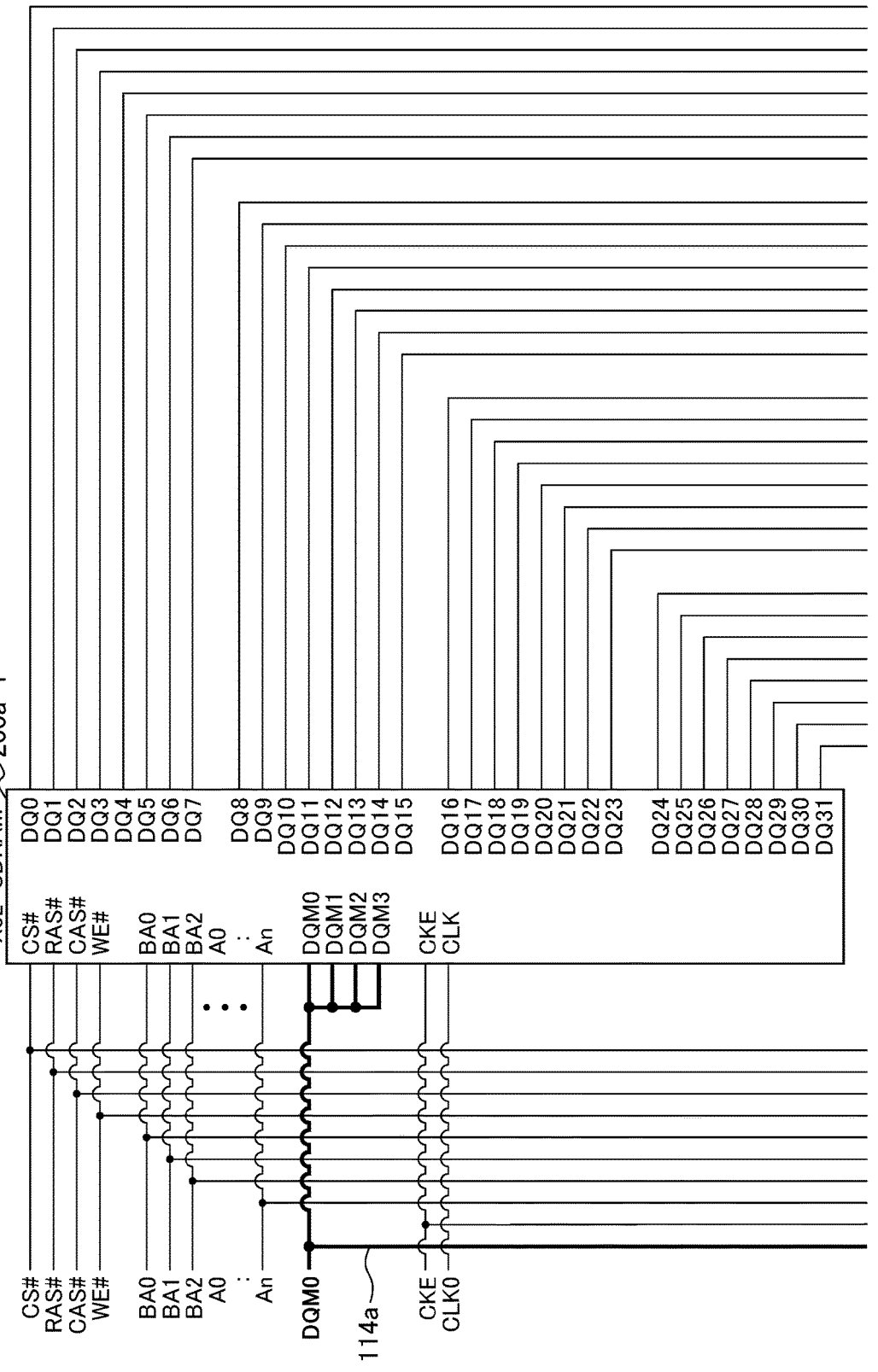

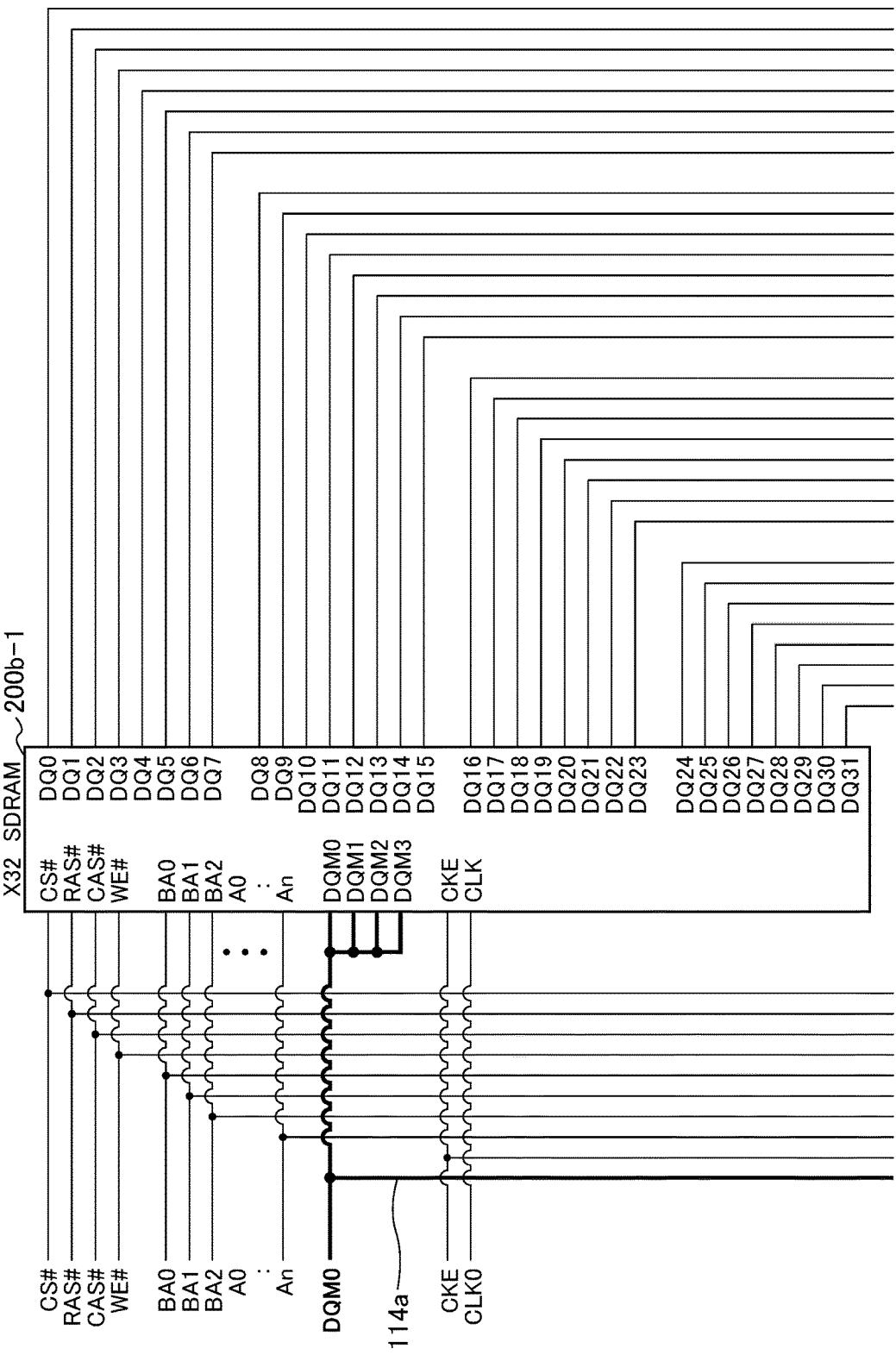

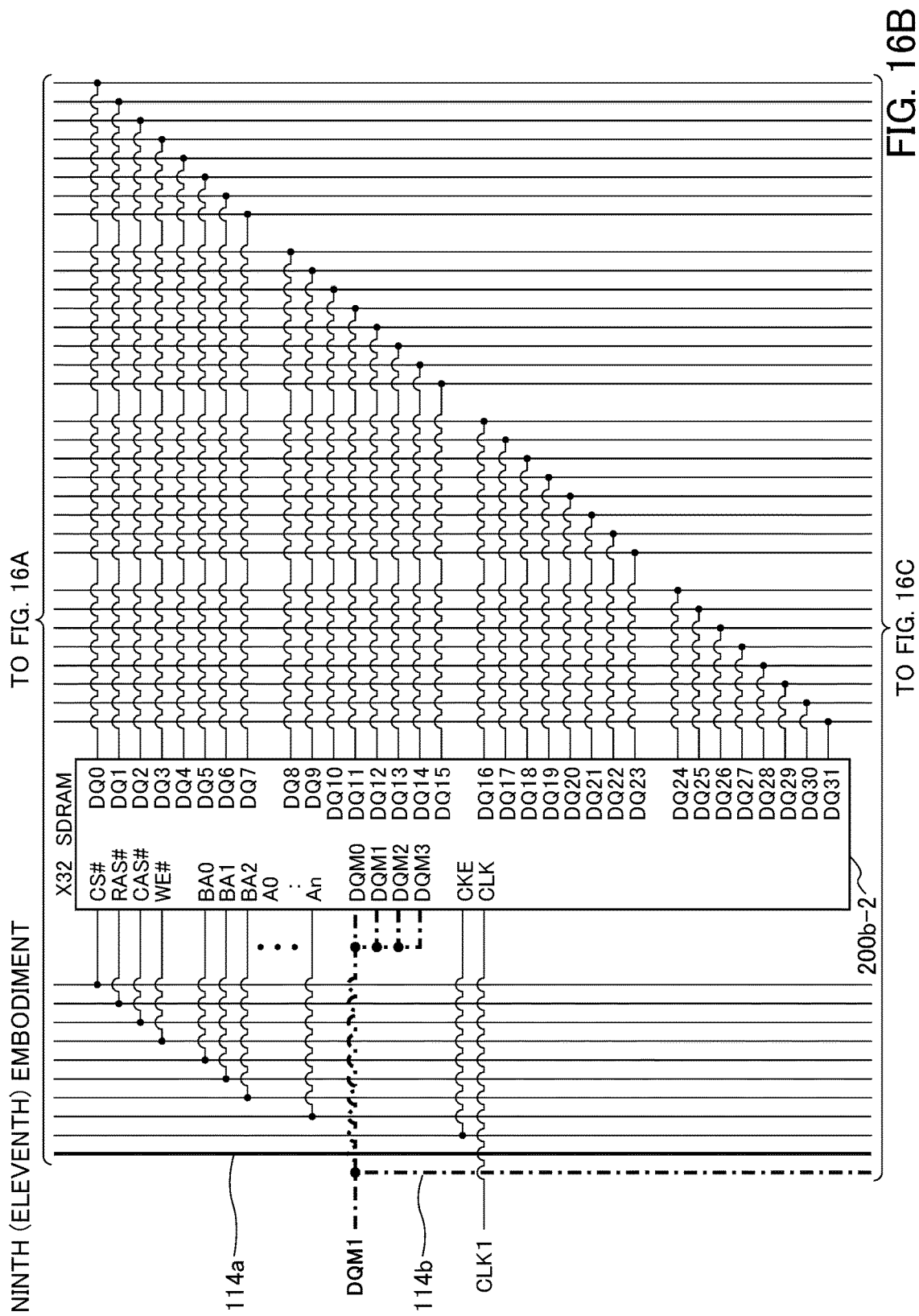

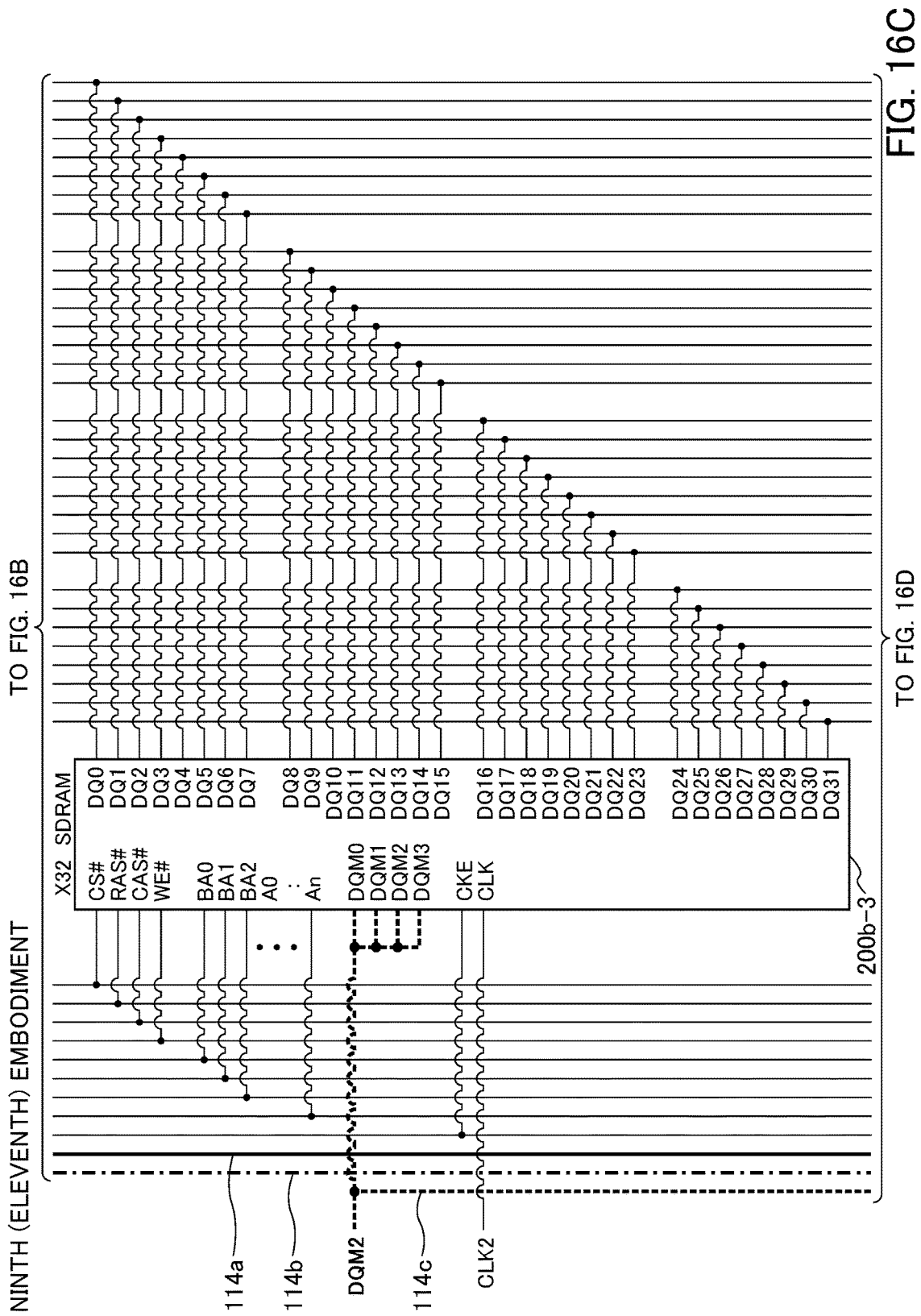

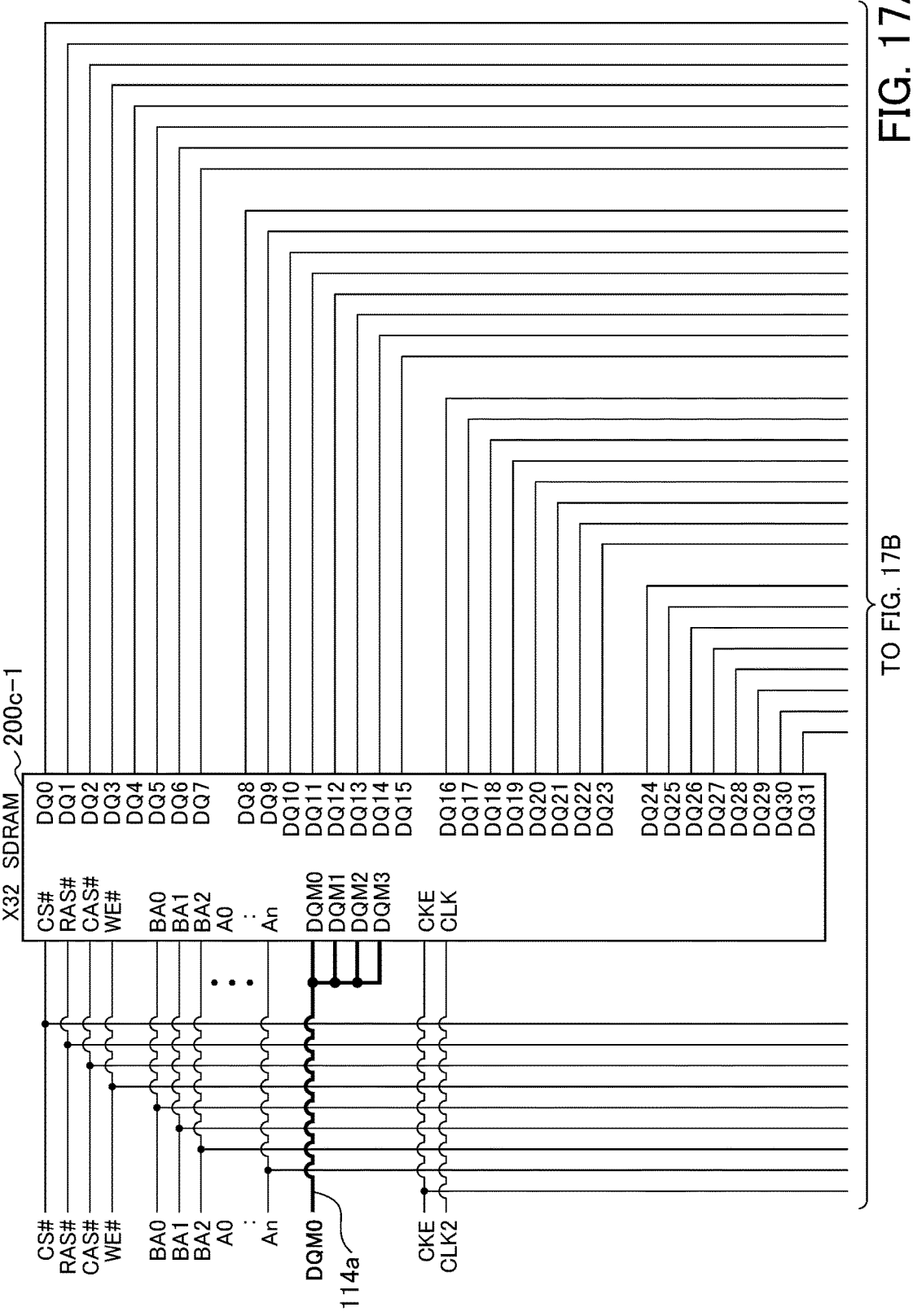

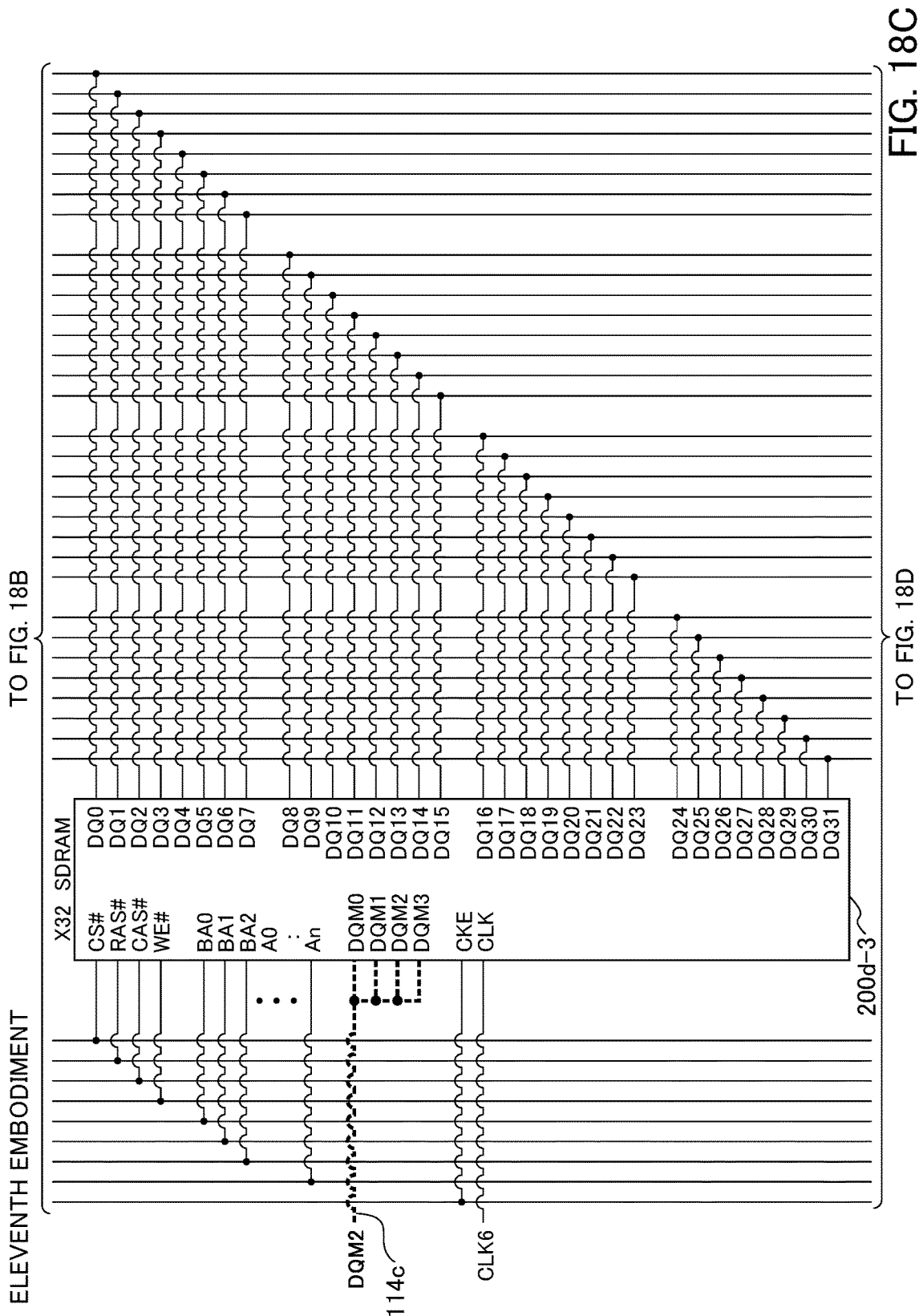

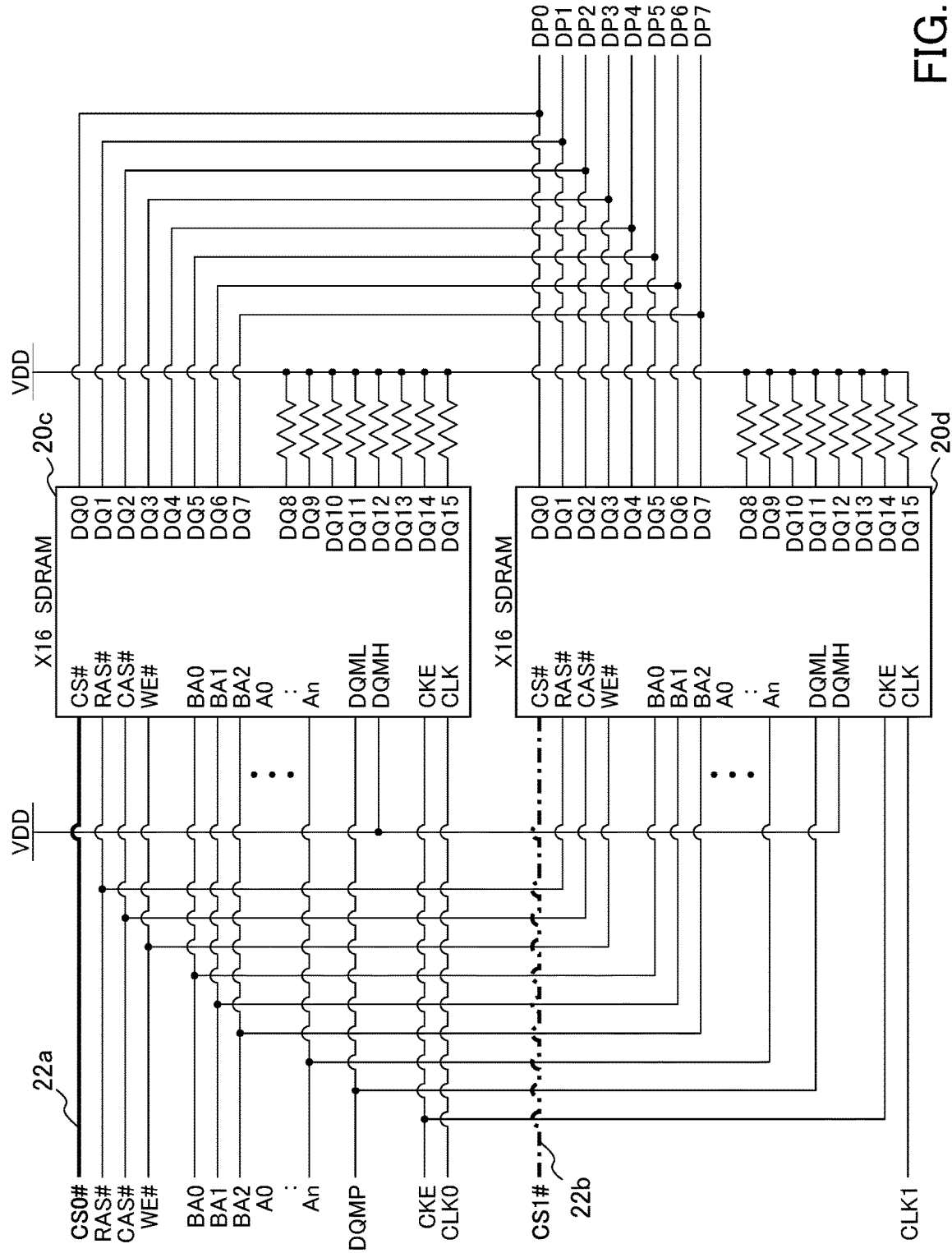

MULTI-RANK SDRAM CONTROL METHOD AND SDRAM CONTROLLER

This application is based on and claims the benefit of priority from Japanese Patent Application No. 2017-057033, filed on Mar. 23, 2017, the content of which is incorporated herein by reference.

BACKGROUND OF THE INVENTION

Field of the Invention

The present invention relates to an SDRAM controller and a control method for a multi-rank synchronous dynamic RAM (SDRAM). The present invention particularly relates to an SDRAM controller and a control method allowing rank control not only for data but also for parity or an error correction code (ECC).

Related Art

When a large-capacity SDRAM is needed, a configuration what is called a multi-rank configuration has been employed in some cases. The multi-rank configuration means a configuration where multiple SDRAM devices are connected to one bus line for data in an SDRAM. The "SDRAM" mentioned herein is typically a single data rate (SDR) SDRAM in a narrow sense.

FIG. 19A is an explanatory view showing an exemplary configuration of a conventional single-rank (one-rank) memory and an exemplary configuration of a conventional dual-rank (two-rank) memory. As shown by Single Rank of FIG. 19A, in the single-rank memory, data lines 16 extend from a processor 10 and one SDRAM device 12 is connected to each of the data lines 16. Specifically, the processor 10, an SDRAM controller 14, and one SDRAM device 12 are connected to one data line 16.

As shown by Dual Rank of FIG. 19A, in the dual-rank memory, the data lines 16 extend from the processor 10 and two SDRAM devices 12 are connected to each of the data lines 16. Specifically, the processor 10, the SDRAM controller 14, and two SDRAM devices 12 are connected to one data line 16.

As described above, FIG. 19A shows connection between the processor 10, the SDRAM devices 12, and the SDRAM controller 14. The processor 10 may further function as the SDRAM controller 14 and such a configuration is shown in FIG. 19B. A data bus for the processor 10 and a data bus for the SDRAM controller 14 may be separated and such a configuration is shown in FIG. 19C.

A multi-rank configuration for an SDRAM has conventionally been achieved generally by separating CS# (chip select signal) by rank and asserting only CS# of a rank to be accessed. FIG. 20 shows a circuit configuration employed for controlling a rank using such CS#. FIG. 20 shows an example of a dual-rank configuration including an SDRAM device 20a in a first rank and an SDRAM device 20b in a second rank. Data lines are connected to data lines (D0 to D15) of each of the SDRAM devices 20a and 20b. Rank selection in this circuit configuration is such that either of the first rank or the second rank is selected by asserting either a chip select signal CS0#22a or a chip select signal CS1#22b. These chip select signals CS0#22a and CS1#22b are asserted exclusively in accordance with a high-order bit of an address, for example.

In many cases where high reliability is required, parity or an ECC has been added to data. Typically, eight-bit parity is added to 64-bit data, for example. To realize such eight-bit parity or an eight-bit ECC using an SDRAM device having a 16-bit data port, eight bits of the 16-bit data port of the SDRAM device for parity/ECC are used for the parity or ECC, and the other eight bits of the 16-bit data port remain unused.

FIG. 21 shows a circuit configuration of such an SDRAM device for parity/ECC employed for controlling a rank using CS# described above. FIG. 21 shows an example of a dual-rank (two-rank) configuration including an SDRAM device 20c for parity in a first rank and an SDRAM device 20d for parity in a second rank. Eight bits in a data line (parity: DP0 to DP7) are connected to eight bits of each 16-bit data port of the SDRAM devices 20c and 20d. Rank selection in this circuit configuration is such that one of the first rank and the second rank is selected by asserting either the chip select signal CS0#22a or the chip select signal CS1#22b. Like in the case of FIG. 20, these chip select signals CS0#22a and CS1#22b are asserted exclusively in accordance with a high-order bit of an address, for example. As shown in FIG. 21, only the lower-order eight bits of each 16-bit data port of the SDRAM devices 20c and 20d are used as parity, whereas the higher-order eight bits of each 16-bit data port of the SDRAM devices 20c and 20d remain unused and pulled up to a supply voltage VDD. In this example, the lower-order eight bits are used as parity. These bits are also usable as an ECC in the same way.

In multi-rank configurations, SDRAM devices such as 20c and 20d with eight bits unused are required in number corresponding to the number of ranks. This has led to waste.

Whether data or parity, accessing a rank immediately after accessing another rank requires a certain wait time in some cases for avoiding a conflict between the ranks. This has caused a possible performance penalty, compared to a one-rank configuration.

PRIOR ART DOCUMENTS

For example, according to the disclosure of patent document 1 mentioned below, storage means 2 (with a data input/output terminal having a 64-bit width) of a memory module 1 includes data inputs/outputs DQ0 to DQ7, DQ8 to DQ15, ... divided into eight-bit segments corresponding to mask signals (DQM0 to DQM7) (FIG. 1 and paragraphs [0012] and [0013] of patent document 1). The mask signals (DQM0 to DQM7) are generated based on lower-order three bits of an address ([0017] and FIG. 2).

According to patent document 2, a data input/output circuit 20 masks writing of data and reading of data into and from a memory cell MC in response to the logic of a data mask signal BDM0-7 (FIG. 1, paragraphs [0018] and [0027] of patent document 2). The memory cell MC is a pseudo SRAM having an SDRAM interface (paragraph [0009]). Specifically, patent document 2 discloses operation for reading and writing data by negating only a DQM signal corresponding to a byte of an SDRAM to be accessed.

Patent document 3 discloses use of a lower-order data mask signal during reading (paragraph [0046] of patent document 3).

Patent Document 1: Japanese Unexamined Patent Application, Publication No. 2008-293413
Patent Document 2: Japanese Unexamined Patent Application, Publication No. 2008-021364
Patent Document 3: Japanese Unexamined Patent Application, Publication No. 2008-276343

SUMMARY OF THE INVENTION

As described above, the conventional multi-rank technique selects a rank using CS# (chip select signal). Hence, it has been necessary to insert wait time in some cases for avoiding a conflict between ranks, and this may degrade performance. Additionally, when a parity/ECC bit width is narrower than a data port width of an SDRAM device, there remain unused data bits in SDRAM devices and this is nothing but a waste.

The present invention has been made in view of the above-described problems. The present invention is intended to provide a multi-rank SDRAM control method without performance degradation even in a multi-rank SDRAM configuration. The present invention is further intended to provide a multi-rank SDRAM control method with fewer wasteful unused data bits even in a multi-rank SDRAM configuration. The present invention is intended to provide an SDRAM controller for executing these multi-rank SDRAM control methods.

To solve the above-described problems, the present invention is based on the principle that a rank to be accessed is selected using DQM (data mask signal), not using CS# (chip select signal). Specifically, DQM is separated by rank and only DQM of a rank to be accessed is negated. The signal DQM offers byte-wise data masking capability for read data or write data. When a memory is in an idle state, DQM is kept asserted (i.e., data is masked). In the case of a double data rate (DDR) SDRAM, a signal corresponding to DQM is identified by the name DM. This signal can only mask data to be written. The present invention is typically intended for a single data rate (SDR) SDRAM.

FIGS. 1 and 2 show the principle of solving the problems. FIG. 1 shows an example of the configuration of a dual-rank (two-rank) SDRAM in terms of data. FIG. 1 shows an example of a two-rank memory configuration including an SDRAM device 100a in Rank 0 and an SDRAM device 100b in Rank 1 having data lines commonly connected. Each of the SDRAM devices 100a and 100b is a 16-bit (×16) memory and includes a data mask signal terminal DQMH corresponding to the higher-order eight bits and a data mask signal terminal DQML corresponding to the lower-order eight bits.

In the example of FIG. 1, DQM0-114a is connected to DQML and DQMH of the SDRAM device 100a in Rank 0. To select Rank 0, DQM0-114a is negated, both DQMH and DQML are negated, and the data lines of the SDRAM device 100a are activated, thereby accessing Rank 0. Further, DQM1-114b is connected to DQML and DQMH of the SDRAM device 100b in Rank 1. To select Rank 1, DQM1-114b is negated, both DQMH and DQML are negated, and the data lines of the SDRAM device 100b are activated, thereby accessing Rank 1. In these cases, each CS# is asserted and both the SDRAM devices 100a and 100b are in operating states.

FIG. 2 shows an example of the configuration of a two-rank SDRAM in terms of parity/ECC. FIG. 2 shows a single SDRAM device 100c and shows a memory for parity/ECC having a two-rank configuration constructed from higher-order bytes and lower-order bytes of the SDRAM device 100c. This configuration assumes parity or an ECC of eight-bit width. The SDRAM device 100c is a 16-bit (×16) memory and includes a data mask signal terminal DQMH corresponding to the higher-order eight bits and a data mask signal terminal DQML corresponding to the lower-order eight bits.

In the example of FIG. 2, DQM0-114a is connected to DQML of the SDRAM device 100c. To select Rank 0, DQM0-114a of the SDRAM device 100c is negated and DQML is negated. As a result, the lower-order eight bits of the SDRAM device 100c are activated to allow access to the parity/ECC in Rank 0. Specifically, the lower-order eight bits of the SDRAM device 100c function as the parity/ECC in Rank 0.

Further, DQM1-114b is connected to DQMH of the SDRAM device 100c. To select Rank 1, DQM1-114b of the SDRAM device 100c is negated and DQMH is negated. As a result, the higher-order eight bits of the SDRAM device 100c are activated to allow access to the parity/ECC in Rank 1. Specifically, the higher-order eight bits of the SDRAM device 100c function as the parity/ECC in Rank 1.

The principle of the present invention will be described by referring to a timing chart. FIG. 3 is a timing chart showing operation of accessing a conventional multi-rank SDRAM using CS#. The vertical axis shows various types of signals. The following signals are listed from the top:

Rank0 Command: A command for Rank 0
Rank1 Command: A command for Rank 1
DQM: A data mask signal common to Rank 0 and Rank 1
Rank0 Data: Data in Rank 0
Rank1 Data: Data in Rank 1

The horizontal axis of FIG. 3 shows time and time is to pass from a period P1 to a period P10. The timing chart of FIG. 3 shows reading from a rank immediately after reading from another rank, assuming that CAS latency is two and a burst length is four.

Referring first to the period P1 in FIG. 3, DQM is asserted, and therefore data in any rank is masked. In a period P2, a READ command (READ a) is issued for Rank 0. In the period P2, DQM is negated to allow access to data. This explanation assumes that CAS latency is two. Thus, in a period P4, an SDRAM in Rank 0 outputs data Data a0 onto a data bus. In a period P3, DQM is asserted. Thus, the SDRAM in Rank 0 does not output data in a period P5 and goes into a Hi-Z state. In the period P4, DQM continues to be asserted. Thus, the SDRAM in Rank 0 does not output data in a period P6 and remains in the Hi-Z state. In the period P5, DQM is negated. Thus, in a period P7, the SDRAM in Rank 0 outputs data Data a3 onto the data bus. This explanation assumes that the SDRAMs operate with a burst length of four. Thus, a READ cycle (READ a) in Rank 0 is finished in the period P7.

Also in the period P5, a new READ command (READ b) is issued for Rank 1. This explanation assumes that CAS latency is two. Thus, in the period P7, an SDRAM in Rank 1 outputs data Data b0 onto the data bus. In the period P6, DQM continues to be negated. Thus, in a period P8, the SDRAM in Rank 1 outputs data Data b1 onto the data bus.

As described above, in the period P7, the SDRAM in Rank 0 outputs the data Data a3 onto the data bus. At the same time, the SDRAM in Rank 1 outputs the data Data b0 onto the data bus. This unfortunately causes a conflict on the data bus. Also in the period P7, DQM continues to be negated. Thus, in a period P9, the SDRAM in Rank 1 outputs data Data b2 onto the data bus. Also in the period P8, DQM continues to be negated. Thus, in the period P10, the SDRAM in Rank 1 outputs data Data b4 onto the data bus. This explanation assumes that the SDRAMs operate with a burst length of four. Thus, a READ cycle (READ b) in Rank 1 is finished in the period P10. The SDRAM in Rank 0 finishes its read cycle in the period P7, and therefore it does not output data in the period P8 and later and goes into the Hi-Z state.

As a result of the above-described operation, if a command for Rank 0 and a command for Rank 1 are issued successively in a short time, the conflict 104 shown in FIG. 3 becomes unavoidable. To avoid a conflict, a fixed time interval should be provided between commands across ranks. This may be achieved by a method such as insertion of a wait time, for example. This causes undesirable delay in memory access and degrades performance. To avoid the conflict 104 shown in FIG. 3, READ in Rank 1 should be delayed further by two periods.

Operation according to a DQM control suggested by the present invention will be described next. FIG. 4 is a timing chart showing operation of accessing a multi-rank SDRAM using DQM control described in the present invention. The vertical axis shows various types of signals. The following signals are listed from the top:
Command: A command common to Rank 0 and Rank 1
Rank0 DQM: A data mask signal for Rank 0
Rank1 DQM: A data mask signal for Rank 1
Rank0 Data: Data in Rank 0
Rank1 Data: Data in Rank 1
Like that of FIG. 3, the horizontal axis of FIG. 4 shows time and time is to pass from a period P1 to a period P10. The timing chart of FIG. 4 also shows reading from a rank immediately after reading from another rank, assuming that CAS latency is two.

Referring first to the period P1 in FIG. 4, DQM is asserted for Rank 0 and Rank 1, and therefore data in both ranks is masked. In a period P2, a READ command (READ a) is issued for both ranks. Further, DQM in Rank 0 is negated. This explanation assumes that CAS latency is two. Thus, in a period P4, an SDRAM in Rank 0 outputs data Data a0 onto a data bus. In the period P2, DQM in Rank 1 is asserted, and therefore an SDRAM in Rank 1 does not output data in the period P4 and remains in a Hi-Z state. In a period P3, DQM in Rank 0 is asserted. Thus, the SDRAM in Rank 0 does not output data in a period P5 and goes into the Hi-Z state. Also in the period P3, DQM in Rank 1 continues to be asserted. Thus, the SDRAM in Rank 1 does not output data in the period P5 and remains in the Hi-Z state.

In the period P4, DQM in each rank continues to be asserted. Thus, in a period P6, the SDRAM in each rank does not output data and remains in the Hi-Z state. In the period P5, a READ command (READ b) is issued for both ranks. Further, DQM in Rank 1 is negated. Even though the preceding READ cycle (READ a) is unfinished, the SDRAMs give priority to the READ command (READ b) issued later. This explanation assumes that CAS latency is two. Thus, in a period P7, the SDRAM in Rank 1 outputs data Data b0 onto the data bus. Meanwhile, DQM in Rank 0 continues to be asserted in the period P5. Thus, in the period P7, the SDRAM in Rank 0 does not output data and remains in the Hi-Z state.

In the period P6, DQM in Rank 0 continues to be asserted. Thus, in a period P8, the SDRAM in Rank 0 does not output data and remains in the Hi-Z state. Also in the period P6, DQM in Rank 1 continues to be negated. Thus, in the period P8, the SDRAM in Rank 1 outputs data Data b1 onto the data bus. As described above, in the period P7, the SDRAM in Rank 1 outputs the data Data b0 onto the data bus. Meanwhile, the SDRAM in Rank 0 does not output data and remains in the Hi-Z state. In this way, a conflict on the data bus is avoided. Also in the period P7, DQM in Rank 0 continues to be asserted. Thus, in a period P9, the SDRAM in Rank 0 does not output data and remains in the Hi-Z state. Also in the period P7, DQM in Rank 1 continues to be negated. Thus, in the period P9, the SDRAM in Rank 1 outputs data Data b2 onto the data bus.

In the period P8, DQM in Rank 0 continues to be asserted. Thus, in the period P10, the SDRAM in Rank 0 does not output data and remains in the Hi-Z state. Also in the period P8, DQM in Rank 1 continues to be negated. Thus, in the period P10, the SDRAM in Rank 1 outputs data Data b3 onto the data bus. This explanation assumes that the SDRAMs operate with a burst length of four. Thus, READ cycles (READ b) in both ranks are finished in the period P10. As a result of the above-described operation, even if a command for Rank 0 and a command for Rank 1 are issued successively, a time interval between these commands can be shortened, compared to that in the conventional CS# control. This contributes to improvement of performance, compared to the conventional CS# control.

<Selection of Rank>

The principle of the present invention is described above based on FIGS. 1, 2, 3, and 4. A rank is preferably selected by address. Further, a rank may be represented by any bit(s) of address. In principle, a relationship between an address and a rank can be defined freely. For example, a relationship between an address and a rank can be defined as follows.

If the number of ranks is any power of two, a rank may be selected using a low-order bit of an address. Assuming that an access size at a maximum burst length is $2^m$ bytes, for example, a rank can be selected using bits [m+r−1:m] of an N-bit address [N−1:0] in a $2^r$-rank configuration. Here, m and r are nonnegative integers, and N is a natural number. Example 1: If m is five, r is one, and N is 32, an access size at a maximum burst length is 32 bytes ($2^5$). In this case, a rank is designated using a bit [5] of a 32-bit address [31:0] in a two-rank ($2^1$-rank) configuration.

Example 2: If m is five, r is two, and N is 32, a rank is designated using bits [6:5] of a 32-bit address [31:0] in a four-rank configuration. Example 3: If m is five, r is four, and N is 32, a rank is designated using bits [7:5] of a 32-bit address [31:0] in an eight-rank configuration. Specifically, a "low-order bit of an address" mentioned herein means a lowest-order bit next to a bit representing a maximum burst access size. It is rational to match a maximum burst length in an SDRAM with a cache line size in a processor. A typical maximum burst access size is 32 bytes, 64 bytes, 128 bytes, or thereabouts.

<Position of Column Address>

A bit group in a place one bit higher than the bit(s) expressing the rank (a bit group in a place nearest to and higher than the bit(s) expressing the rank) can be a column address. A minimum number of bits in a column address to be supported is defined as k bits. Here, k is an integer. In this case, as described above, a rank is selected using bits [m+r−1:m] of an N-bit address [N−1:0]. Further, higher-order bits [m+r+k−1:m+r] of the N-bit address [N−1:0] is a column address. Column addresses with different values of r are given below.

Example 4: In the case of a two-rank configuration (r is one), bits [m+k:m+1] of the N-bit address [N−1:0] is a column address. Example 5: In the case of a four-rank configuration (r is two), bits [m+k+1:m+2] of the N-bit address [N−1:0] is a column address. Example 6: In the case of an eight-rank configuration (r is three), bits [m+k+2:m+3] of the N-bit address [N−1:0] is a column address. If these configurations are employed, bit groups in a higher order than the column address can be used as a bank address and a row address.

The above-described address allocation can contribute to performance improvement of a memory formed using a multi-rank SDRAM. Specifically, this address allocation can contribute to increase in a page size in a fast page mode. More specifically, an apparent page size can be extended by a multiple of the number of ranks. In the case of an SDRAM, the same row address can be accessed quickly. This means that effect achieved in this case is comparable to effect achieved by increasing an address range for the same row address.

<Allocation of Address>

Three specific examples of address allocation will be given. FIG. 5 is an explanatory view explaining a relationship between addresses in the case of a single-rank configuration. In the exemplary case of FIG. 5, a data bus width is 64 bits, a burst length is four, and each SDRAM device has a capacity of 128 Mbits or more. In FIG. 5, a processor address 106 consists of 32 bits. The low-order 12 bits of this address represent a page size, which is 4 KB.

An active command address 108 is a 15-bit address used with an active command. The lower-order 12 bits of this address represent a row address and correspond to bits [23:12] of the processor address 106. The higher-order two bits of the active command address 108 represent a bank address and correspond to bits [25:24] of the processor address 106. The remaining one bit [12] of the active command address 108 represents the most significant bit of the row address and corresponds to bit [26] of the processor address 106.

A read/write command address 110 is a 15-bit address used with a READ command or a WRITE command. The lower-order 10 bits of this address correspond to bits [11:3] of the processor address 106. One bit [10] higher than these bits of this address represents auto precharge (AP). The higher-order two bits of the read/write command address 110 represent a bank address. Like the bits of the active command address 108, these bits correspond to bits [25:24] of the processor address 106. The remaining two bits [12:11] of the read/write command address 110 represent a column address and correspond to bits [29:28] of the processor address 106.

FIG. 6 is an explanatory view explaining a relationship between addresses in the case of a dual-rank configuration. In the exemplary case of FIG. 6, a data bus width is also 64 bits, a burst length is also four, and each SDRAM device also has a capacity of 128 Mbits or more. In FIG. 6, a processor address 106 is an address having 32 bits. The low order 13 bits of this address represent a page size, which is 8 KB.

An active command address 108 is a 15-bit address used with an active command. The lower-order 12 bits of this address represent a lower-order row address and correspond to bits [24:13] of the processor address 106. The higher-order two bits of the active command address 108 represent a bank address and correspond to bits [26:25] of the processor address 106. The remaining one bit [12] of the active command address 108 represents the most significant bit of the row address and corresponds to bit [27] of the processor address 106.

A read/write command address 110 is a 15-bit address used with a READ command or a WRITE command. The lower-order nine bits of this address correspond to bits [12:3] of the processor address 106. A bit [5] of the processor address 106 is used as a rank bit 112 for selection of a rank, and therefore this bit is not used as the read/write command address 110. A higher-order one bit [9] of the read/write command address 110 corresponds to bit [28] of the processor address 106. A still higher-order one bit [10] of the read/write command address 110 represents auto precharge (AP).

The highest-order two bits of the read/write command address 110 represent a bank address. Like the bits of the active command address 108, these bits correspond to bits [26:25] of the processor address 106. The remaining two bits [12:11] of the read/write command address 110 represent a column address and correspond to bits [30:29] of the processor address 106. In a two-rank configuration shown in FIG. 6, a page size is doubled to 8 KB compared to FIG. 5.

FIG. 7 is an explanatory view explaining a relationship between addresses in the case of a quad-rank configuration. In the exemplary case of FIG. 7, a data bus width is also 64 bits, a burst length is also four, and each SDRAM device also has a capacity of 128 Mbits or more. In FIG. 7, a processor address 106 consists of 32 bits. The low-order 14 bits of this address represent a page size, which is 16 KB.

Like the active command address 108 in each of FIGS. 5 and 6, an active command address 108 in FIG. 7 is a 15-bit address. The lower-order 12 bits of this address represent a lower-order row address and correspond to bits [25:14] of the processor address 106. The higher-order two bits of the active command address 108 represent a bank address and correspond to bits [27:26] of the processor address 106. The remaining one bit [12] of the active command address 108 represents the most significant bit of the row address and corresponds to bit [28] of the processor address 106.

Like the read/write command address 110 in each of FIGS. 5 and 6, a read/write command address 110 in FIG. 7 is a 15-bit address. The lower-order nine bits of this address correspond to bits [13:3] of the processor address 106. Bits [6:5] of the processor address 106 are used as rank bits 112 for selection of a rank, and therefore these bits are not used as the read/write command address 110. A higher-order one bit [9] of the read/write command address 110 corresponds to bit [29] of the processor address 106. A still higher-order one bit [10] of the read/write command address 110 represents auto precharge (AP). The highest-order two bits of the read/write command address 110 represent a bank address. Like the bits of the active command address 108, these bits correspond to bits [27:26] of the processor address 106. The remaining two bits [12:11] of the read/write command address 110 represent a column address and correspond to bits [31:30] of the processor address 106.

In a quad-rank configuration shown in FIG. 7, a page size is quadrupled to 16 KB compared to FIG. 5. The rank bits 112 are two bits. These two bits are used for designating any rank in the quad-rank configuration. A specific aspect of the present invention will be described in detail in the description of embodiments given later. The following describes specific means employed by the present invention.

(1) A multi-rank SDRAM control method according to the present invention is a method of controlling a multi-rank SDRAM formed by connecting data ports of multiple SDRAM devices (SDRAM devices 100 described later, for example). In each of the multiple SDRAM devices, only a data mask signal (DQM0 described later, for example) for SDRAM devices of a target rank is negated, whereby an access to the rank is executed.

(2) In the multi-rank SDRAM control method described in (1), the multi-rank SDRAM may have as many ranks as any power of two, and the rank is selected using a low-order bit of an address of the SDRAM.

(3) In the multi-rank SDRAM control method described in (2), an address bit group in a place one bit higher than the low order bit used for selecting the rank may be used as a column address of the multi-rank SDRAM.

(4) In the multi-rank SDRAM control method described in any one of (1) to (3), the data mask signal may be a signal for masking data to be read or to be written with respect to each byte lane.

(5) In the multi-rank SDRAM control method described in any one of (1) to (4), one or more SDRAM devices of the multiple SDRAM devices may be SDRAM devices for parity or an ECC, or for parity and an ECC.

(6) An SDRAM controller according to the present invention executes the multi-rank SDRAM control method described in any one of (1) to (5).

According to the present invention, a possible performance penalty can be eliminated by avoiding a conflict between ranks.

BRIEF DESCRIPTION OF THE DRAWINGS

FIG. 15A shows a circuit configuration of an eighth embodiment or tenth embodiment;

FIG. 16A shows a circuit configuration of a ninth embodiment or an eleventh embodiment;

FIG. 16B shows the circuit configuration of the ninth embodiment or eleventh embodiment;

FIG. 16C shows the circuit configuration of the ninth embodiment or eleventh embodiment;

FIG. 17A shows a circuit configuration of the tenth embodiment;

FIG. 18C shows the circuit configuration of the eleventh embodiment;

FIG. 21 is an explanatory view explaining control over parity or an ECC using a CS# signal in a dual-rank SDRAM configuration.

DETAILED DESCRIPTION OF THE INVENTION

Preferred examples of embodiments of the present invention will be described below based on the drawings.

First Embodiment

Figure 1:
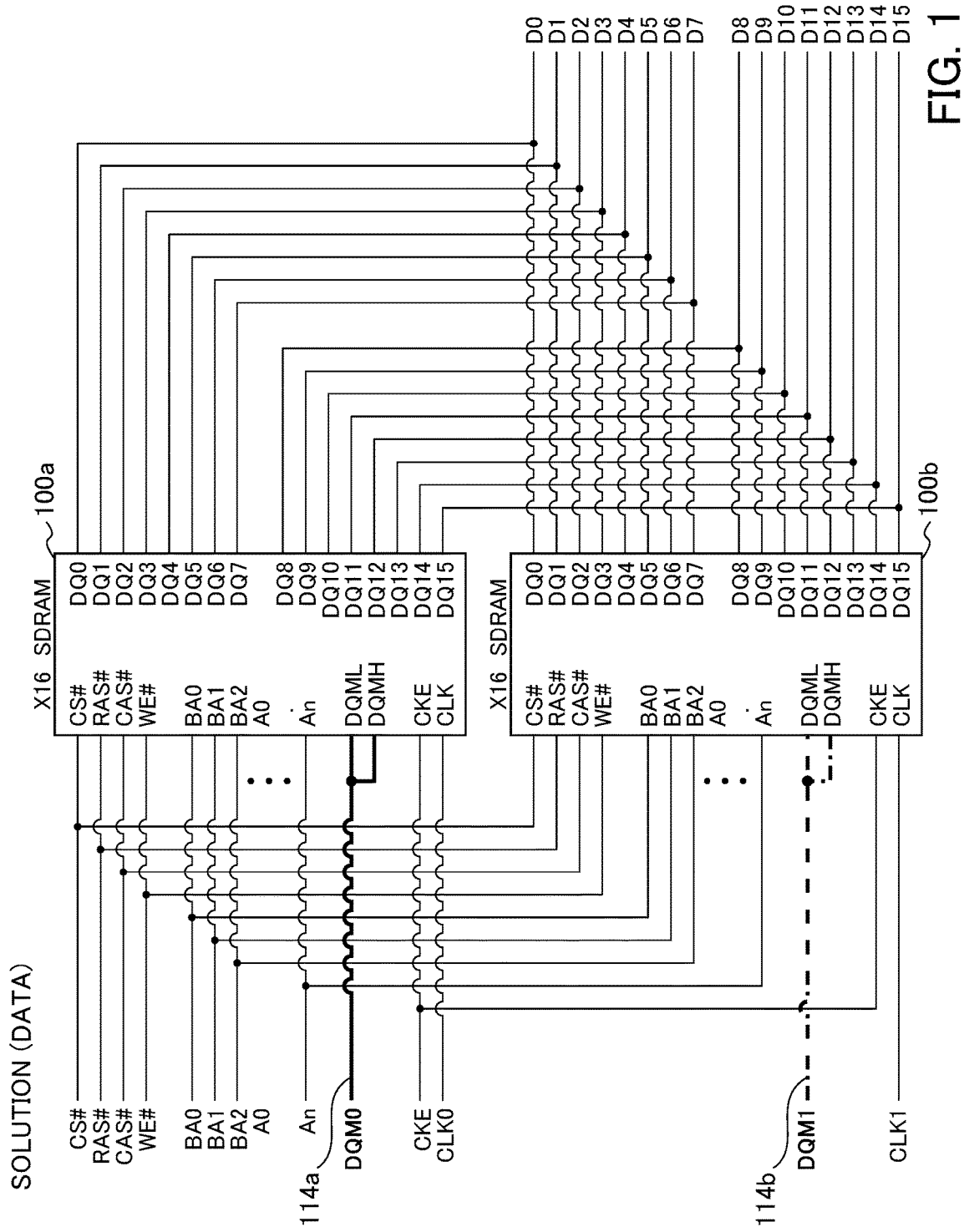
FIG. 1 is an explanatory view explaining means for solving the problems (data) according to the present invention.
Figure 2:
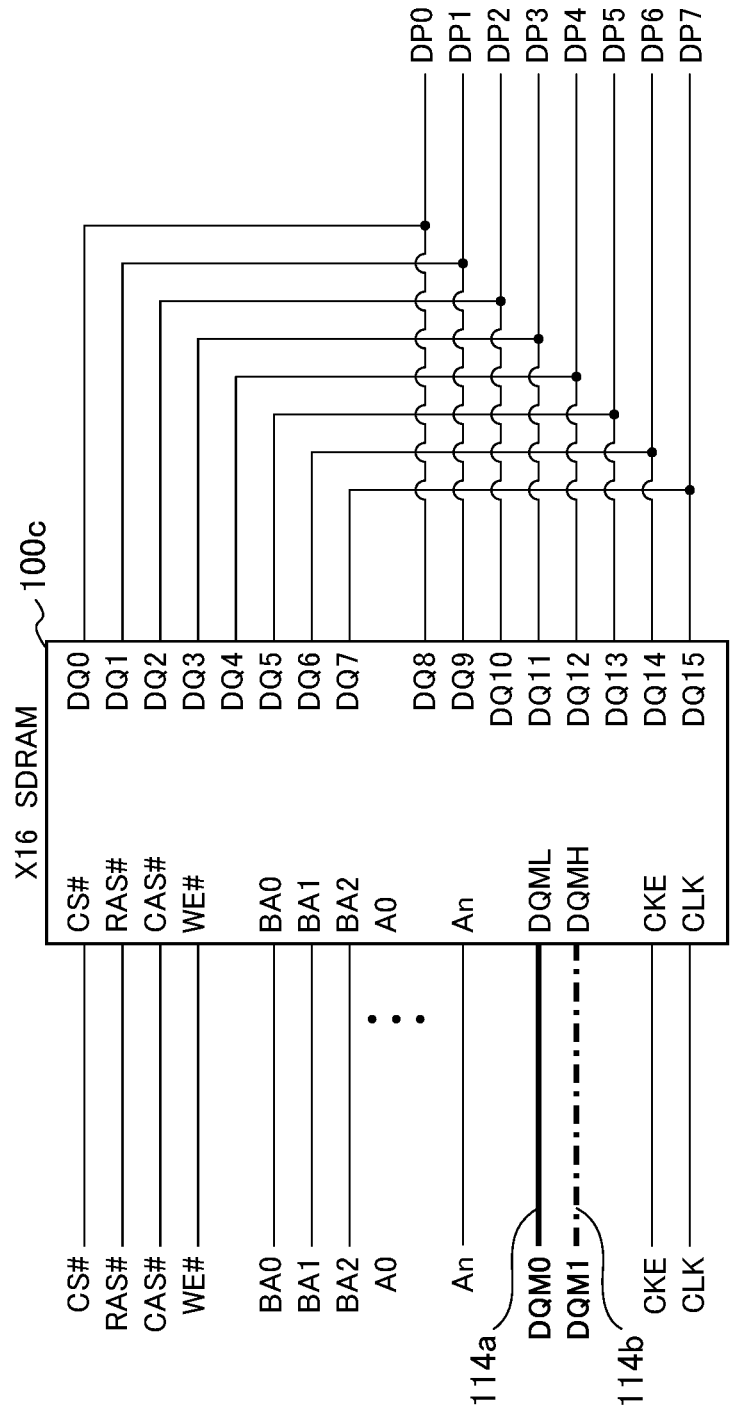
FIG. 2 is an explanatory view explaining means for solving the problems (parity/ECC) according to the present invention.
Figure 3:
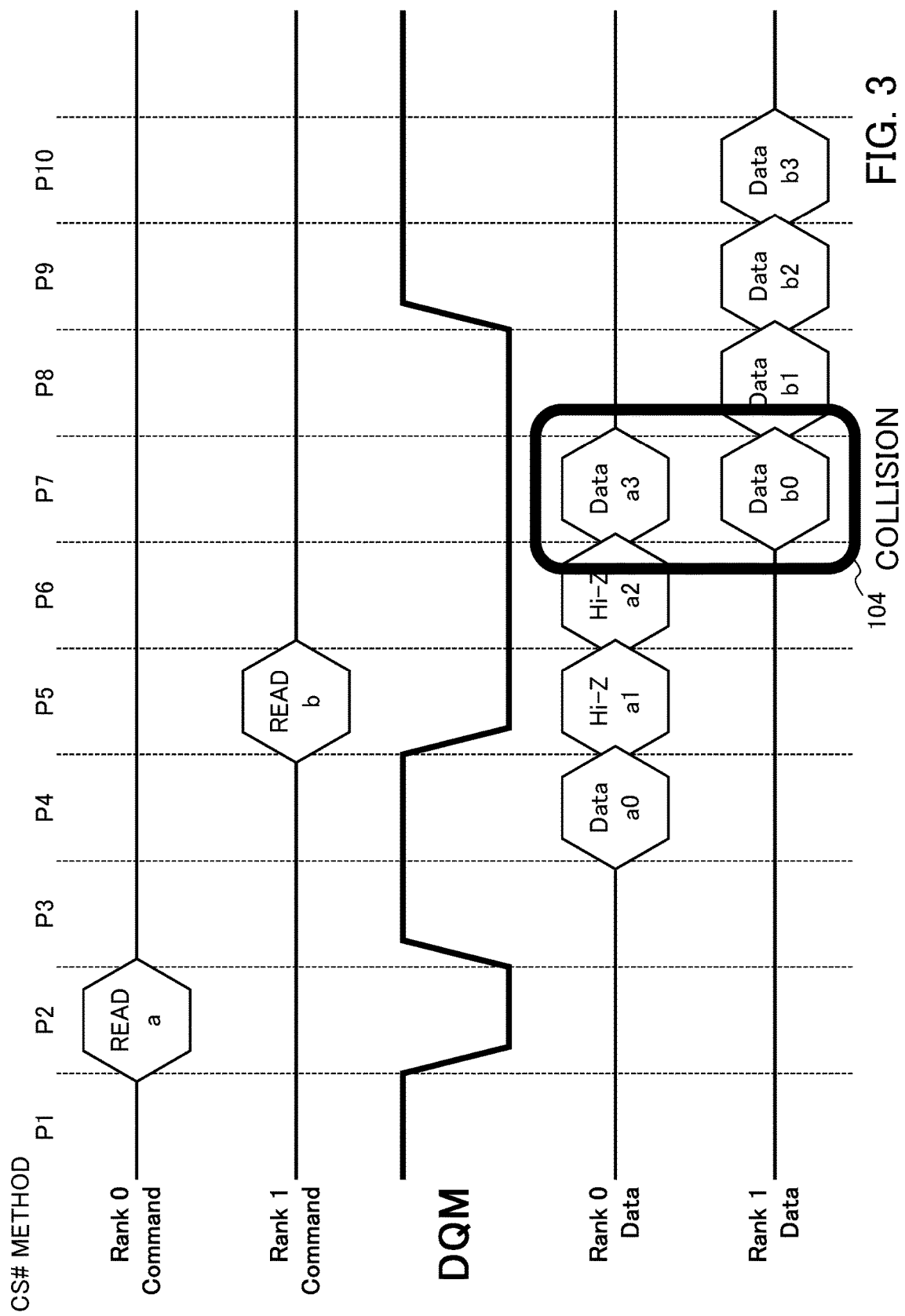
FIG. 3 is a timing chart showing an example of SDRAM control using a CS# signal.
Figure 4:
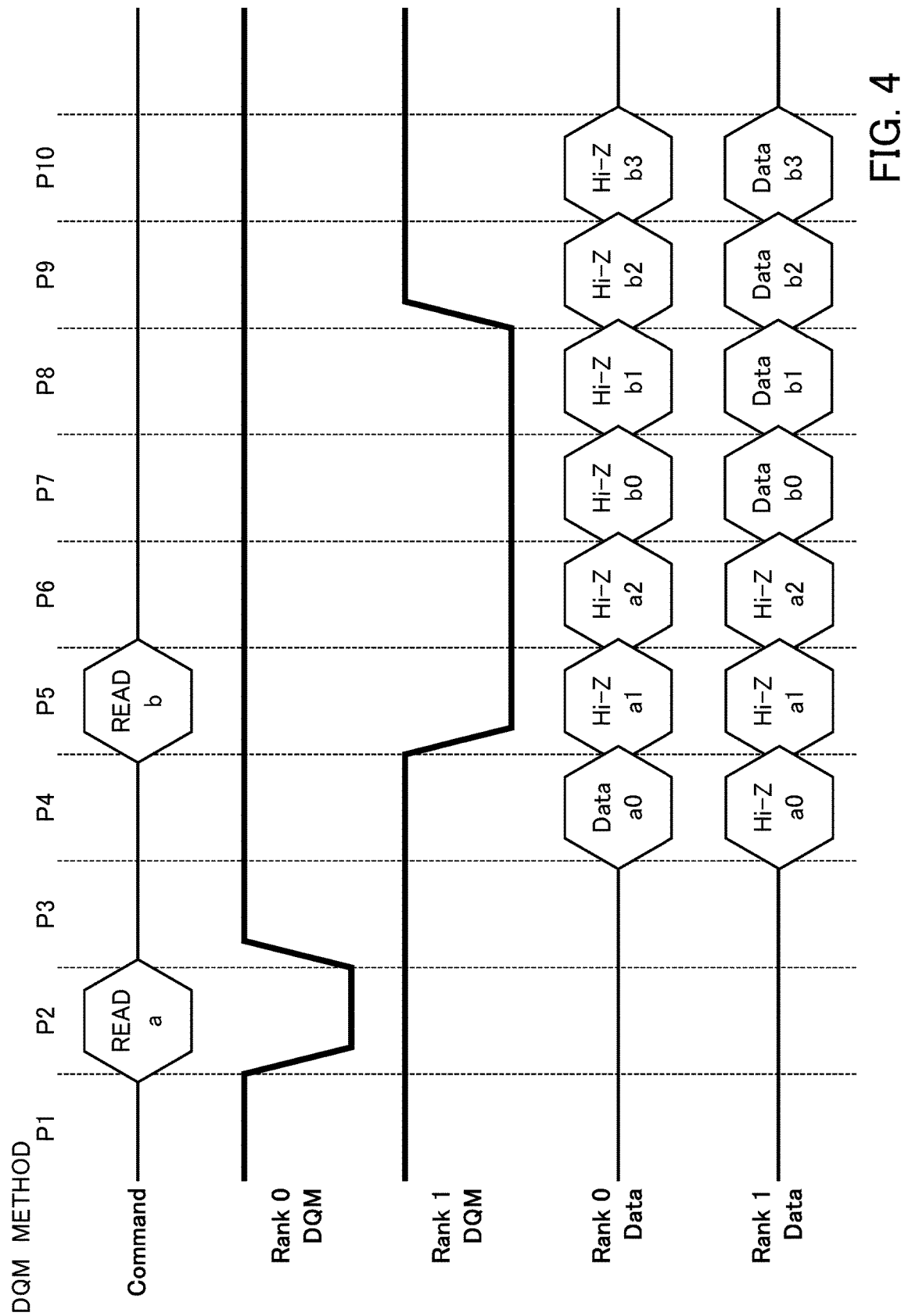
FIG. 4 is a timing chart showing an example of SDRAM control using a DQM signal.
Figure 5:
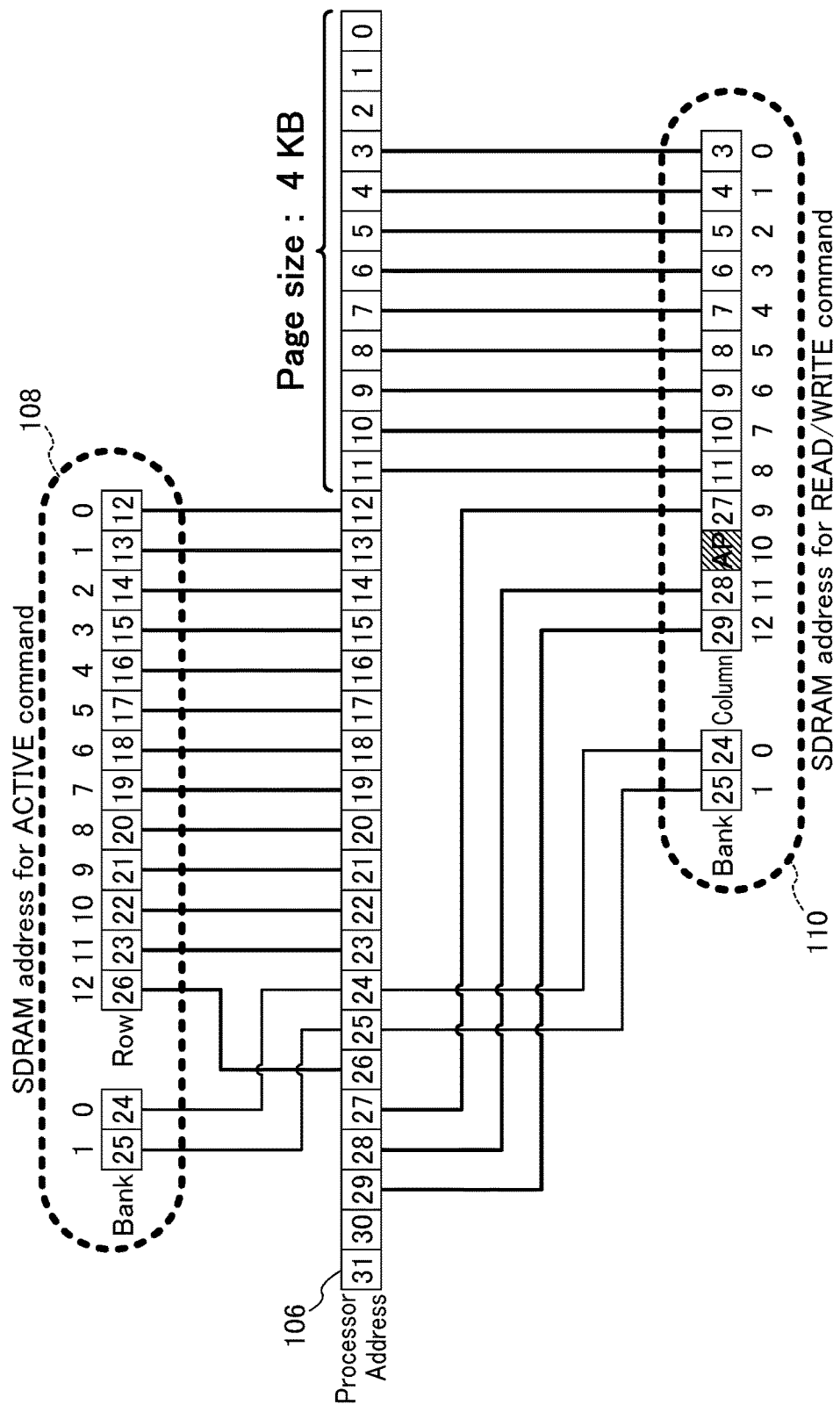
FIG. 5 is an explanatory view explaining an example of address allocation in the case of a single-rank configuration.
Figure 6:
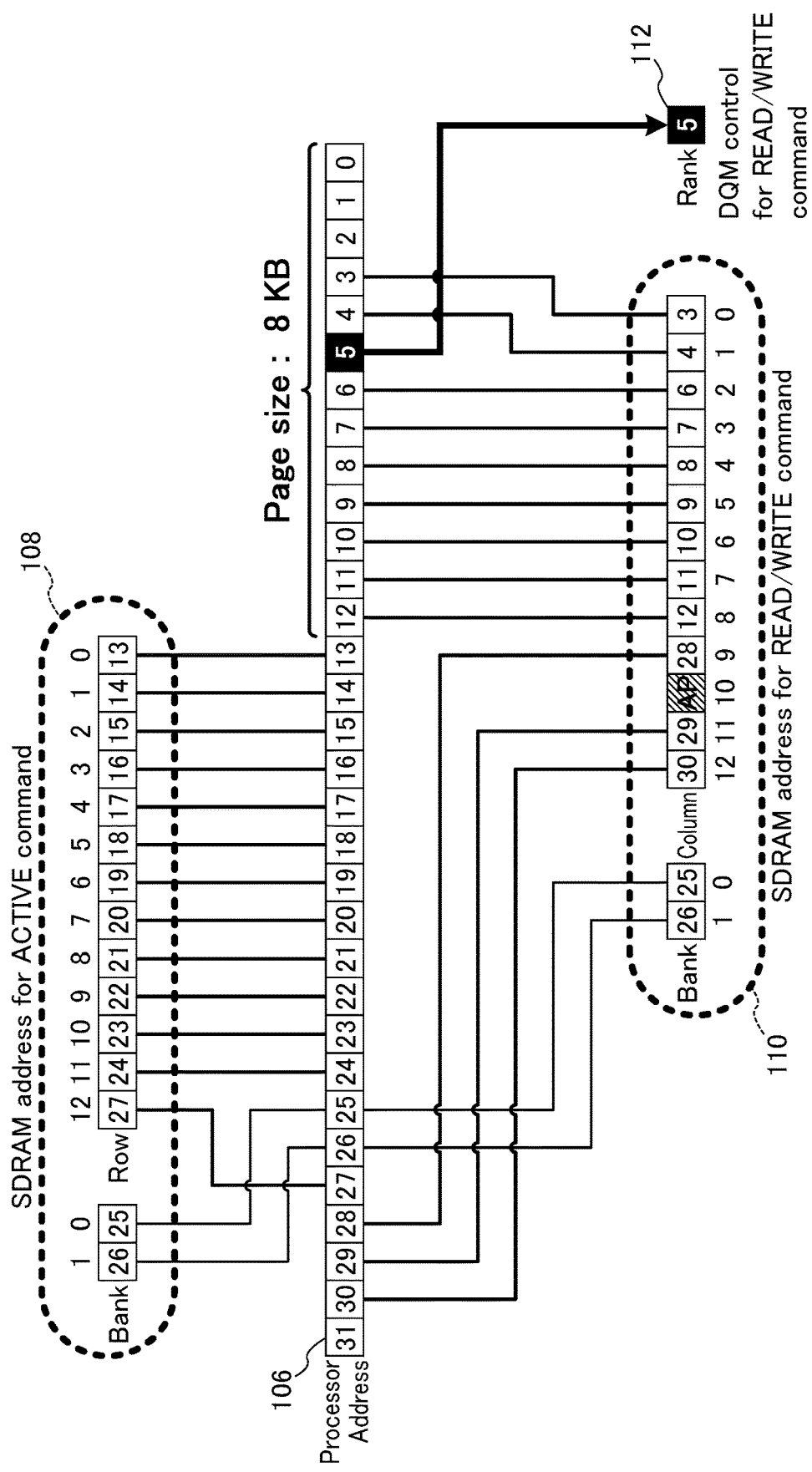
FIG. 6 is an explanatory view explaining an example of address allocation in the case of a dual-rank configuration.
Figure 7:
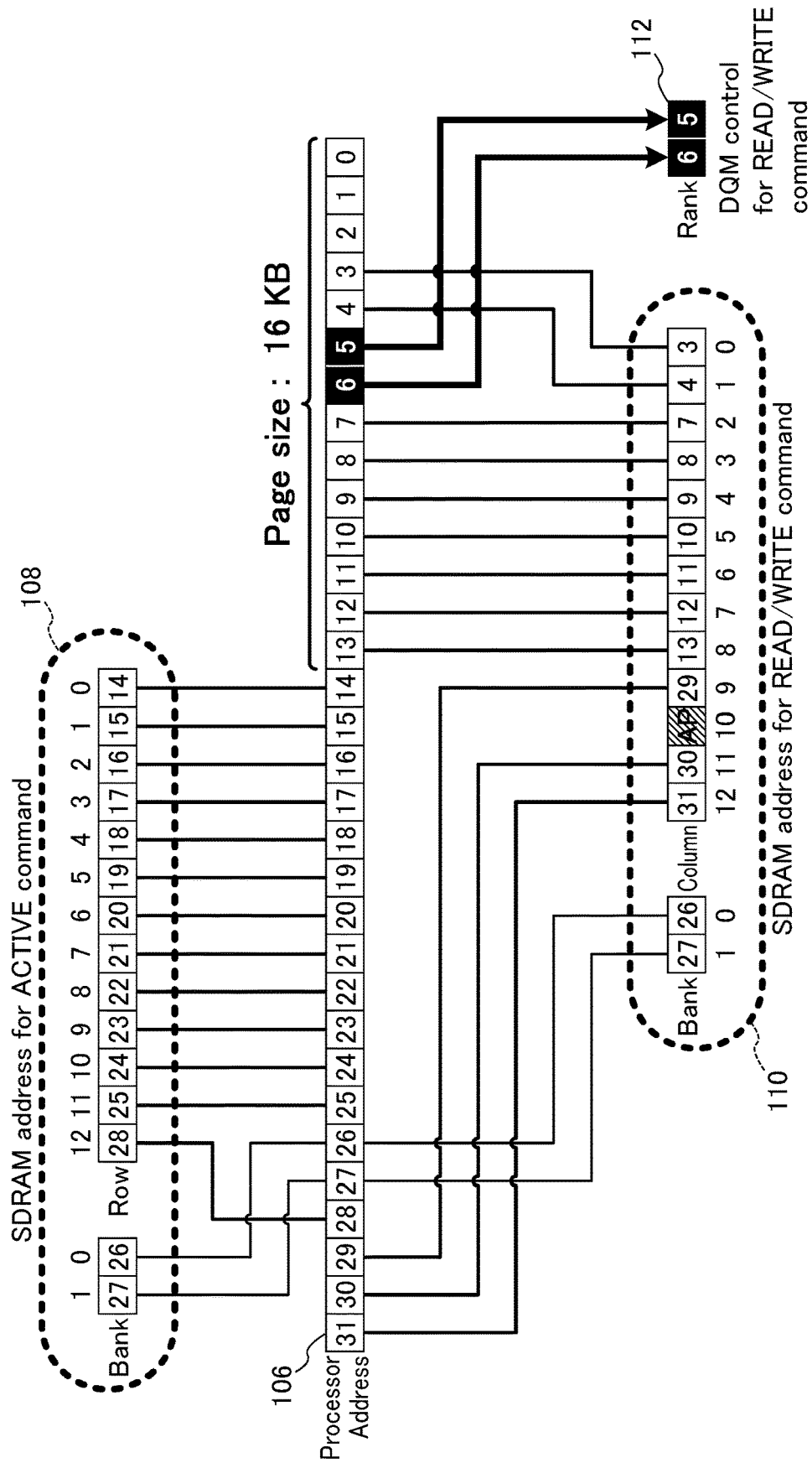
FIG. 7 is an explanatory view explaining an example of address allocation in the case of a quad-rank configuration.
Figure 8:
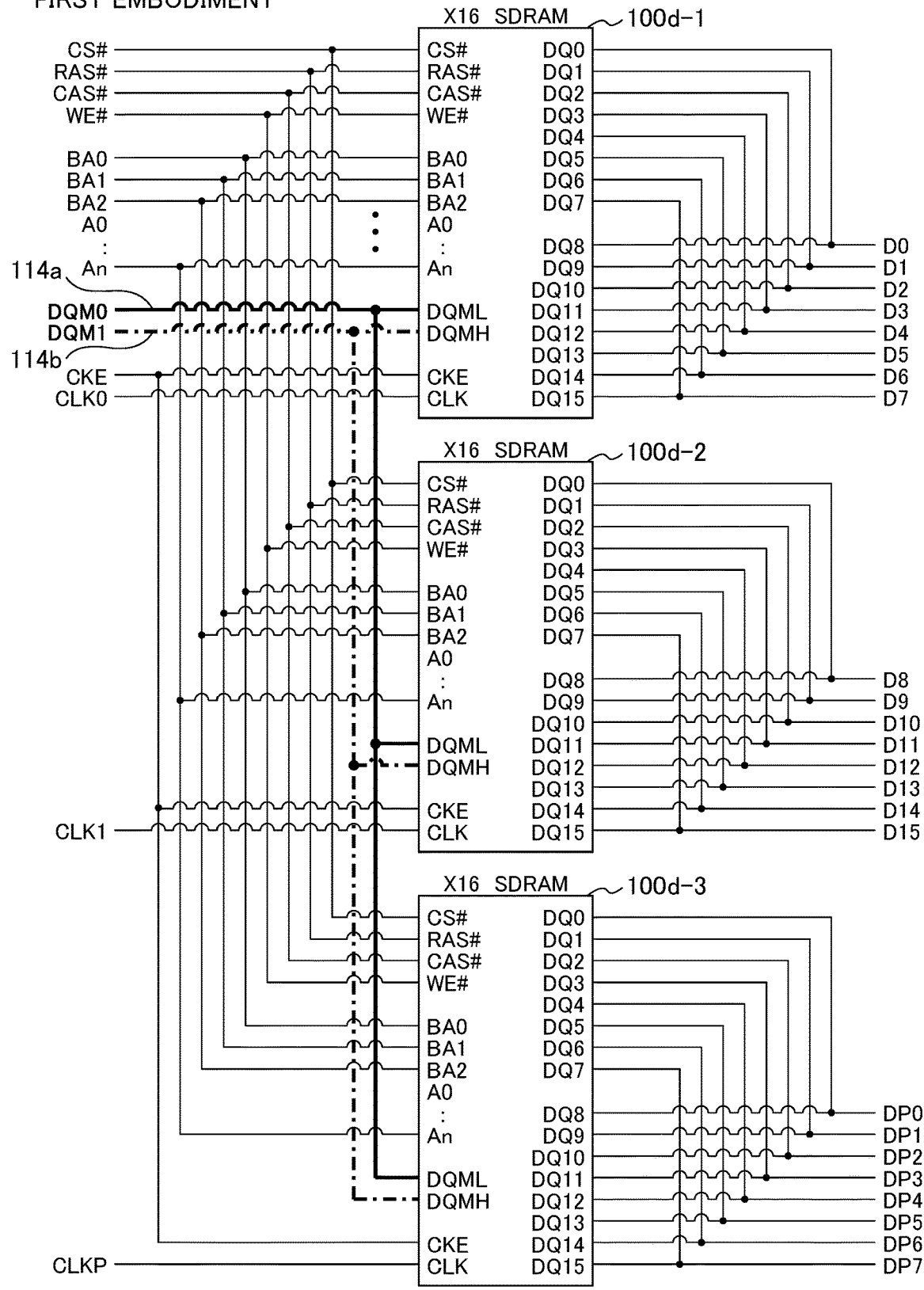
FIG. 8 shows a circuit configuration of a first embodiment.

FIG. 8 shows a circuit configuration of a memory according to first embodiment of the present invention. FIG. 8 shows an example of a two-rank configuration with a data bus width of 16 bits. Parity/ECC has a bit width of not exceeding eight bits. This configuration uses a 16-bit (×16) SDRAM device 100d-1, a 16-bit (×16) SDRAM device 100d-2, and a 16-bit (×16) SDRAM device 100d-3.

As shown in FIG. 8, the SDRAM device 100d-1 corresponds to the lower-order eight bits of data and the SDRAM device 100d-2 is responsible for the higher-order eight bits of the data. The SDRAM devices 100d-1 and 100d-2 together function to realize 16-bit data. Each of the SDRAM devices 100d-i and 100d-2 includes two types of data mask signal terminals, DQML and DQMH. The following two types of data mask signals are applied to DQML and DQMH: a data mask signal DQM0-114a representing Rank 0 is applied to DQML; and a data mask signal DQM1-114b representing Rank 1 is applied to DQMH.

In this configuration, if DQM0-114a is negated, the lower-order eight bits of each of the SDRAM devices 100d-1 and 100d-2 are output (or input), thereby representing Rank 0. If DQM1-114b is negated, the higher-order eight bits of each of the SDRAM devices 100d-1 and 100d-2 are output (or input), thereby representing Rank 1.

The foregoing operation also applies to the SDRAM device 100d-3 responsible for parity/ECC. If DQM0-114a is negated, the lower-order eight bits of the SDRAM device 100d-3 are output (or input), thereby representing parity/ECC in Rank 0. If DQM1-114b is negated, the higher-order eight bits of the SDRAM device 100d-3 are output (or input), thereby representing parity/ECC in Rank 1. Parity/ECC has a bit width of eight bits (or less). Thus, the 16-bit (×16) SDRAM device 100d-3 can be responsible for both Rank 0 and Rank 1.

Second Embodiment

Figure 9:
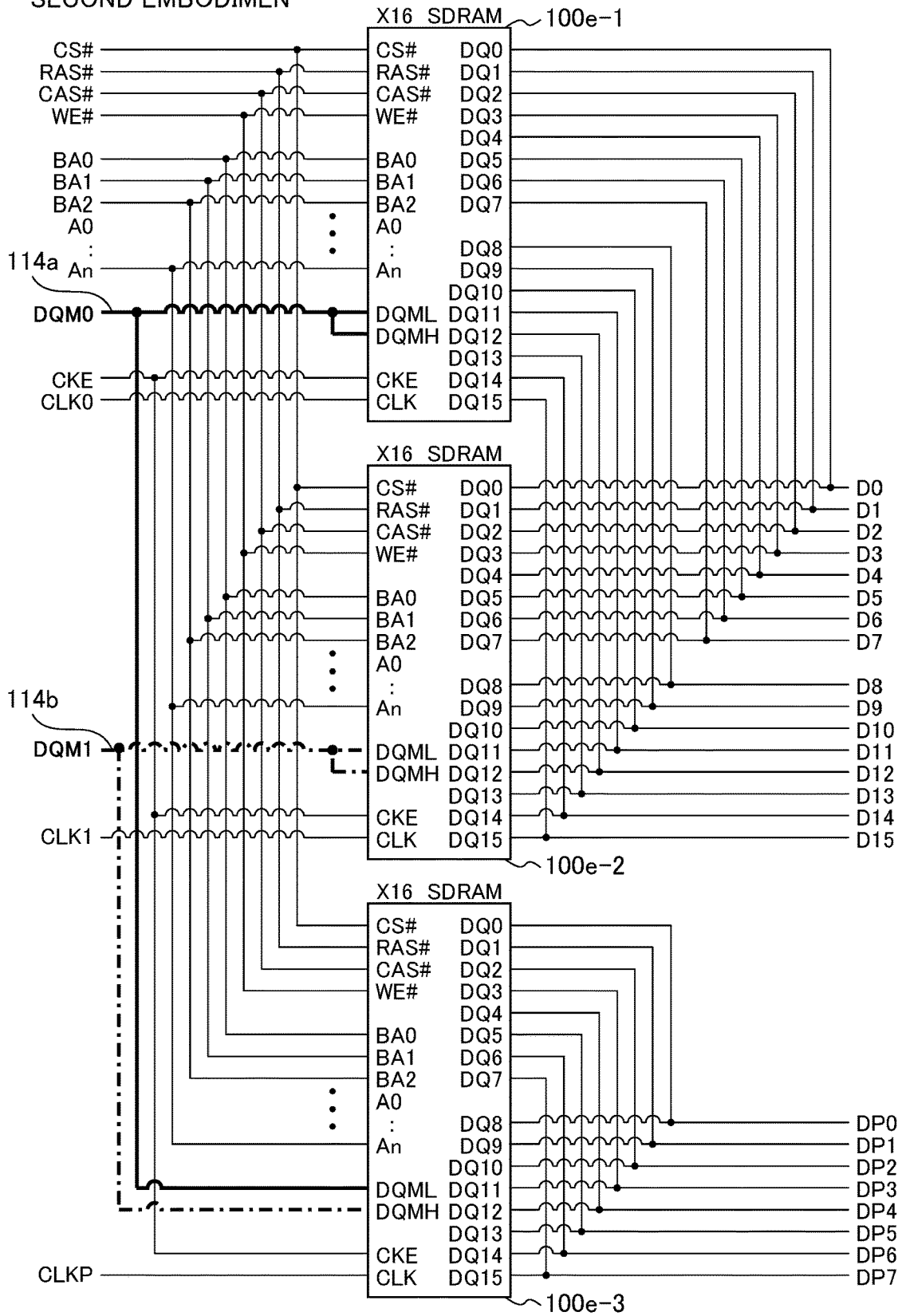
FIG. 9 shows a circuit configuration of a second embodiment.

FIG. 9 shows a circuit configuration of a memory according to second embodiment of the present invention. Like the first embodiment, the example shown in FIG. 9 is a two-rank configuration with a data bus width of 16 bits. Parity/ECC has a bit width of not exceeding eight bits. This configuration uses a 16-bit (×16) SDRAM device 100e-1, a 16-bit (×16) SDRAM device 100e-2, and a 16-bit (×16) SDRAM device 100e-3. As shown in FIG. 9, the SDRAM device 100e-1 includes two types of data mask signal terminals, DQML and DQMH. A data mask signal DQM0-114a representing Rank 0 is applied to both of these terminals. Specifically, the SDRAM device 100e-1 is responsible for data in Rank 0.

The SDRAM device 100e-2 also includes two types of data mask signal terminals, DQML and DQMH. A data mask signal DQM1-114b representing Rank 1 is applied to both of these terminals. Specifically, the SDRAM device 100e-2 is responsible for data in Rank 1. Each of the SDRAM devices 100e-1 and 100e-2 is also a device having a data width of 16 bits (×16) and can be responsible alone for a 16-bit data bus width.

A configuration for connecting the SDRAM device 100e-3 responsible for parity/ECC will not be described as it is the same as that of the SDRAM device 100d-3 of the first embodiment (FIG. 8). In the second embodiment, a multi-rank SDRAM memory having a two-rank configuration can be formed using three SDRAM devices 100e. Removing the SDRAM device 100e-2 from this configuration obviously results in a one-rank SDRAM memory. Thus, a two-rank memory and a one-rank memory can be formed freely using a printed wiring board designed for realizing the configuration of FIG. 9. In other words, a one-rank memory and a two-rank memory can be realized by a single printed wiring board design.

Third Embodiment

Figure 10A:
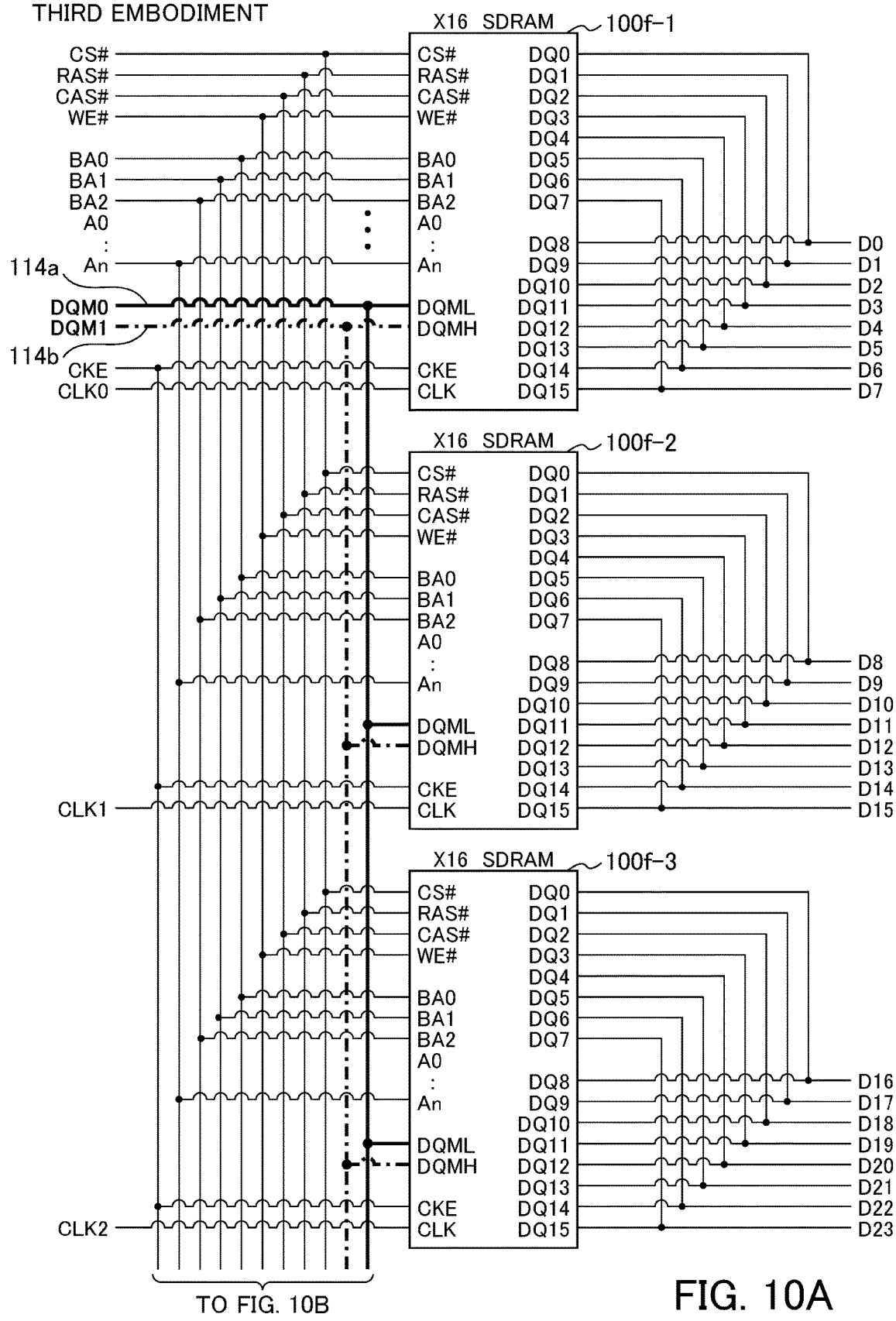
FIG. 10A shows a circuit configuration of a third embodiment.
Figure 10B:
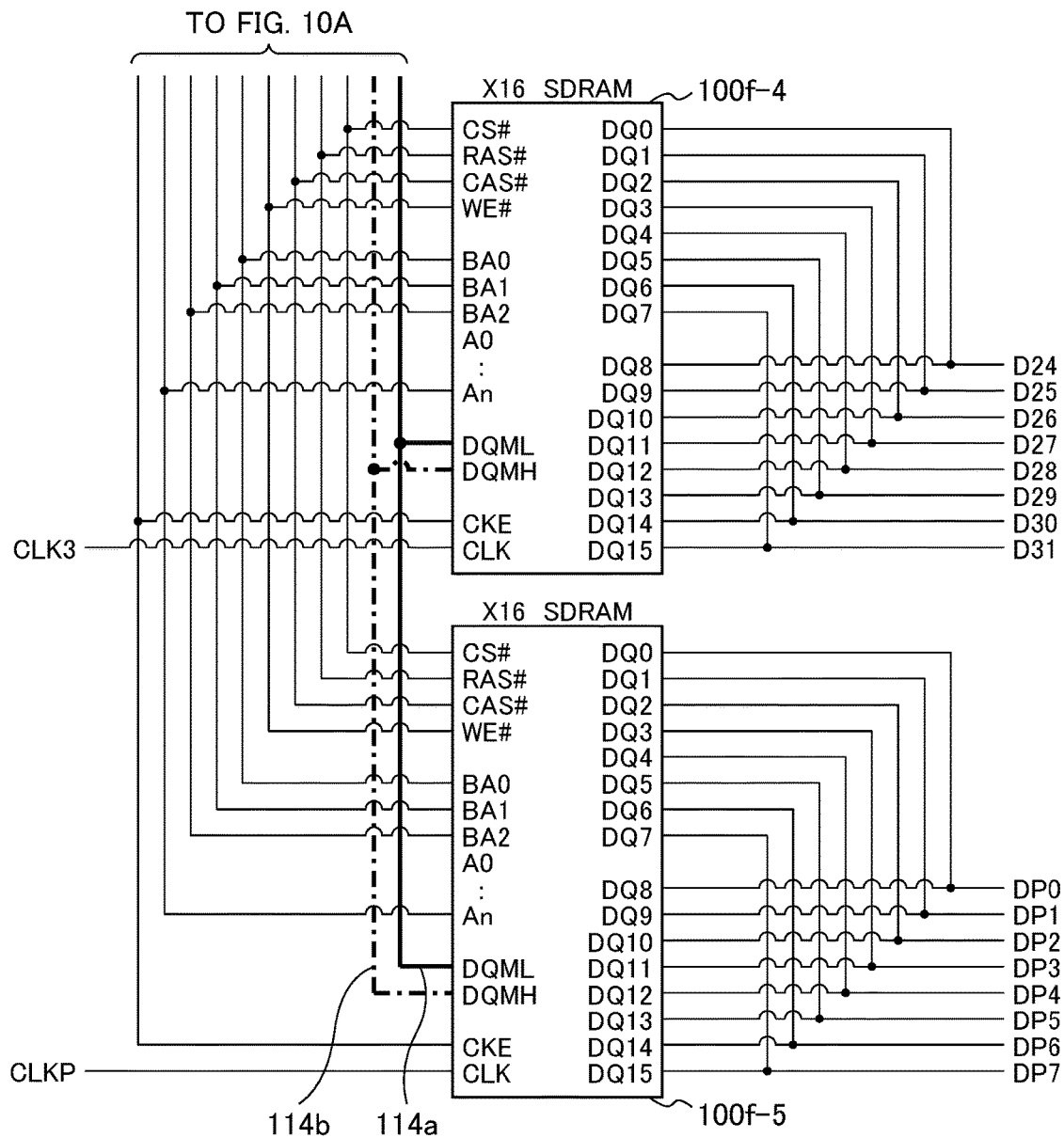
FIG. 10B shows the circuit configuration of the third embodiment.

FIGS. 10A and 10B show a circuit configuration of a memory according to a third embodiment of the present invention. FIGS. 10A and 10B show an example of a two-rank configuration with a data bus width of 32 bits. Parity/ECC has a bit width of not exceeding eight bits. This configuration uses an SDRAM device 100f-1, an SDRAM device 100f-2, an SDRAM device 100f-3, an SDRAM device 100f-4, and an SDRAM device 100f-5 each having a data width of 16 bits (×16).

Briefly, the configuration of the third embodiment is formed by doubling a circuit corresponding to the data section in the configuration of the first embodiment and doubling a data bus width in the configuration of the first embodiment to 32 bits. Specifically, each SDRAM device 100f has the lower-order eight bits corresponding to Rank 0 and the higher-order eight bits corresponding to Rank 1. Each of the four SDRAM devices 100f-1, 100f-2, 100f-3, and 100f-4 is responsible for eight bits and these four SDRAM devices together function to realize the 32-bit data bus width.

As shown in FIGS. 10A and 10B, the SDRAM device 100f-1 corresponds to the least-significant eight bits of data and the SDRAM device 100f-2 corresponds to next eight bits of the data from the bottom. The SDRAM device 100f-4 corresponds to the most-significant eight bits of the data and the SDRAM device 100f-3 corresponds to next eight bits of the data from the top. Each of the four SDRAM devices 100f includes two types of data mask signal terminals, DQML and DQMH. The following two types of data mask signals are applied to DQML and DQMH: a data mask signal DQM0-114a representing Rank 0 is applied to DQML; and a data mask signal DQM1-114b representing Rank 1 is applied to DQMH.

In this configuration, if DQM0-114a is negated, the lower-order eight bits of each of the SDRAM devices 100f-1, 100f-2, 100f-3, and 100f-4 are output (or input), thereby representing Rank 0. If DQM1-114b is negated, the higher-order eight bits of each of the SDRAM devices 100f-1, 100f-2, 100f-3, and 100f-4 are output (or input), thereby representing Rank 1. A configuration for connecting the SDRAM device 100f-5 responsible for parity/ECC will not be described as it is the same as that of the SDRAM device 100d-3 of the first embodiment and that of the SDRAM device 100e-3 of the second embodiment.

Fourth Embodiment

Figure 11A:
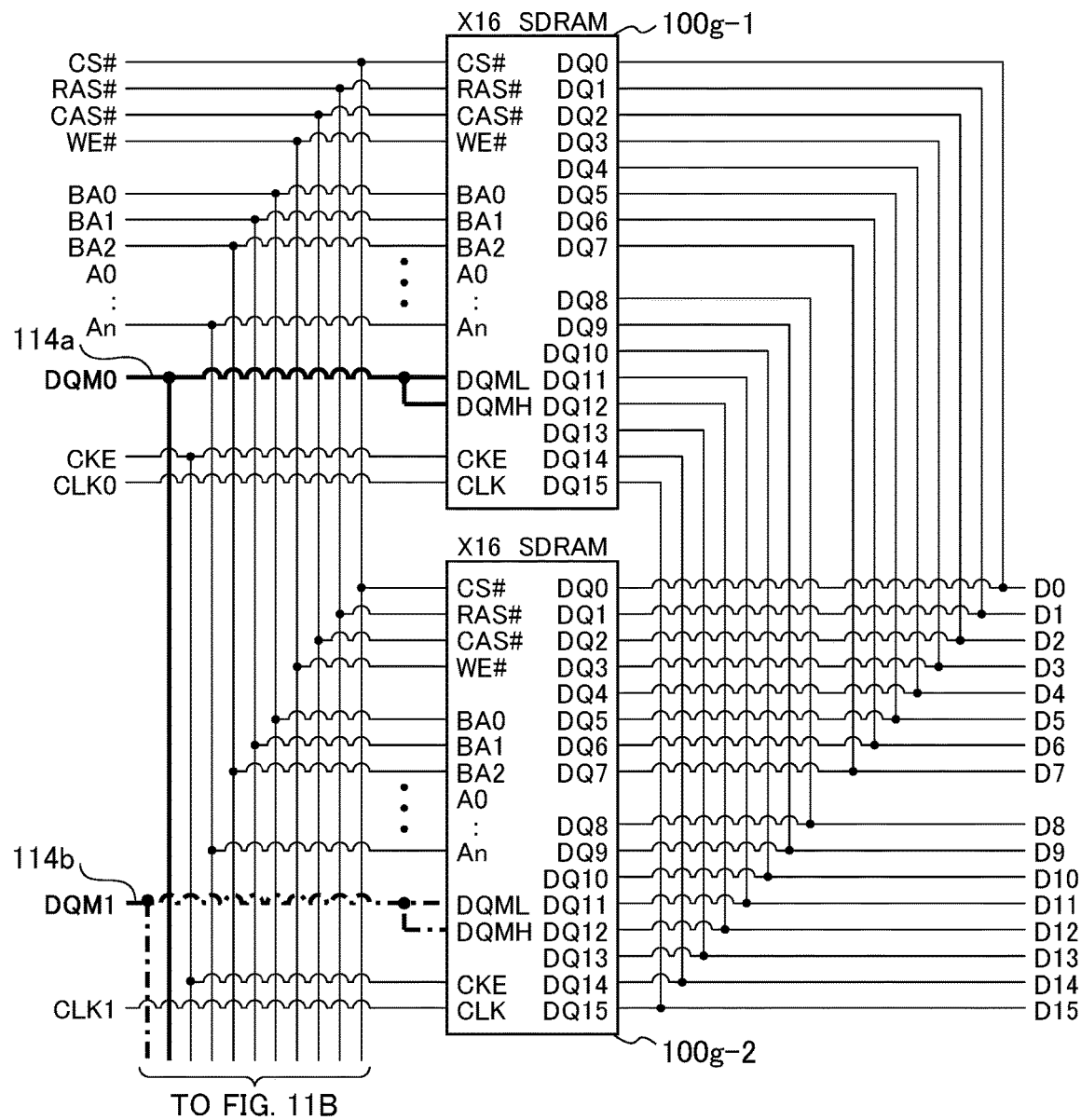
FIG. 11A shows a circuit configuration of a fourth embodiment.
Figure 11B:
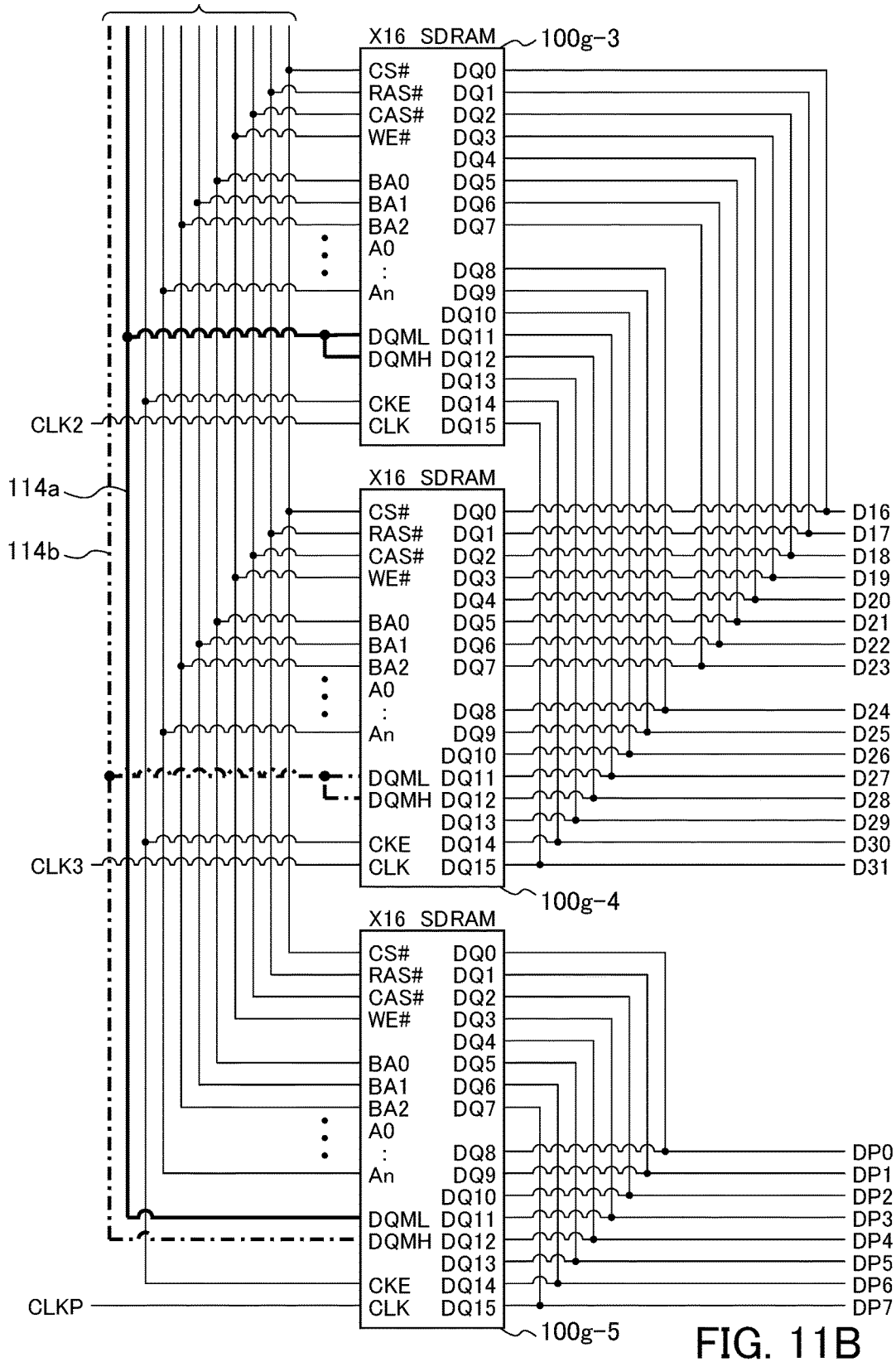
FIG. 11B shows the circuit configuration of the fourth embodiment.
Figure 12A:
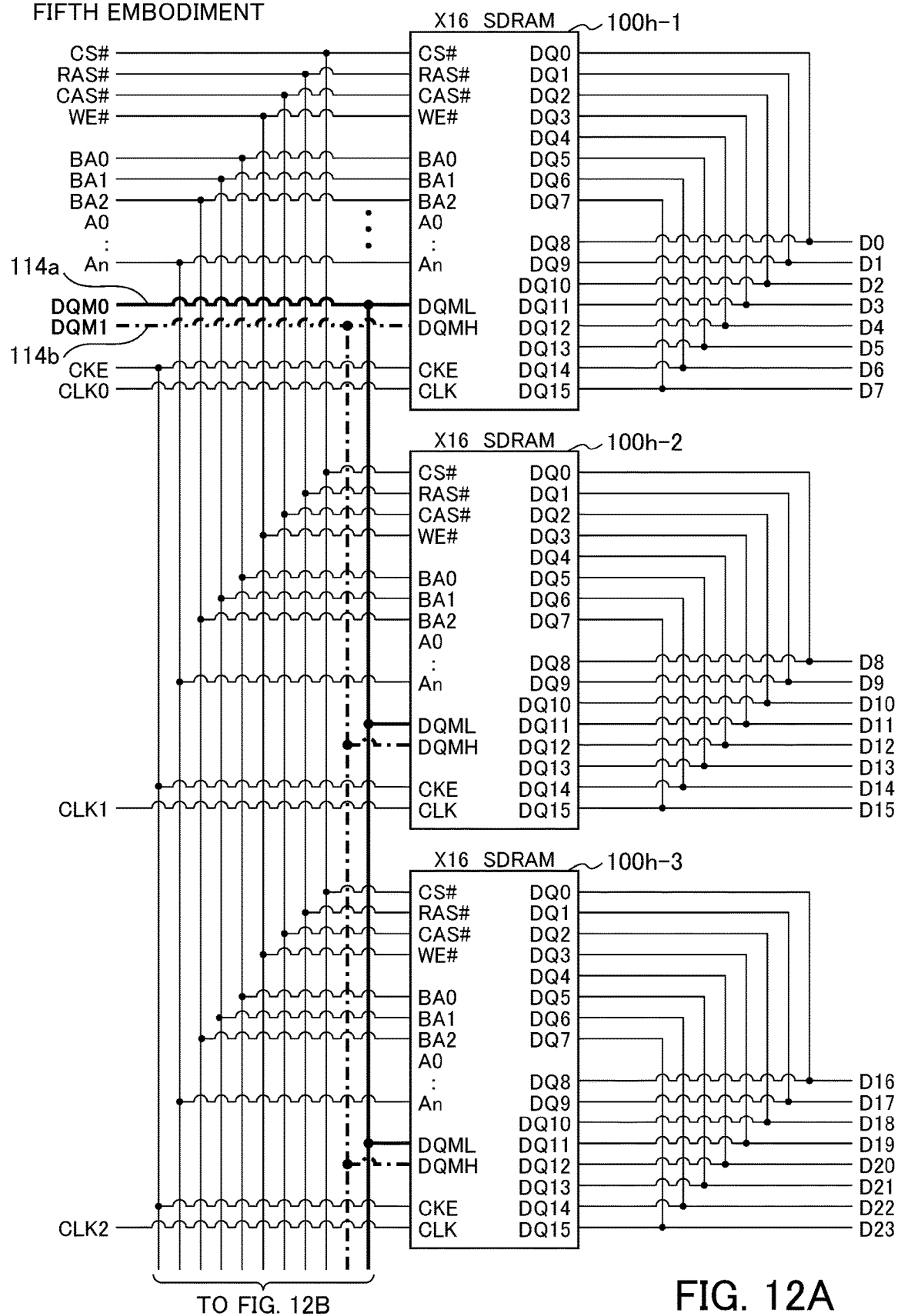
FIG. 12A shows a circuit configuration of a fifth embodiment.
Figure 12B:
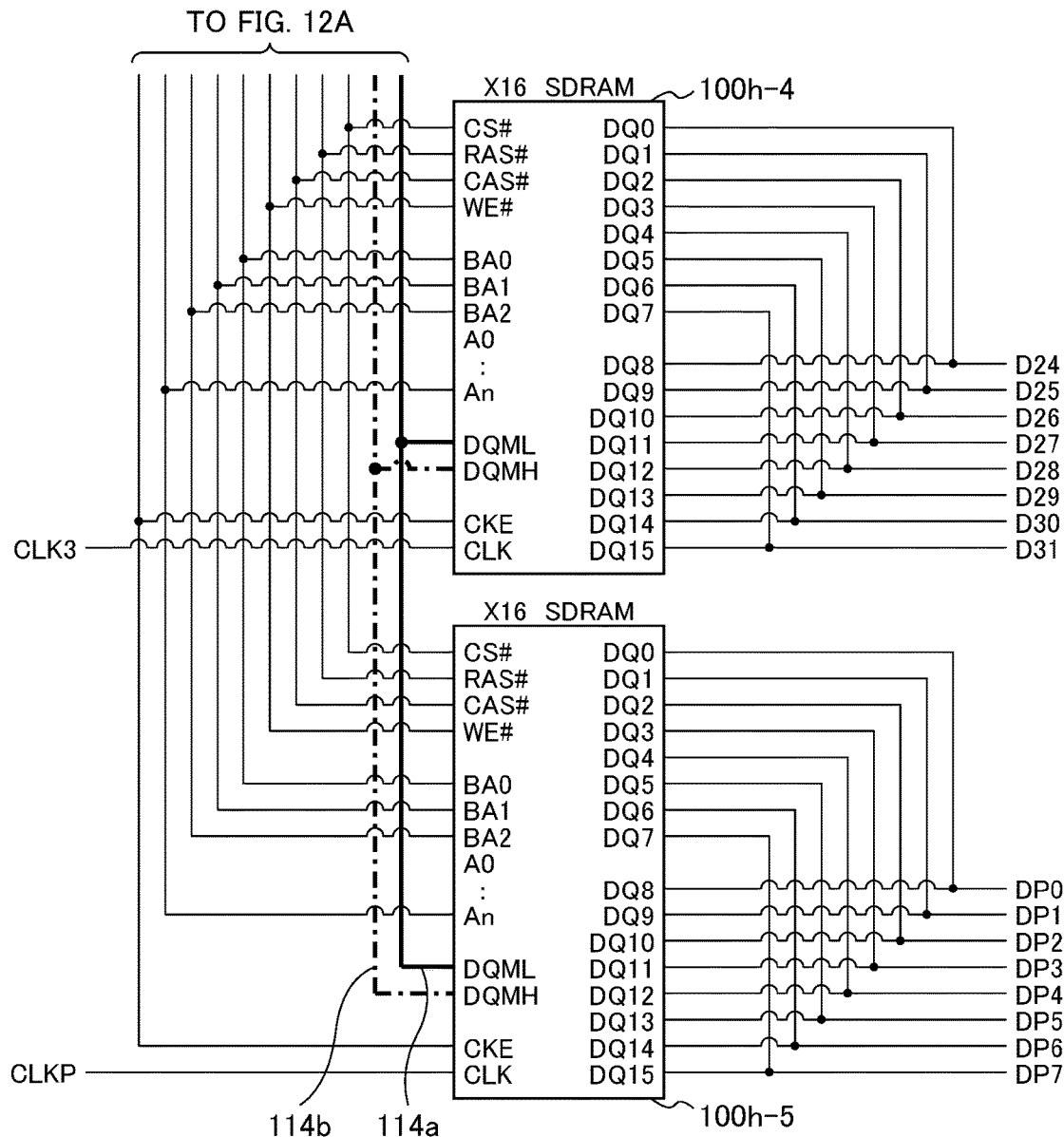
FIG. 12B shows the circuit configuration of the fifth embodiment.
Figure 12C:
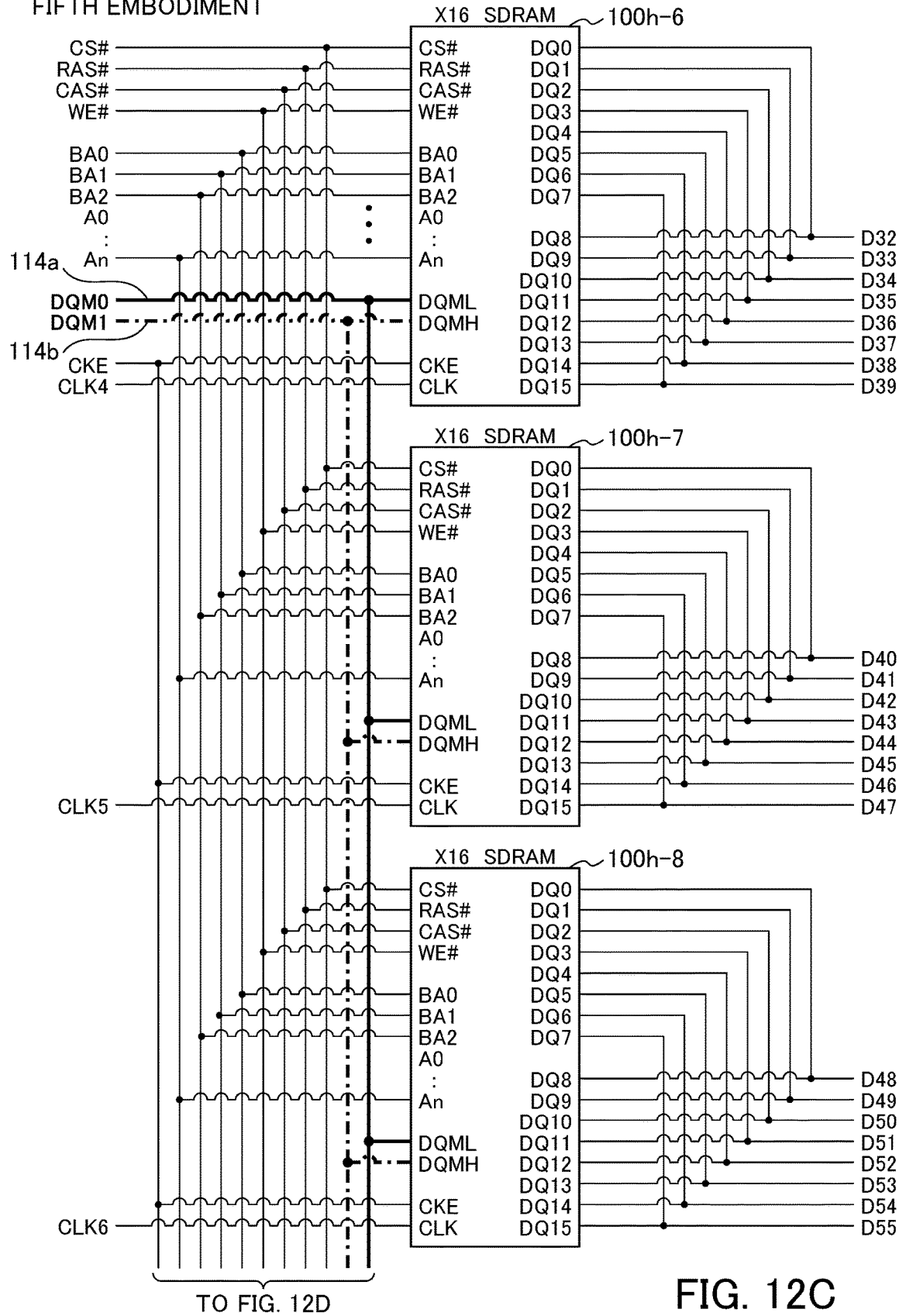
FIG. 12C shows the circuit configuration of the fifth embodiment.
Figure 12D:
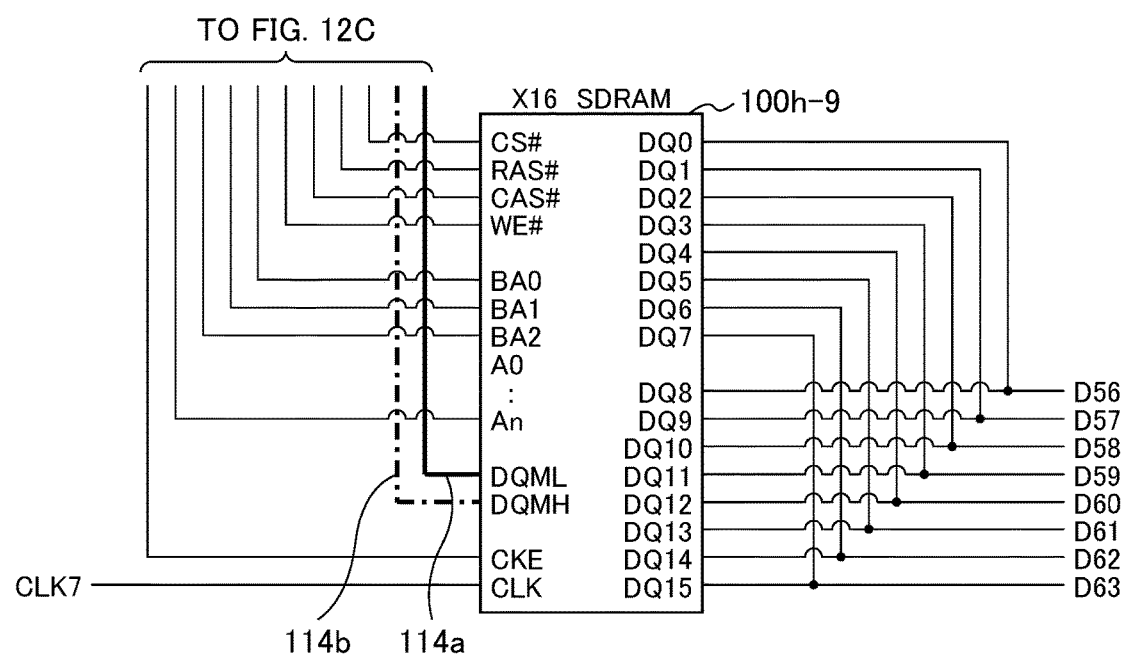
FIG. 12D shows the circuit configuration of the fifth embodiment.
Figure 13A:
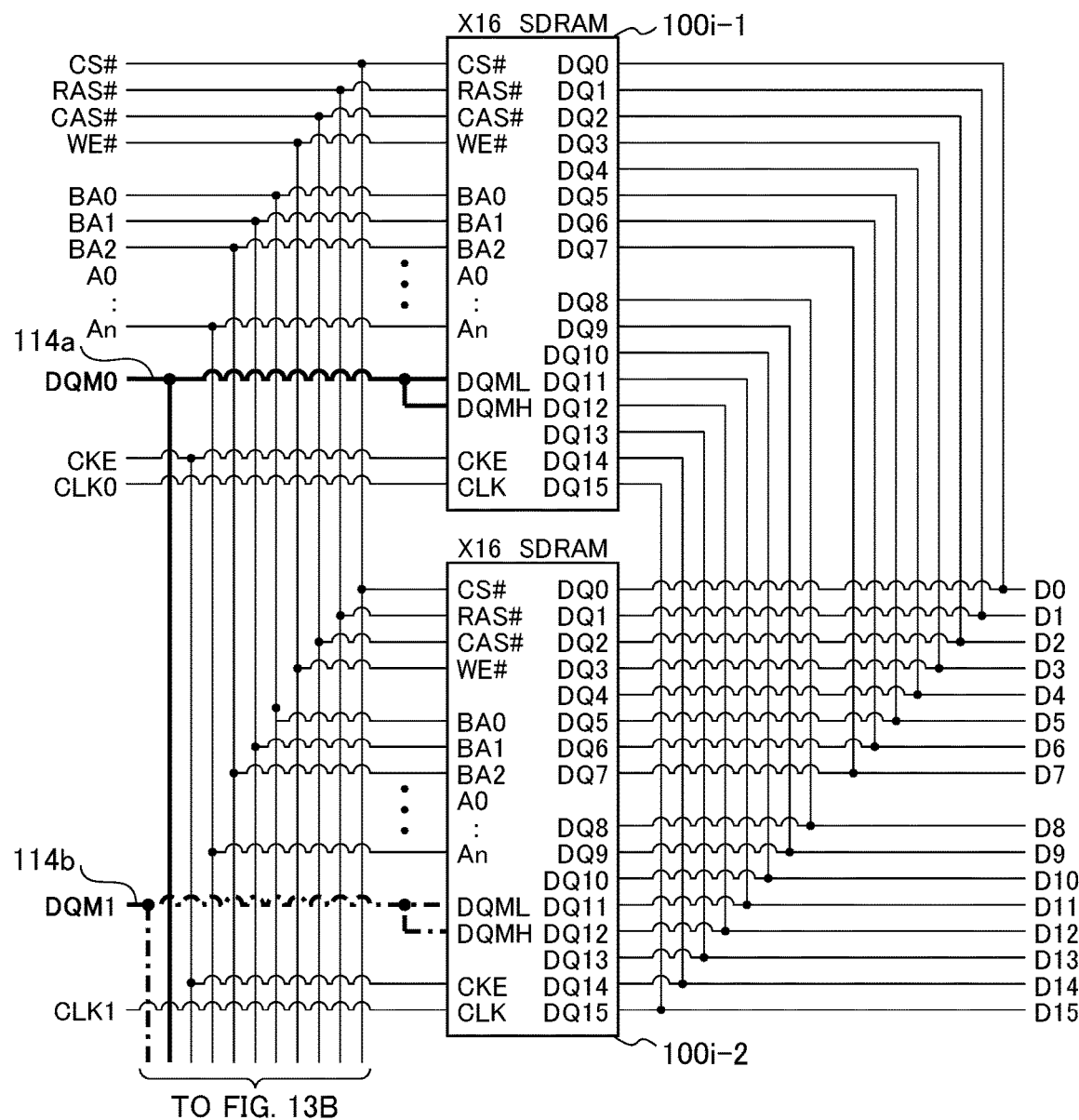
FIG. 13A shows a circuit configuration of a sixth embodiment.
Figure 13B:
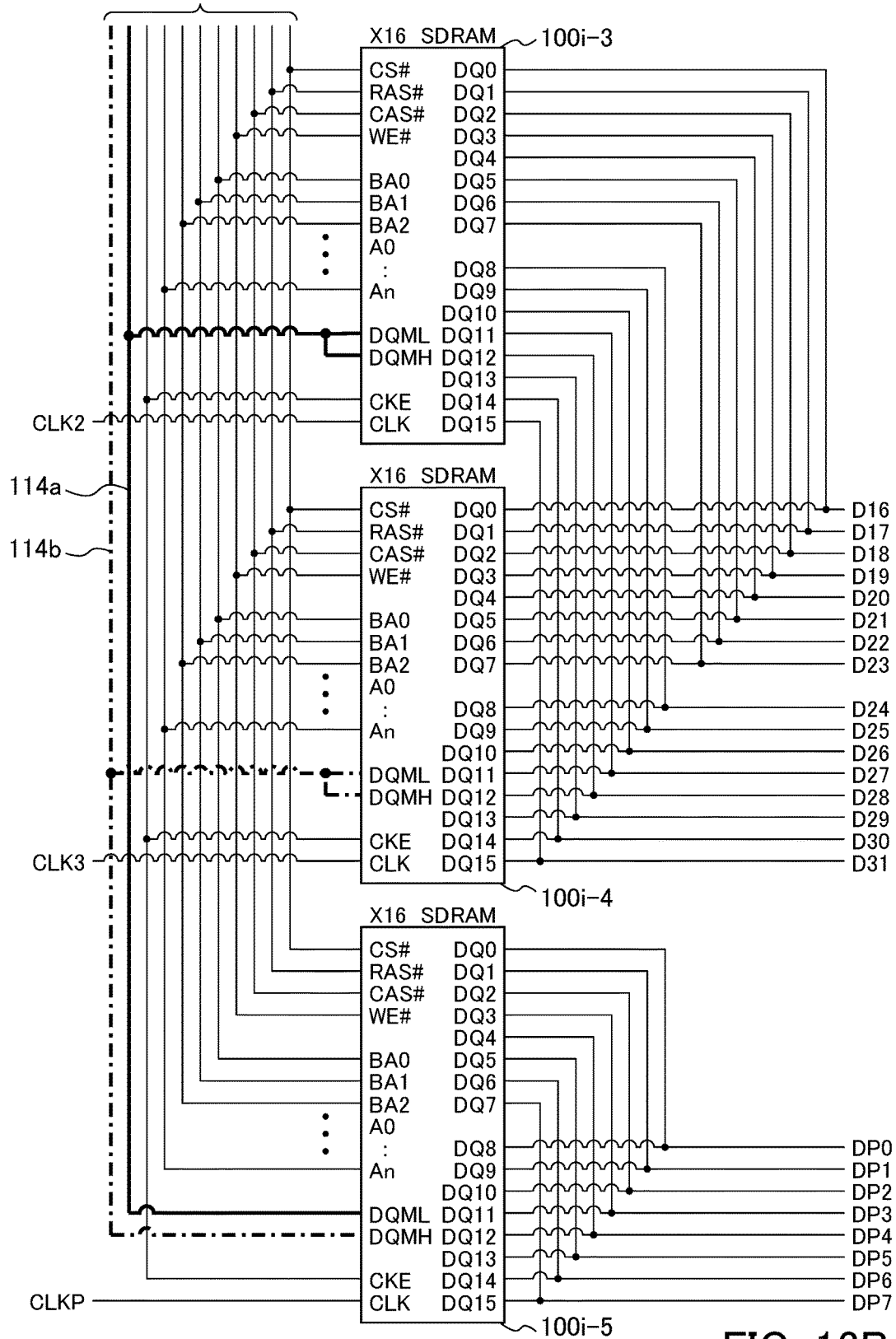
FIG. 13B shows the circuit configuration of the sixth embodiment.
Figure 13C:
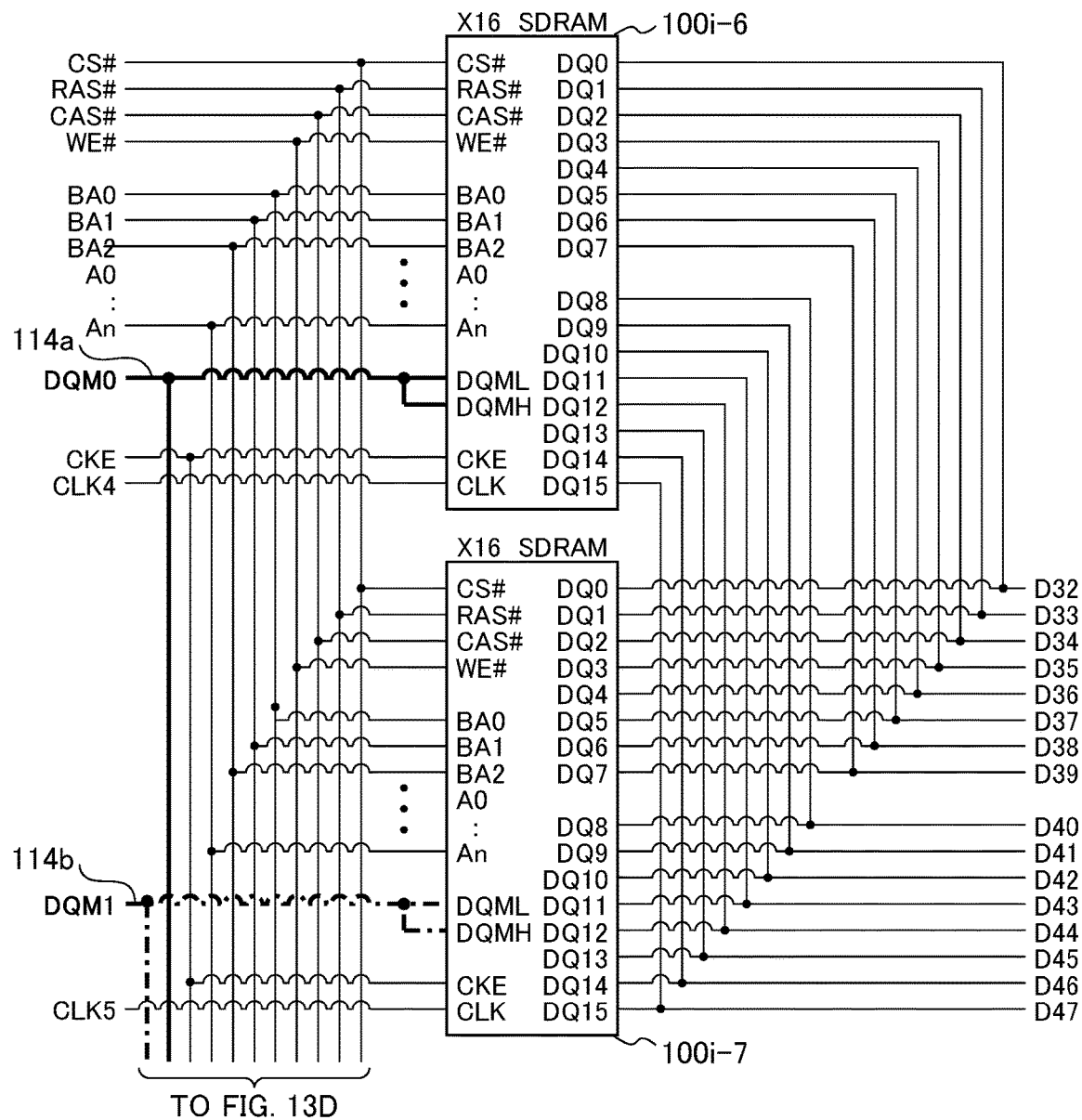
FIG. 13C shows the circuit configuration of the sixth embodiment.
Figure 13D:
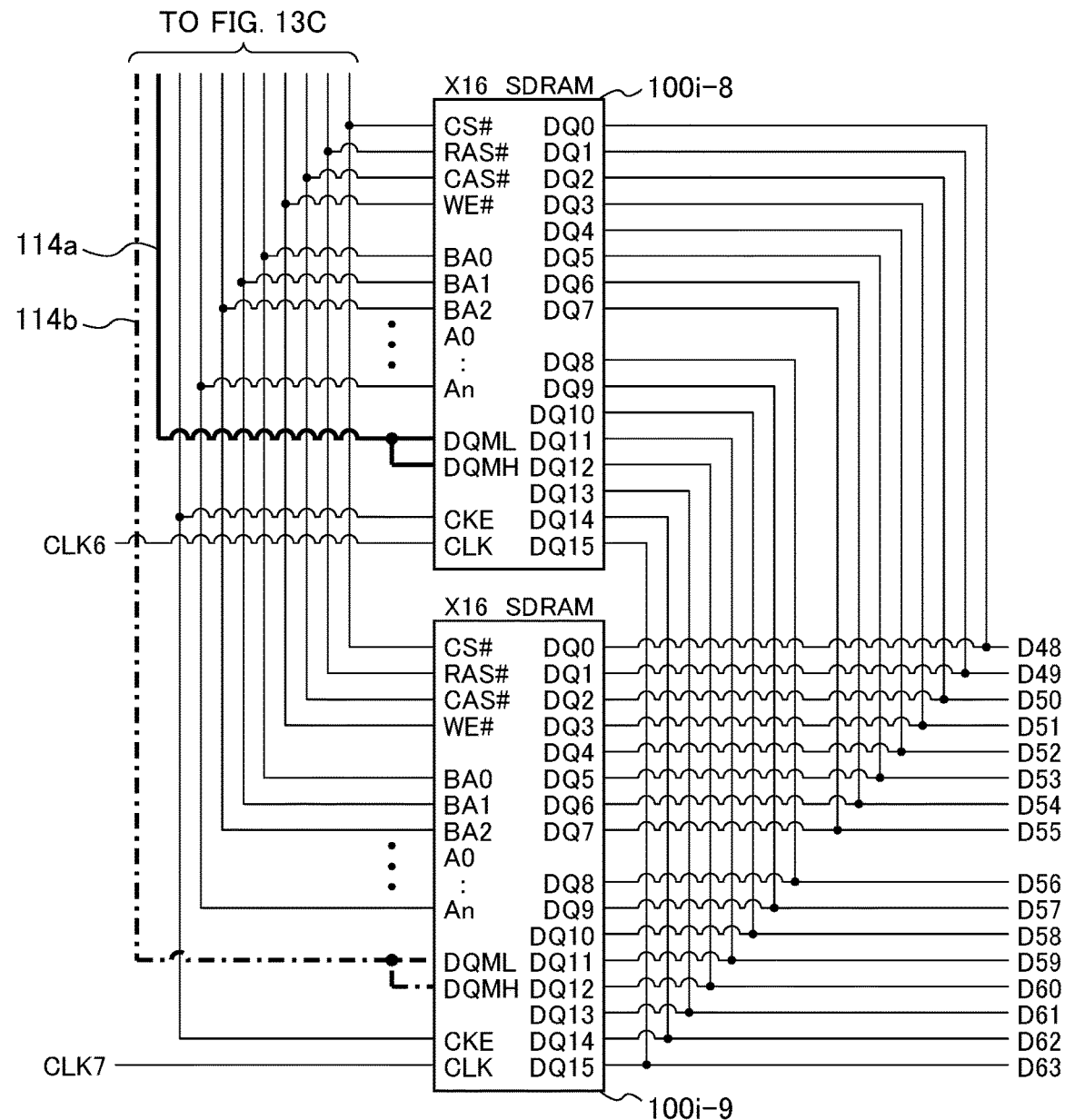
FIG. 13D shows the circuit configuration of the sixth embodiment.
Figure 14A:
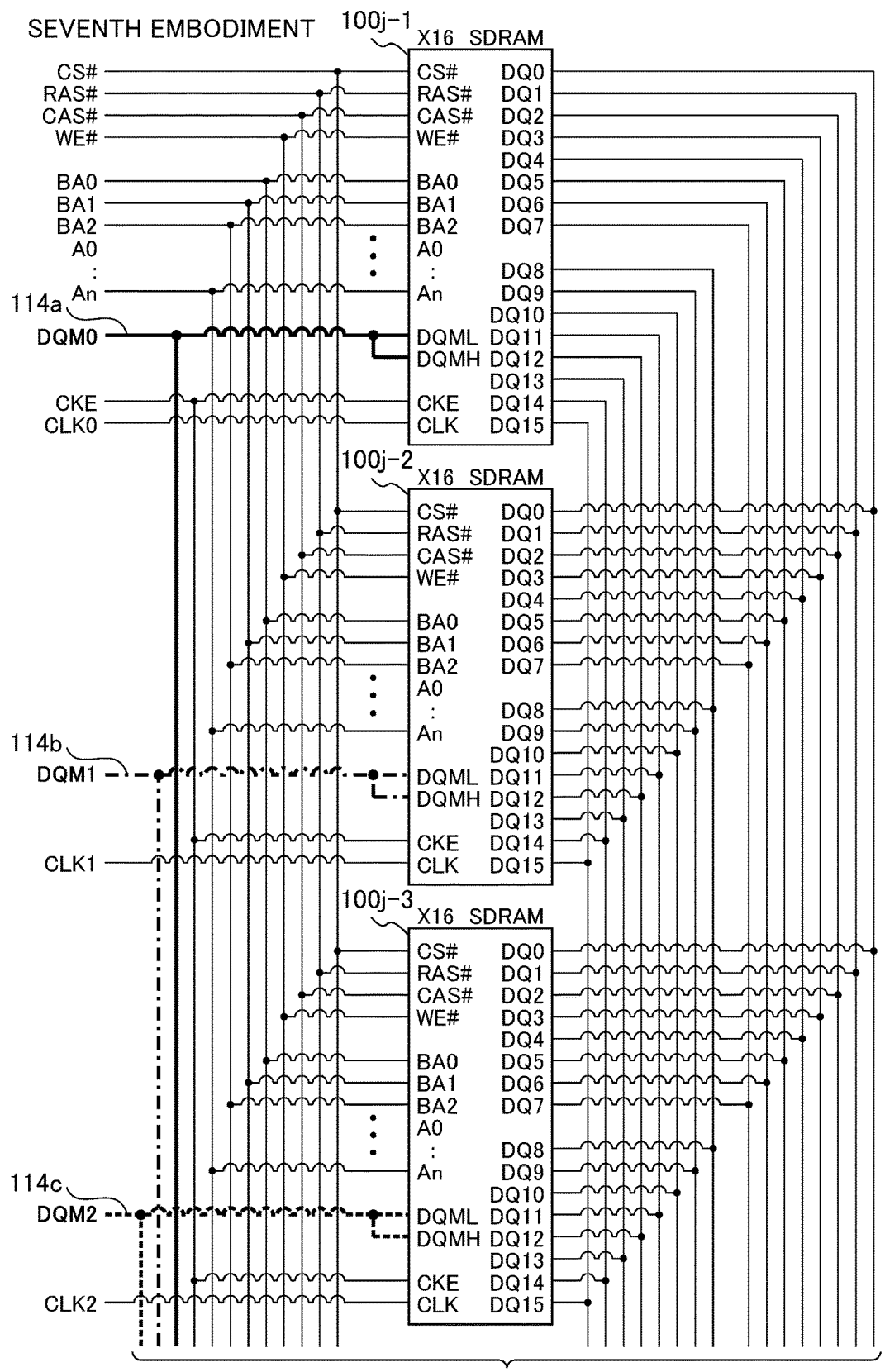
FIG. 14A shows a circuit configuration of a seventh embodiment.
Figure 14B:
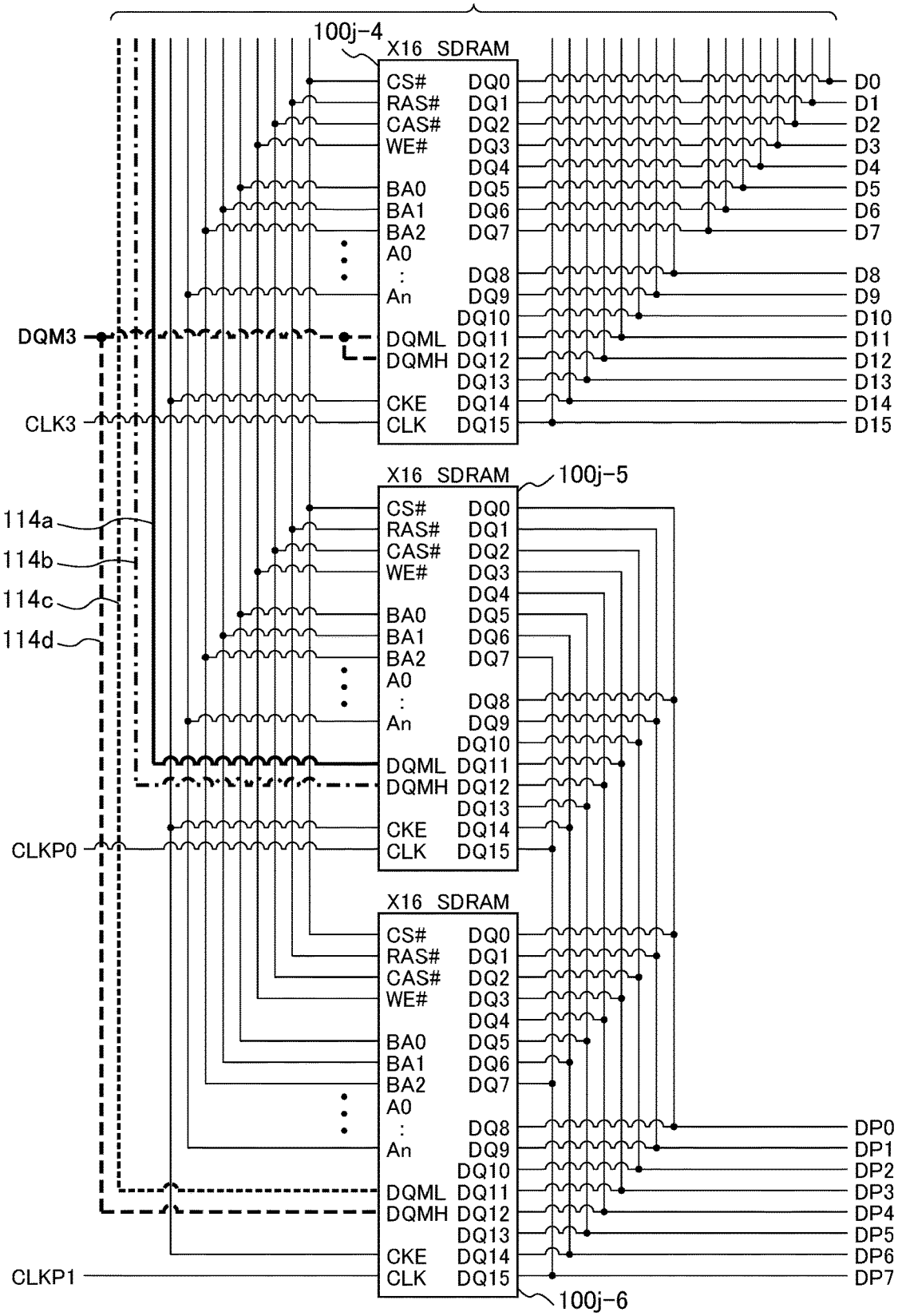
FIG. 14B shows the circuit configuration of the seventh embodiment.
Figure 14C:
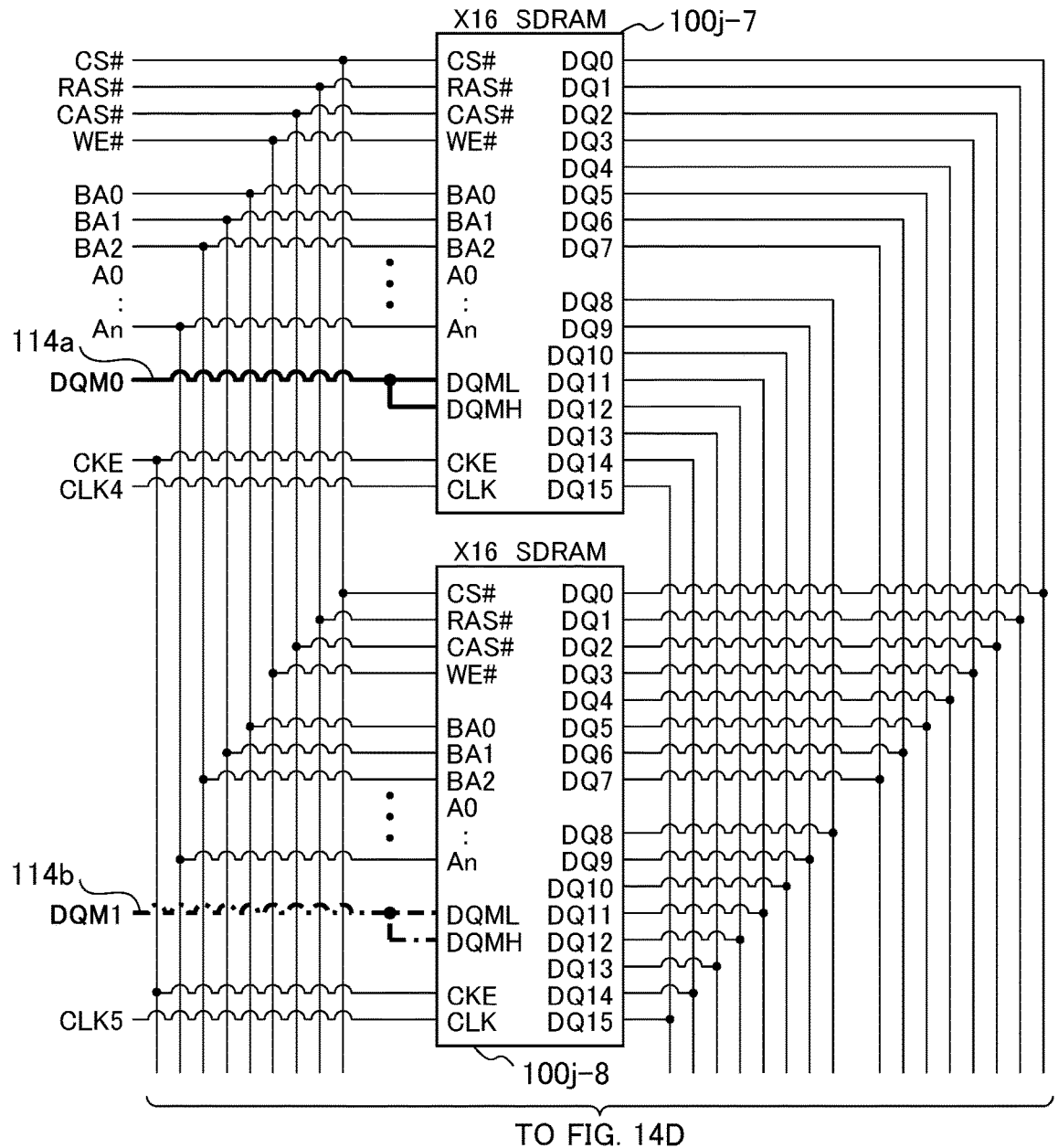
FIG. 14C shows the circuit configuration of the seventh embodiment.
Figure 14D:
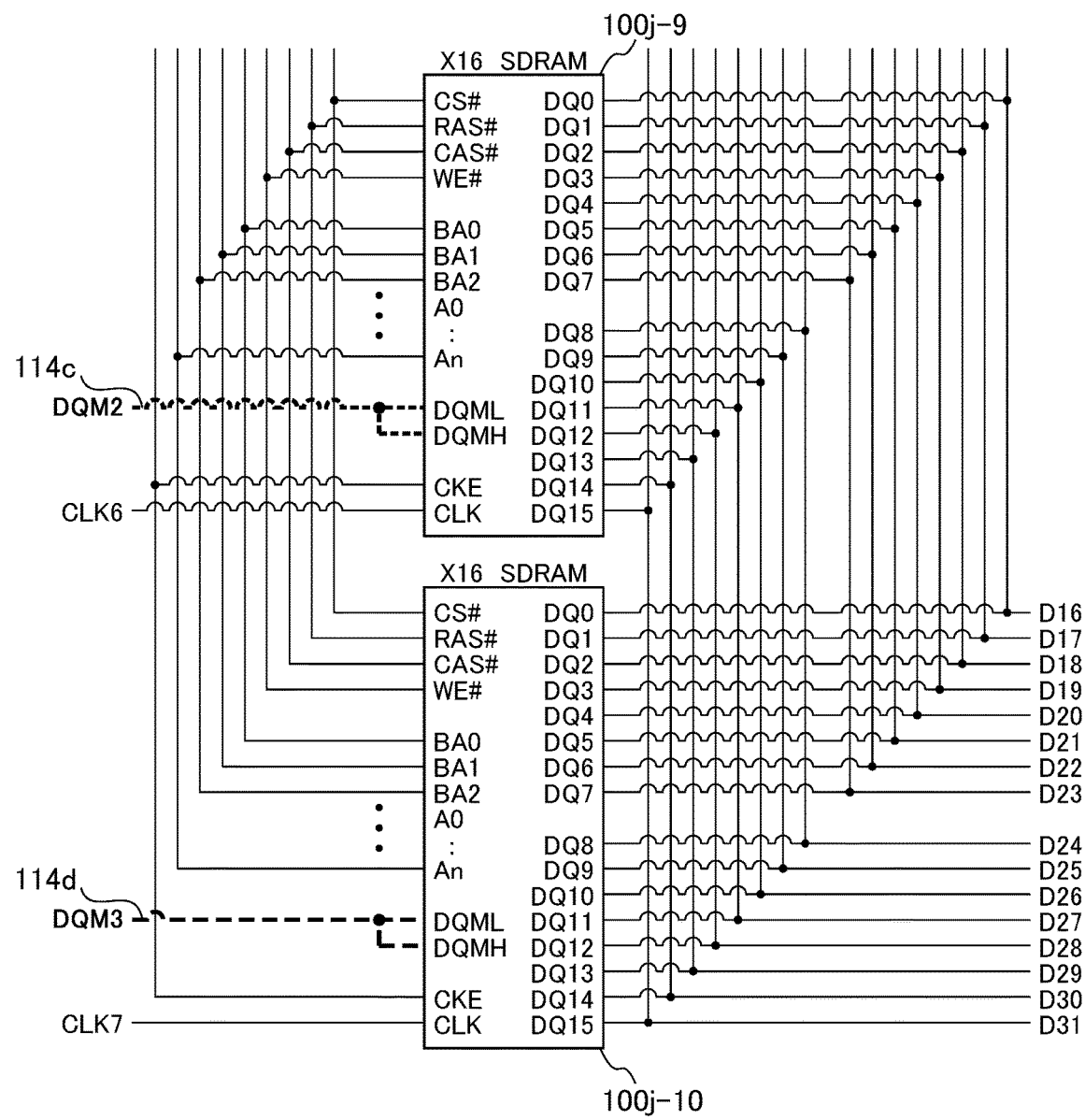
FIG. 14D shows the circuit configuration of the seventh embodiment.
Figure 14E:
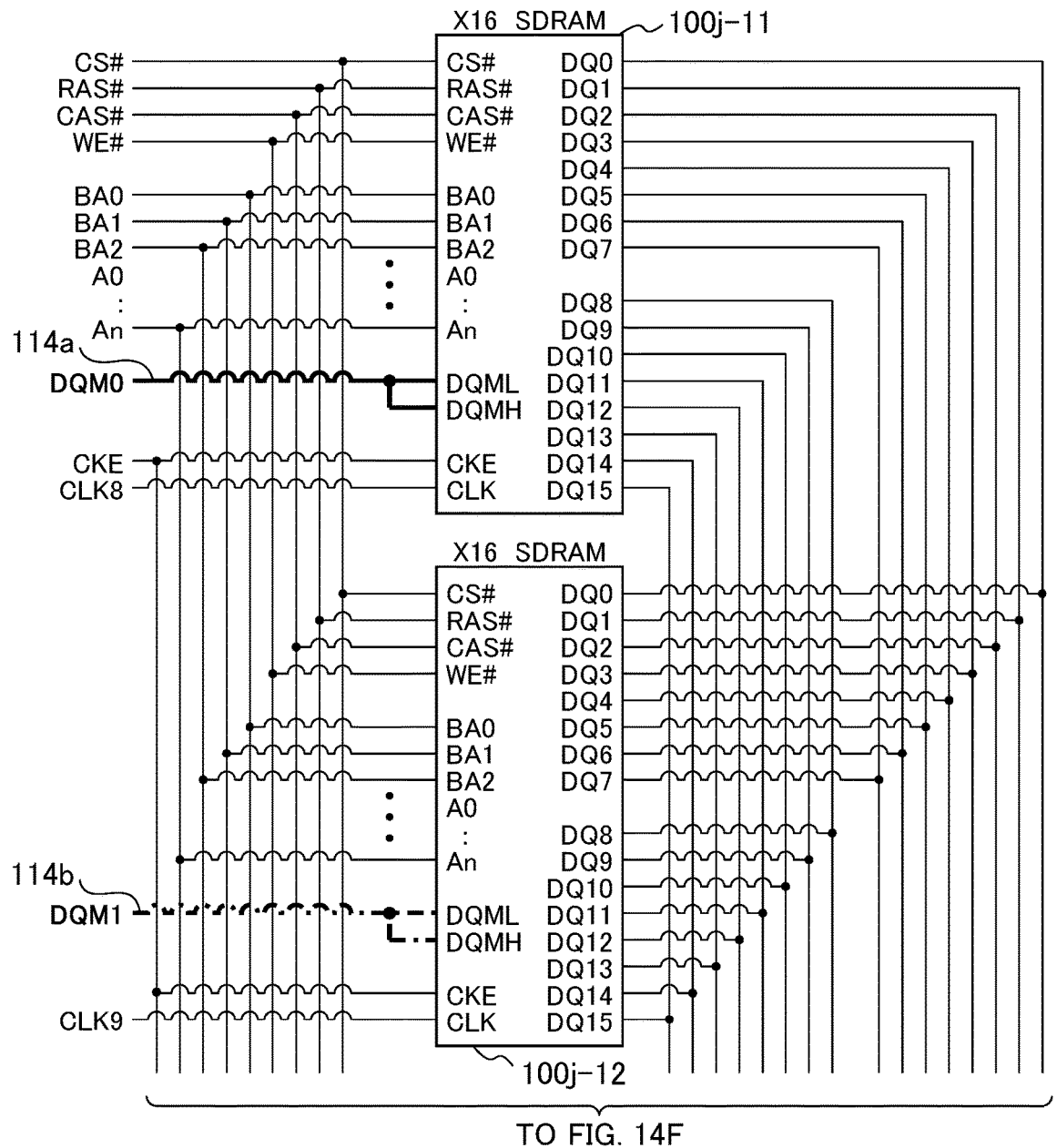
FIG. 14E shows the circuit configuration of the seventh embodiment.
Figure 14F:
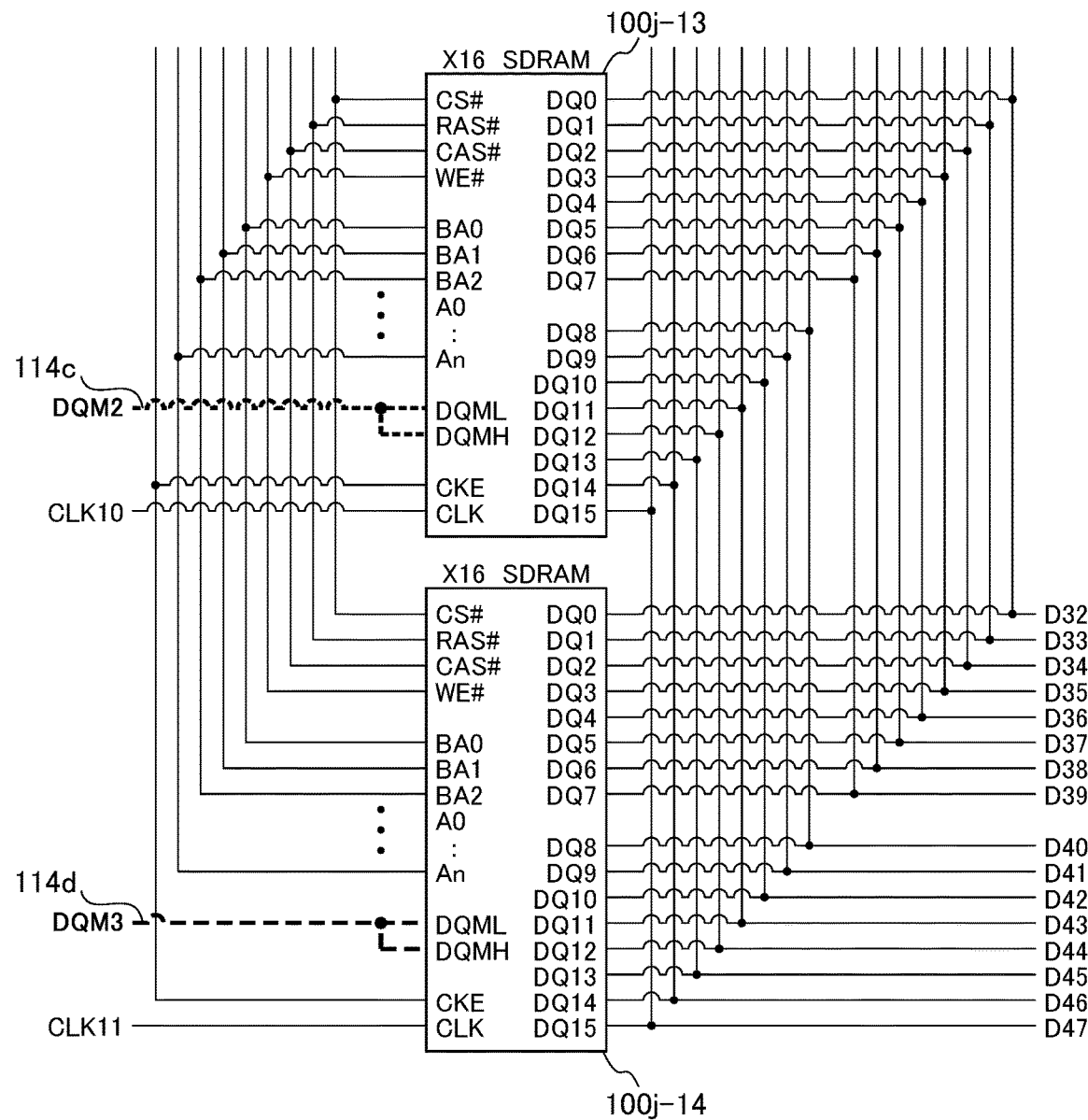
FIG. 14F shows the circuit configuration of the seventh embodiment.
Figure 14G:
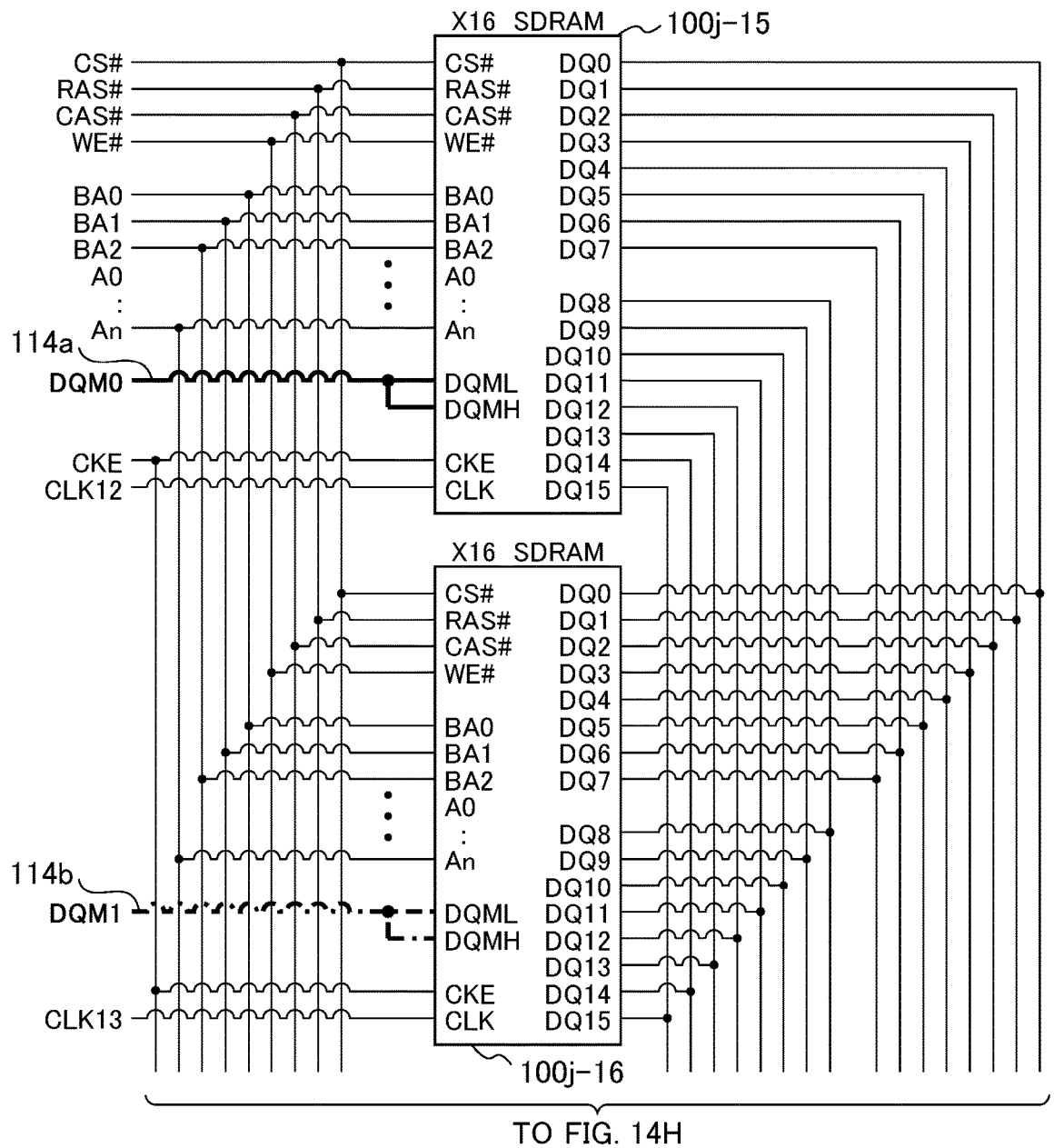
FIG. 14G shows the circuit configuration of the seventh embodiment.
Figure 14H:
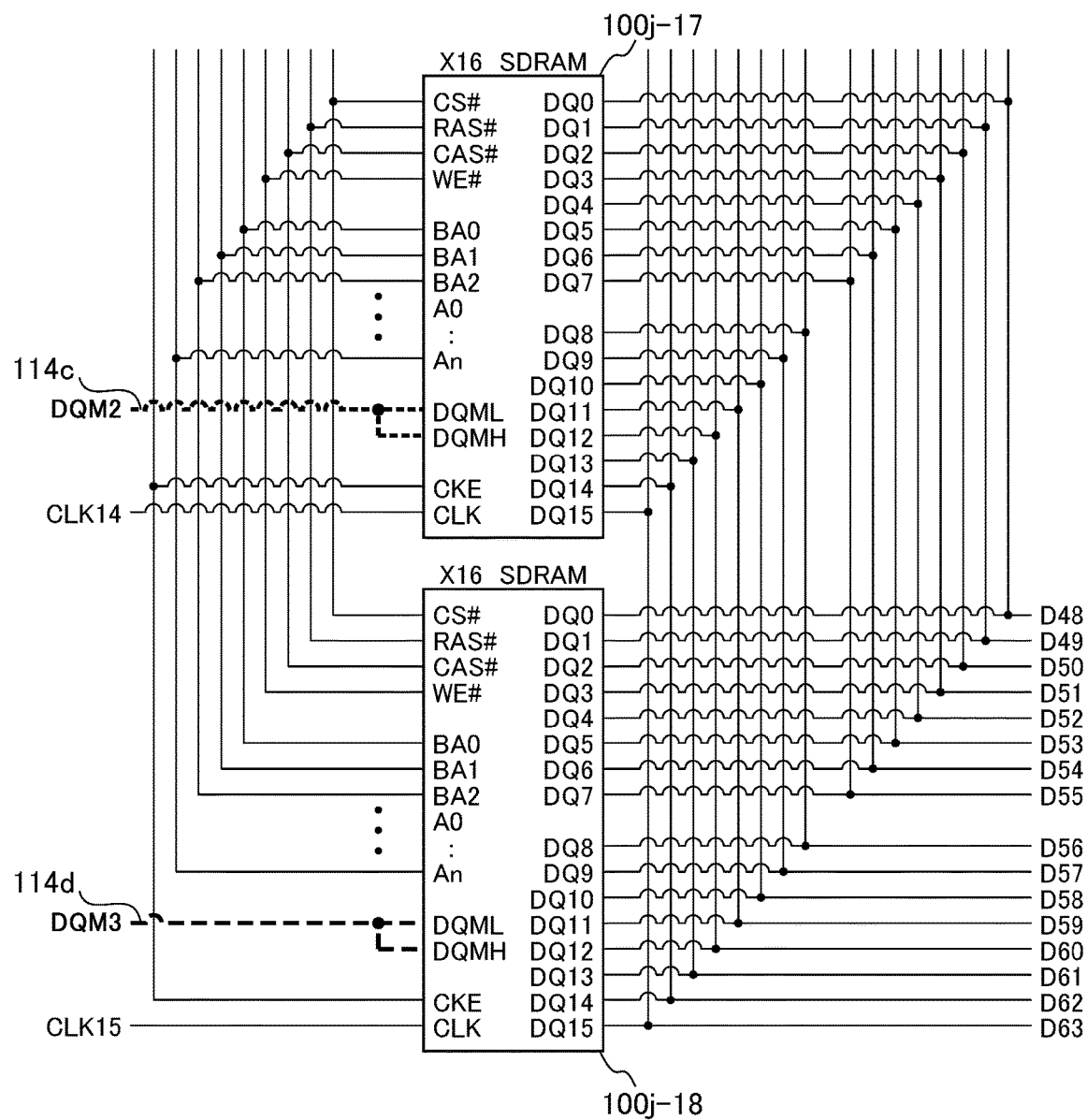
FIG. 14H shows the circuit configuration of the seventh embodiment.

FIGS. 11A and 11B show a circuit configuration of a memory according to a fourth embodiment of the present invention. FIGS. 11A and 11B show an example of a two-rank configuration with a data bus width of 32 bits. Parity/ECC has a bit width of not exceeding eight bits. This configuration uses an SDRAM device 100g-1, an SDRAM device 100g-2, an SDRAM device 100g-3, an SDRAM device 100g-4, and an SDRAM device 100g-5 each having a data width of 16 bits (×16).

Briefly, the configuration of the fourth embodiment is formed by applying the configuration of the second embodiment to the third embodiment. Specifically, a single SDRAM device is responsible for both Rank 0 and Rank 1 in the third embodiment. Meanwhile, in the fourth embodiment (and also in the second embodiment), an SDRAM device as a device responsible for Rank 0 and an SDRAM device as a device responsible for Rank 1 are provided separately. In the presence of the devices provided separately in this way, the number of ranks can be reduced by simply reducing the number of devices, making it possible to realize a flexible circuit configuration.

More specifically, each of the SDRAM devices 100g-1 and 100g-3 having a data width of 16 bits (×16) includes two types of data mask signal terminals, DQML and DQMH. A data mask signal DQM0-114a representing Rank 0 is applied to both of these terminals to make these SDRAM devices responsible for Rank 0. The SDRAM device 100g-1 is responsible for the lower-order 16 bits of data and the SDRAM device 100g-3 is responsible for the higher-order 16 bits of the data.

Likewise, each of the SDRAM devices 100g-2 and 100g-4 having a data width of 16 bits (×16) includes two types of data mask signal terminals, DQML and DQMH. A data mask signal DQM1-114b representing Rank 1 is applied to both of these terminals to make these SDRAM devices responsible for Rank 1. The SDRAM device 100g-2 is responsible for the lower-order 16 bits of data and the SDRAM device 100g-4 is responsible for the higher-order 16 bits of the data.

In this configuration, if DQM0-114a is negated, data in Rank 0 is output (input) by each of the SDRAM devices 100g-1 and 100g-3. If DQM1-114b is negated, data in Rank 1 is output (input) by each of the SDRAM devices 100g-2 and 100g-4. A configuration for connecting the SDRAM device 100g-5 responsible for parity/ECC will not be described as it is the same as that of the SDRAM device 100f-5 of the third embodiment.

Fifth Embodiment

FIGS. 12A, 12B, 12C, and 12D show a circuit configuration of a memory according to a fifth embodiment of the present invention. FIGS. 12A to 12D show an example of a two-rank configuration with a data bus width of 64 bits. Parity/ECC has a bit width of not exceeding eight bits. This configuration uses an SDRAM device 100h-1, an SDRAM device 100h-2, an SDRAM device 100h-3, an SDRAM device 100h-4, an SDRAM device 100h-5, an SDRAM device 100h-6, an SDRAM device 100h-7, an SDRAM device 100h-8, and an SDRAM device 100h-9 each having a data width of 16 bits (16×).

Briefly, the configuration of the fifth embodiment is formed by doubling a circuit corresponding to the data section in the configuration of the third embodiment and doubling a data bus width in the configuration of the third embodiment to 64 bits. Specifically, a circuit configuration section of the fifth embodiment including the SDRAM devices 100h-1, 100h-2, 100h-3, 100h-4, and 100f-5 is the same as the circuit configuration of the third embodiment including the SDRAM devices 100f-1, 100f-2, 100f-3, 100f-4, and 100f-5.

The fifth embodiment further includes the SDRAM devices 100h-6, 100h-7, 100h-8, and 100h-9 forming a circuit configuration same as the circuit configuration for the data section in the third embodiment including the SDRAM devices 100f-1, 100f-2, 100f-3, and 100f-4. The data mask signals DQM0-114a and DQM1-114b are also applied to the SDRAM devices 100h-6, 100h-7, 100h-8, and 100h-9 to make each SDRAM device 100h output (or input) data in Rank 0 and data in Rank 1.

The fifth embodiment with the above-described configuration doubles a data bus width to 64 bits. The operation in the fifth embodiment is the same as that of the first embodiment or 3. A configuration for connecting the SDRAM device 100h-5 responsible for parity/ECC will not be described as it is the same as that of the SDRAM device 100d-3 of the first embodiment and that of the SDRAM device 100f-5 of the third embodiment.

Sixth Embodiment

FIGS. 13A, 13B, 13C, and 13D show a circuit configuration of a memory according to a sixth embodiment of the present invention. FIGS. 13A to 13D show an example of a two-rank configuration with a data bus width of 64 bits. Parity/ECC has a bit width of not exceeding eight bits. This configuration uses an SDRAM device 100i-1, an SDRAM device 100i-2, an SDRAM device 100i-3, an SDRAM device 100i-4, an SDRAM device 100i-5, an SDRAM device 100i-6, an SDRAM device 100i-7, an SDRAM device 100i-8, and an SDRAM device 100i-9 each having a data width of 16 bits (16×).

Briefly, the configuration of the sixth embodiment is formed by applying the configuration of the second embodiment (fourth embodiment) to the fifth embodiment. Specifically, a single SDRAM device is responsible for both Rank 0 and Rank 1 in the fifth embodiment. Meanwhile, in the sixth embodiment (and also in the second embodiment (fourth embodiment)), an SDRAM device as a device responsible for Rank 0 and an SDRAM device as a device responsible for Rank 1 are provided separately. In the presence of the devices provided separately in this way, the number of ranks can be reduced by simply reducing the number of devices, making it possible to realize a flexible circuit configuration.

More specifically, each of the SDRAM devices 100i-1, 100i-3, 100i-6, and 100i-8 having a data width of 16 bits (×16) includes two types of data mask signal terminals, DQML and DQMH. A data mask signal DQM0-114a representing Rank 0 is applied to both of these terminals to make these SDRAM devices responsible for Rank 0. Likewise, each of the SDRAM devices 100i-2, 100i-4, 100i-7, and 100i-9 having a data width of 16 bits (×16) includes two types of data mask signal terminals, DQML and DQMH. A data mask signal DQM1-114b representing Rank 1 is applied to both of these terminals to make these SDRAM devices responsible for Rank 1.

In this configuration, if DQM0-114a is negated, data in Rank 0 is output (input) by each of the SDRAM devices 100i-1, 100i-3, 100i-6, and 100i-8. If DQM1-114b is negated, data in Rank 1 is output (input) by each of the SDRAM devices 100i-2, 100i-4, 100i-7, and 100i-9.

A configuration for connecting the SDRAM device 100i-5 responsible for parity/ECC will not be described as it is the same as that of the SDRAM device 100g-5 of the fourth embodiment. In this configuration, a memory of a multi-rank SDRAM having a two-rank configuration can be formed using the nine SDRAM devices 100i. A one-rank memory can be formed easily by removing four SDRAM devices (100i-2, 4, 7, and 9) from this configuration. Thus, a one-rank memory can be formed easily from a two-rank memory only by reducing the number of SDRAM devices 100i and by using a printed wiring board same as a printed wiring board for realizing the configuration of the sixth embodiment.

Seventh Embodiment

FIGS. 14A, 14B, 14C, 14D, 14E, 14F, 14G, and 14H show a circuit configuration of a memory according to a seventh embodiment of the present invention. FIGS. 14A to 14H show an example of a four-rank configuration with a data bus width of 64 bits. Parity/ECC has a bit width of not exceeding eight bits. This configuration uses an SDRAM device 100j-1, an SDRAM device 100j-2, an SDRAM device 100j-3, an SDRAM device 100j-4, an SDRAM device 100j-5, an SDRAM device 100j-6, an SDRAM device 100j-7, an SDRAM device 100j-8, an SDRAM device 100j-9, an SDRAM device 100j-10, an SDRAM device 100j-11, an SDRAM device 100j-12, an SDRAM device 100*j*-13, an SDRAM device 100*j*-14, an SDRAM device 100*j*-15, an SDRAM device 100*j*-16, an SDRAM device 100*j*-17, and an SDRAM device 100*j*-18 each having a data width of 16 bits (×16)

Unlike in the examples 1 to 6, the number of ranks is four in the seventh embodiment. The configuration of the seventh embodiment is basically formed by expanding the above-described configuration of the sixth embodiment (where the number of ranks is two) to a four-rank configuration. For such expansion, four types of data mask signals including DQM0-114*a*, DQM1-114*b*, DQM2-114*c*, and DQM3-114*d* are used. These signals correspond to Rank 0, Rank 1, Rank 2, and Rank 3 respectively.

More specifically, each of the SDRAM devices 100*j*-1, 100*j*-7, 100*j*-11, and 100*j*-15 having a data width of 16 bits (×16) includes two types of data mask signal terminals, DQML and DQMH. The data mask signal DQM0-114*a* representing Rank 0 is applied to both of these terminals to make these SDRAM devices responsible for Rank 0. Likewise, each of the SDRAM devices 100*j*-2, 100*j*-8, 100*j*-12, and 100*j*-16 having a data width of 16 bits (×16) includes two types of data mask signal terminals, DQML and DQMH. The data mask signal DQM1-114*b* representing Rank 1 is applied to both of these terminals to make these SDRAM devices responsible for Rank 1.

Likewise, each of the SDRAM devices 100*j*-3, 100*j*-9, 100*j*-13, and 100*j*-17 having a data width of 16 bits (×16) includes two types of data mask signal terminals, DQML and DQMH. The data mask signal DQM2-114*c* representing Rank 2 is applied to both of these terminals to make these SDRAM devices for Rank 2. Likewise, each of the SDRAM devices 100*j*-4, 100*j*-10, 100*j*-14, and 100*j*-18 having a data width of 16 bits (×16) includes two types of data mask signal terminals, DQML and DQMH. The data mask signal DQM3-114*d* representing Rank 3 is applied to both of these terminals to make these SDRAM devices responsible for Rank 3.

In this configuration, if DQM0-114*a* is negated, data in Rank 0 is output (input) by each of the SDRAM devices 100*j*-1, 100*j*-7, 100*j*-11, and 100*j*-15. If DQM1-114*b* is negated, data in Rank 1 is output (input) by each of the SDRAM devices 100*j*-2, 100*j*-8, 100*j*-12, and 100*j*-16.

In this configuration, if DQM2-114*c* is negated, data in Rank 2 is output (input) by each of the SDRAM devices 100*j*-3, 100*j*-9, 100*j*-13, and 100*j*-17. If DQM3-114*d* is negated, data in Rank 3 is output (input) by each of the SDRAM devices 100*j*-4, 100*j*-10, 100*j*-14, and 100*j*-18. A configuration for connecting the SDRAM devices 100*j*-5 and 100*j*-6 responsible for parity/ECC is quite similar to that of the SDRAM device 100*i*-5 of the sixth embodiment. Meanwhile, the seventh embodiment requires four ranks unlike the first to sixth embodiments featuring the two-rank configurations, and is provided with not only SDRAM device 100*j*-5 but also the SDRAM device 100*j*-6 which has no counterpart in the examples 1 to 6.

In the sixth embodiment, the single SDRAM device 100*i*-5 is responsible for Rank 0 and Rank 1. Meanwhile, the SDRAM device 100*j*-5 is responsible for parity/ECC in Rank 0 and parity/ECC in Rank 1 in the seventh embodiment, and the data mask signals DQM0-114*a* and DQM1-114*b* are applied to the SDRAM device 100*j*-5. Further, the SDRAM device 100*j*-6 is responsible for Rank 2 and Rank 3 in the seventh embodiment, and the data mask signals DQM2-114*c* and DQM3-114*d* are applied to the SDRAM device 100*j*-6.

In this configuration, a multi-rank SDRAM memory having a four-rank configuration can be formed using the 18 SDRAM devices 100*j*. The number of ranks can be reduced by one easily only by removing four SDRAM devices (100*j*-4, 10, 14, and 18) from this configuration. Specifically, a three-rank memory can be formed using the 14 SDRAM devices 100*j* (100*j*-1, 2, 3, 5, 6, 7, 8, 9, 11, 12, 13, 15, 16, and 17). Likewise, a two-rank memory can be formed using the nine SDRAM devices 100*j* (100*j*-1, 2, 5, 7, 8, 11, 12, 15, and 16) (like in the sixth embodiment). Likewise, as already described in the sixth embodiment, a one-rank memory can be formed using the five SDRAM devices 100*j* (100*j*-1, 5, 7, 11, and 15). Like in the cases described above, a one-rank memory can be formed easily from a four-rank memory only by reducing the number of SDRAM devices 100*j* and by using a printed wiring board same as a printed wiring board for realizing the configuration of the seventh embodiment.

Eighth Embodiment

Figure 15B:
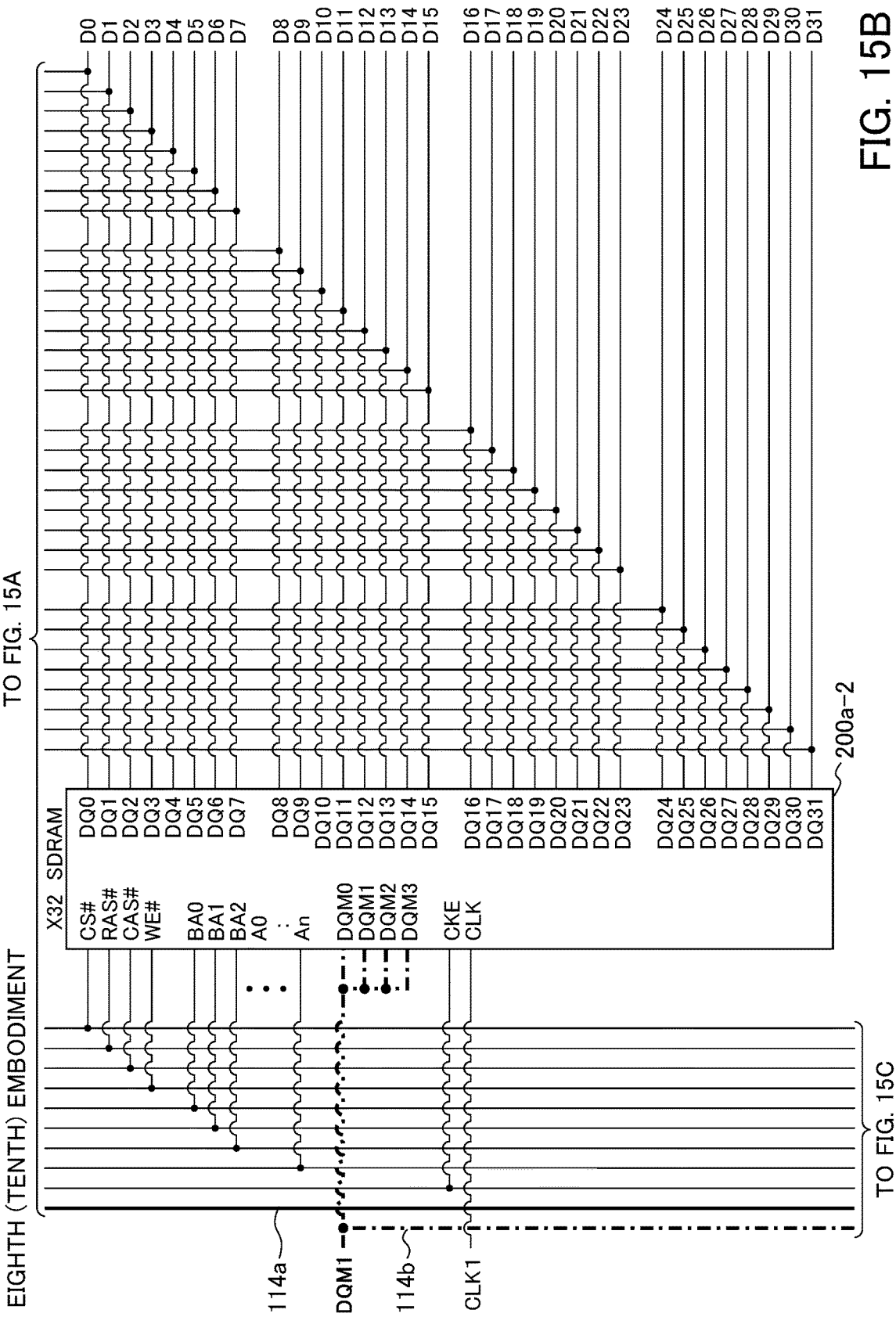
FIG. 15B shows the circuit configuration of the eighth embodiment or tenth embodiment.
Figure 15C:
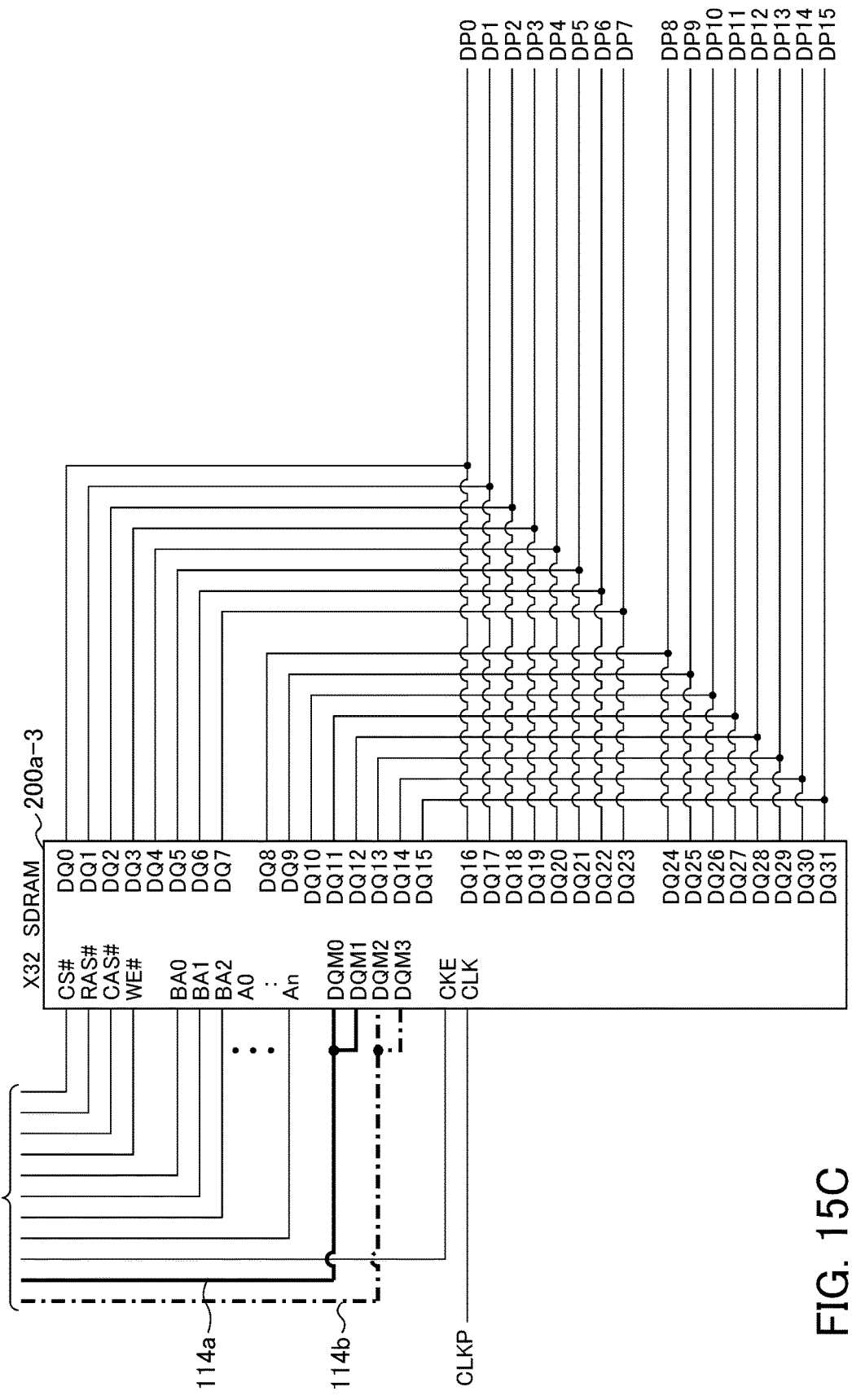
FIG. 15C shows the circuit configuration of the eighth embodiment or tenth embodiment.
Figure 16D:
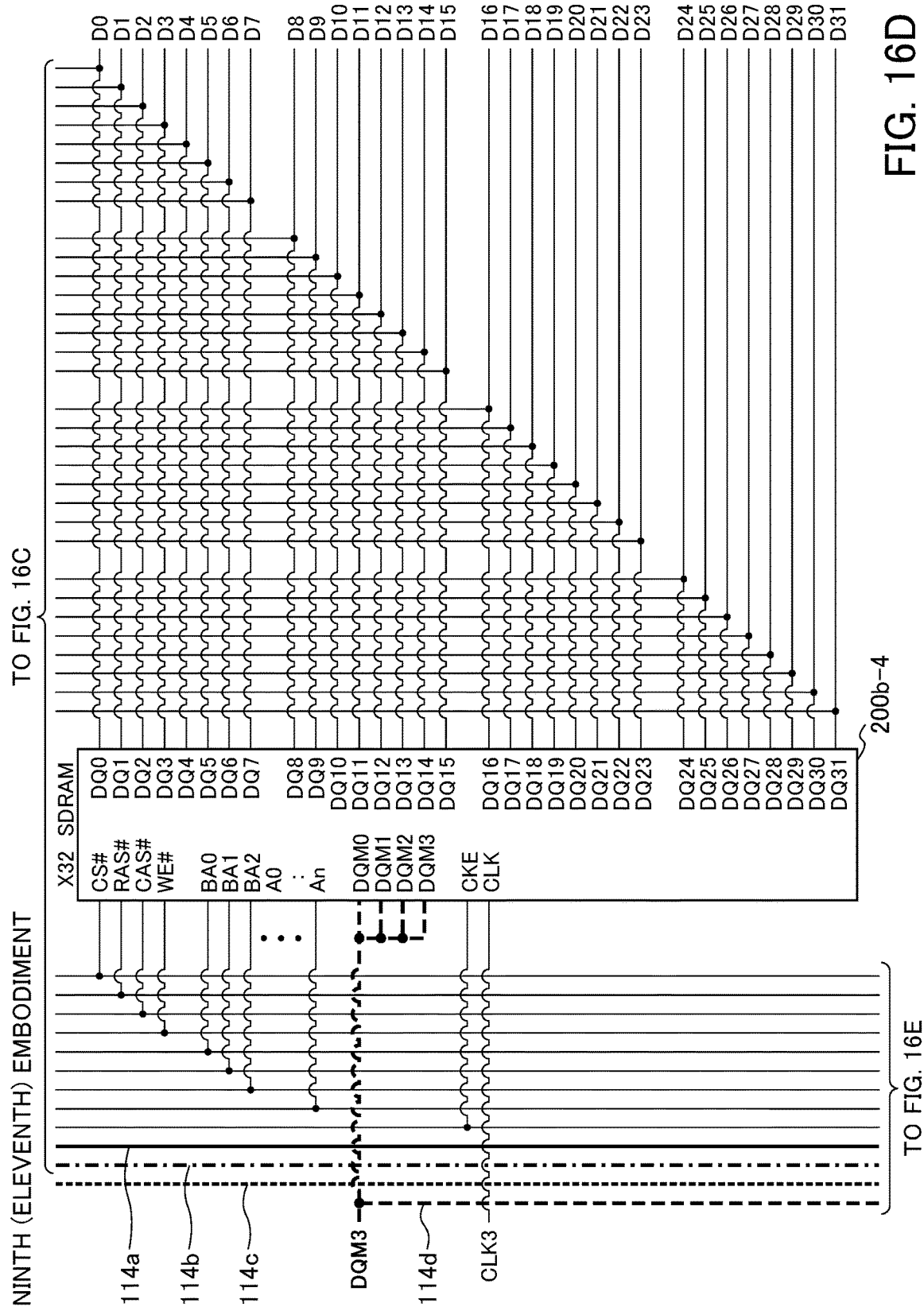
FIG. 16D shows the circuit configuration of the ninth embodiment or eleventh embodiment.
Figure 16E:
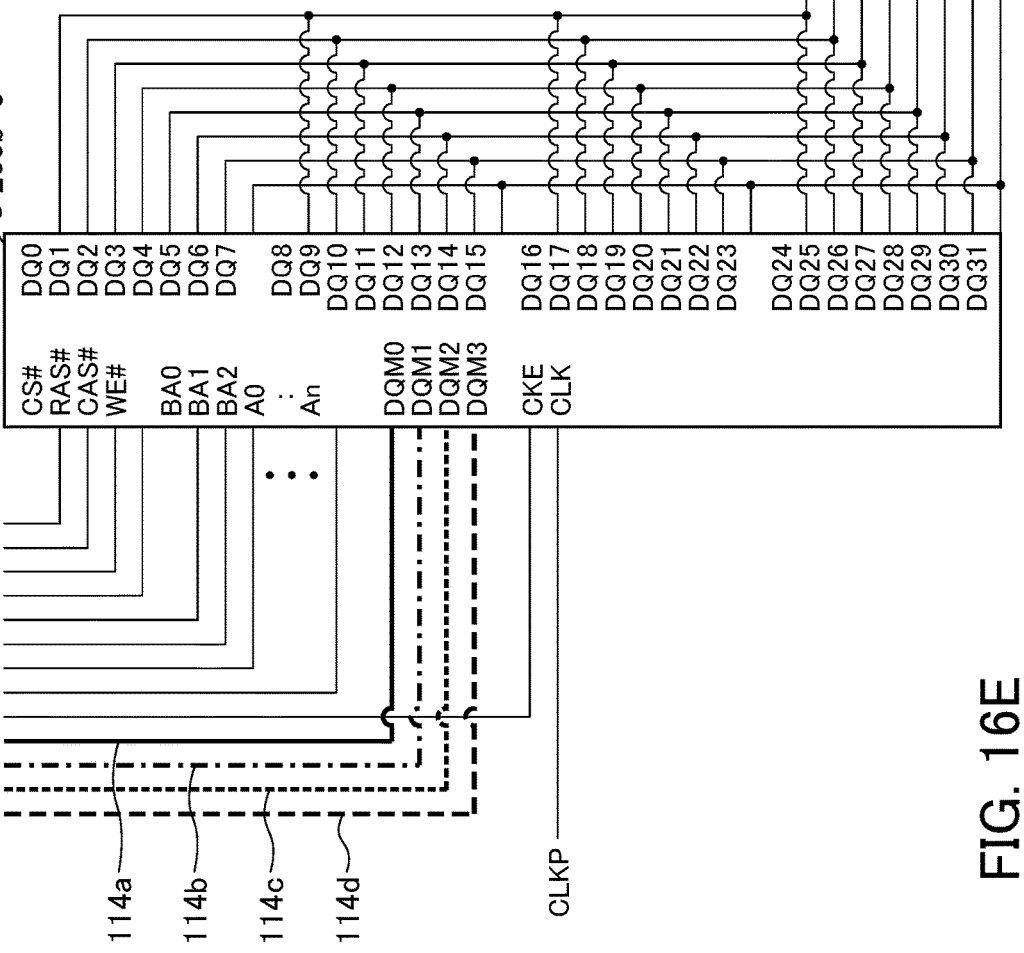
FIG. 16E shows the circuit configuration of the ninth embodiment or eleventh embodiment.
Figure 17B:
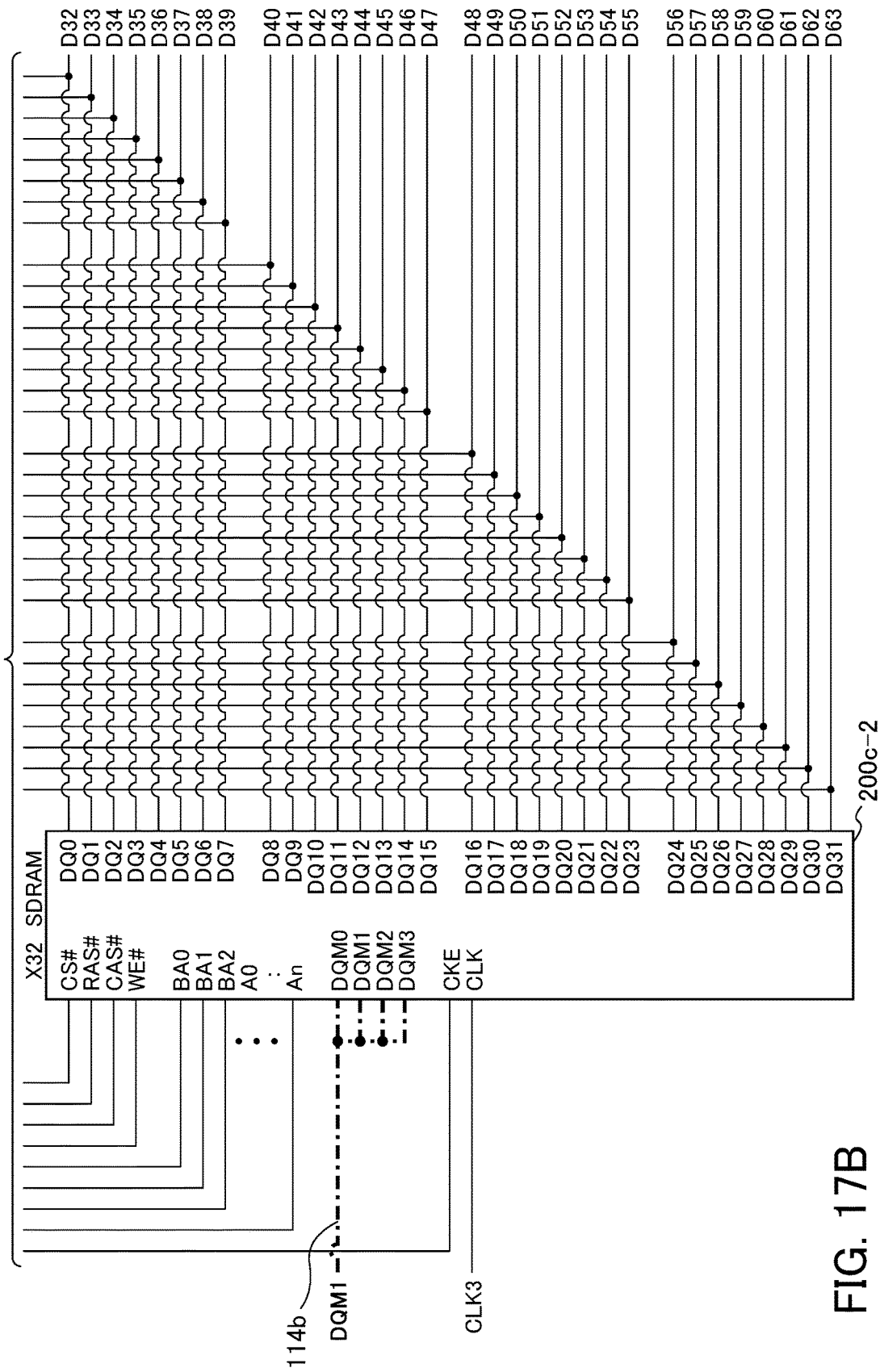
FIG. 17B shows the circuit configuration of the tenth embodiment.
Figure 18A:
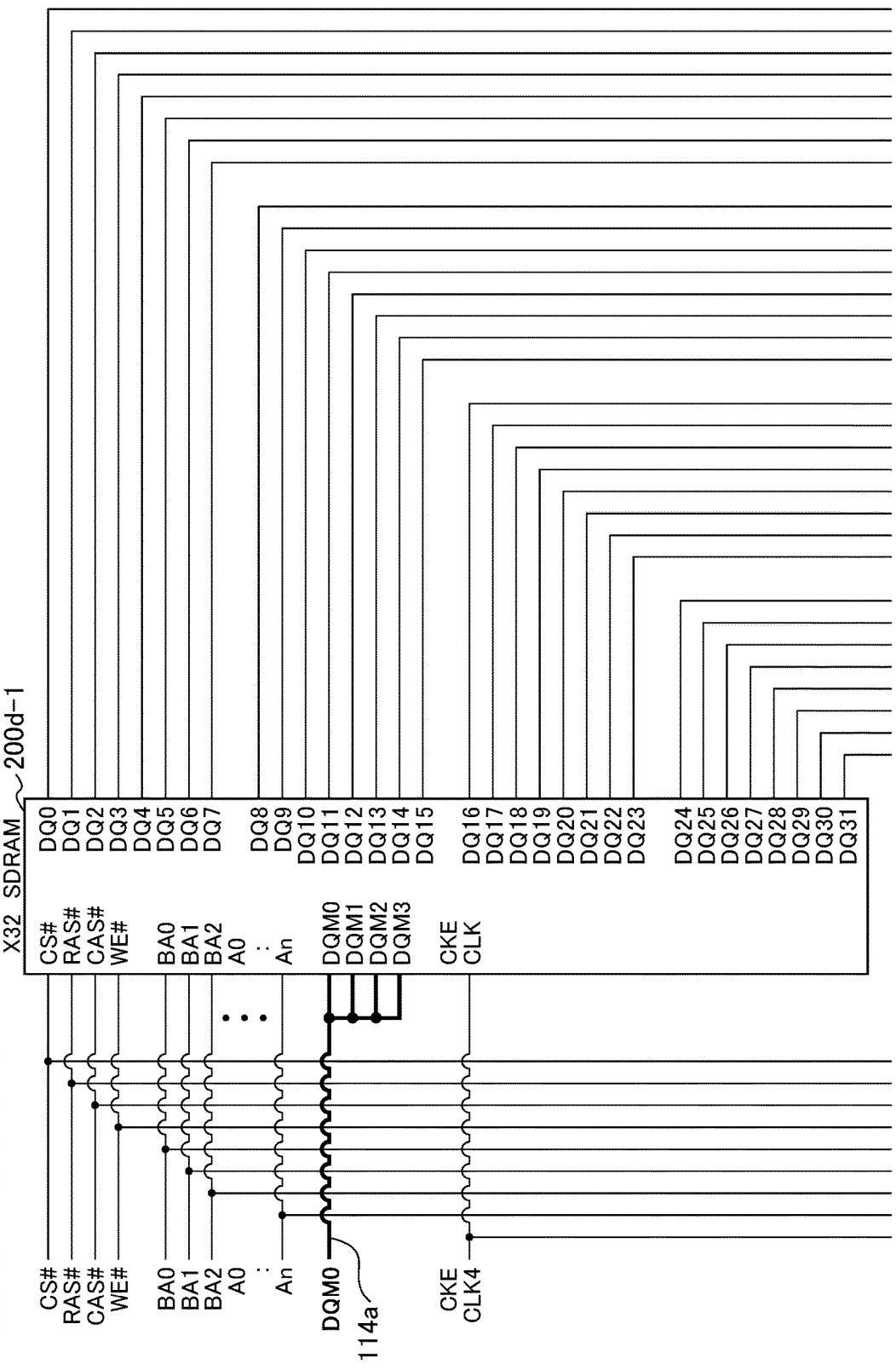
FIG. 18A shows a circuit configuration of the eleventh embodiment.
Figure 18B:
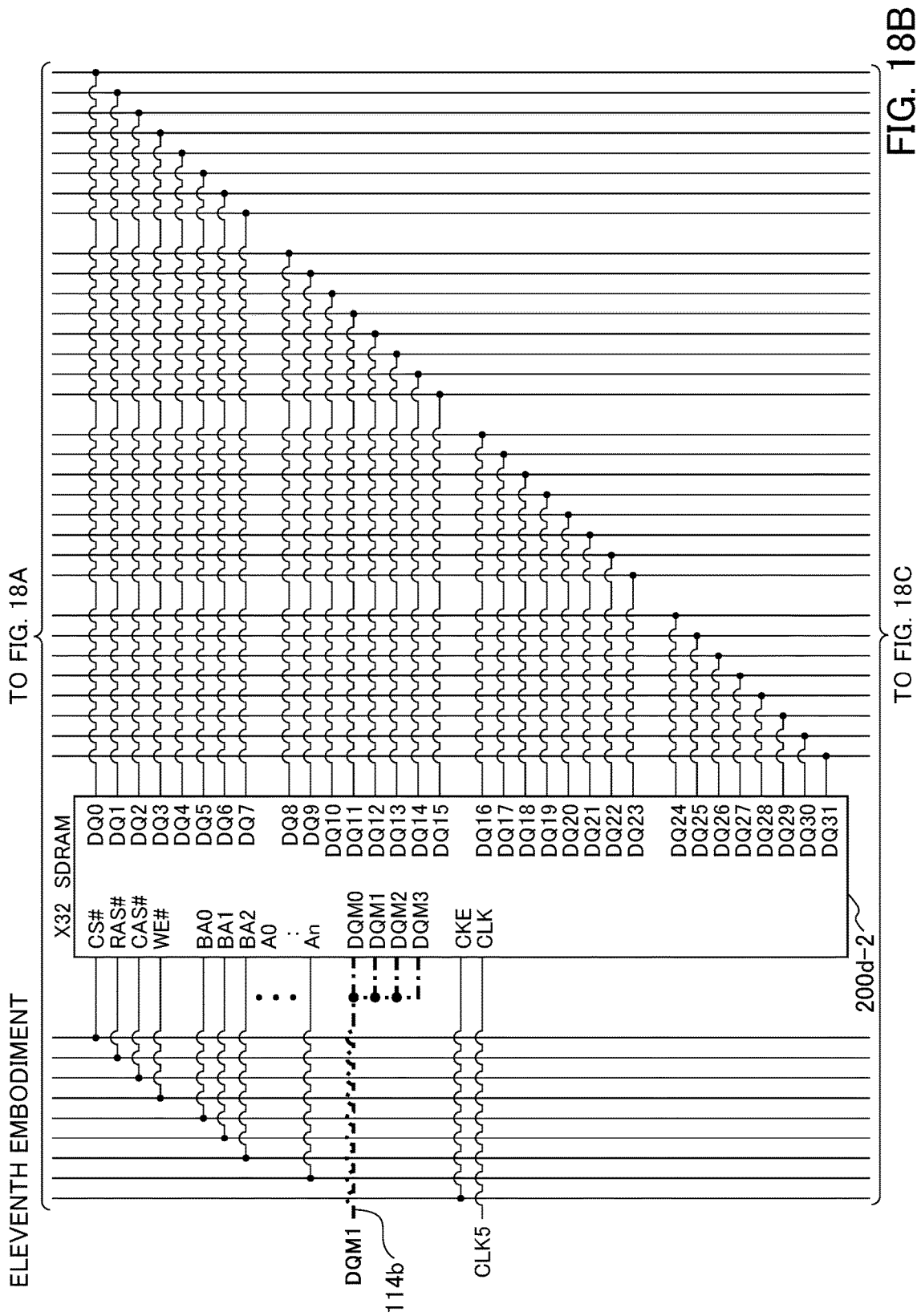
FIG. 18B shows the circuit configuration of the eleventh embodiment.
Figure 18D:
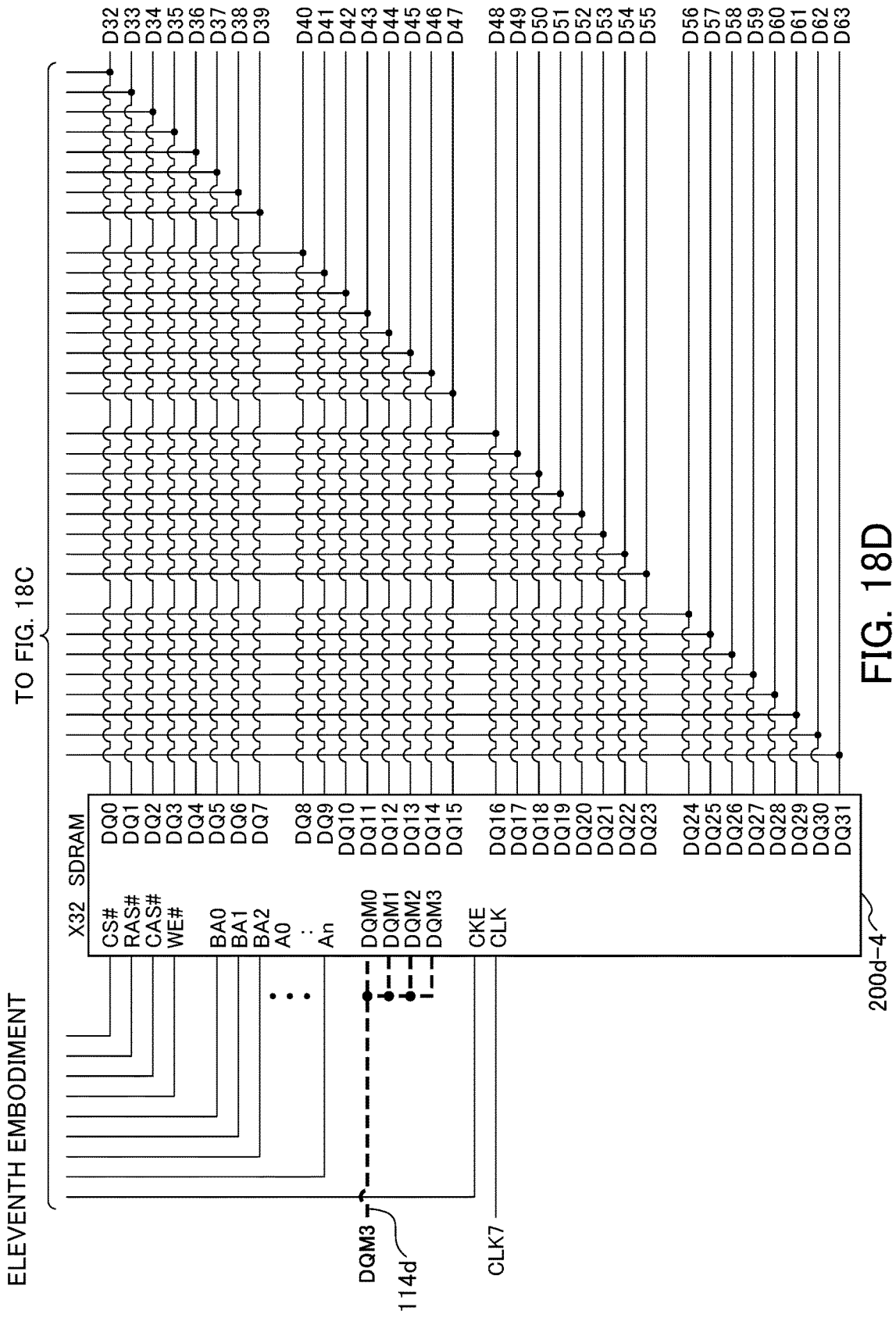
FIG. 18D shows the circuit configuration of the eleventh embodiment.
Figure 19A:
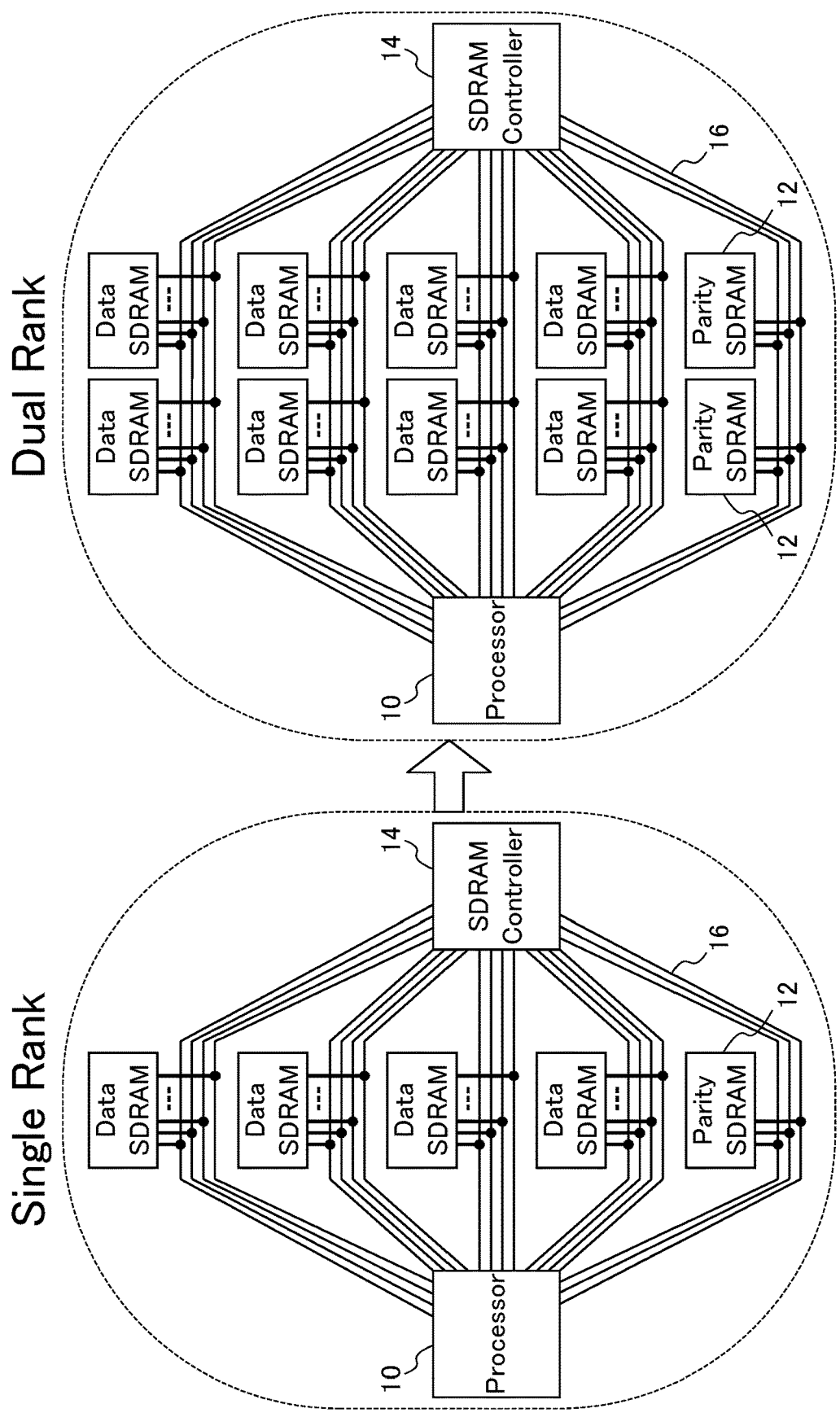
FIG. 19A is an explanatory view explaining a single-rank configuration and a dual-rank configuration.
Figure 19B:
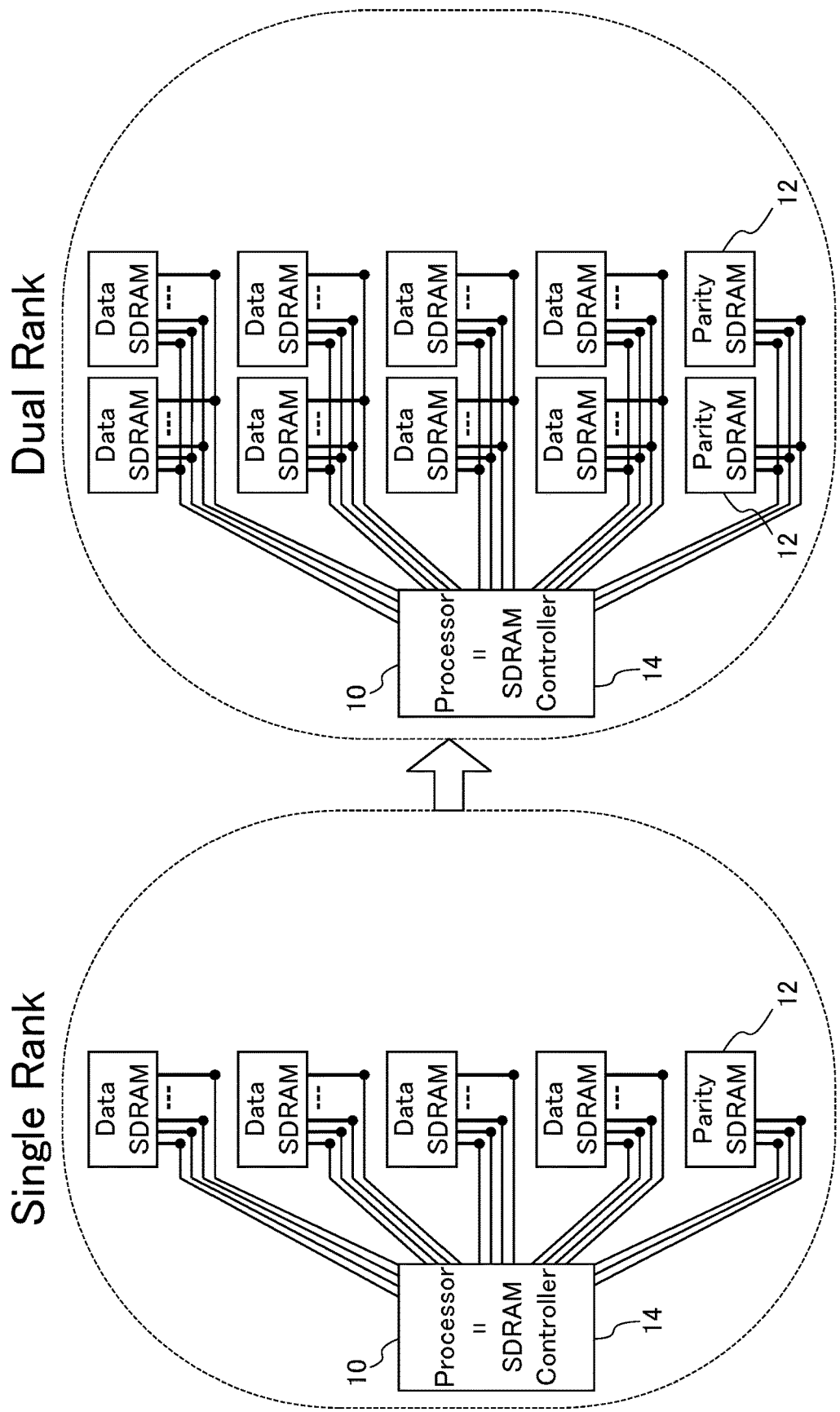
FIG. 19B is an explanatory view explaining a configuration where a processor further functions as an SDRAM controller compared to the configuration of FIG. 19A.
Figure 19C:
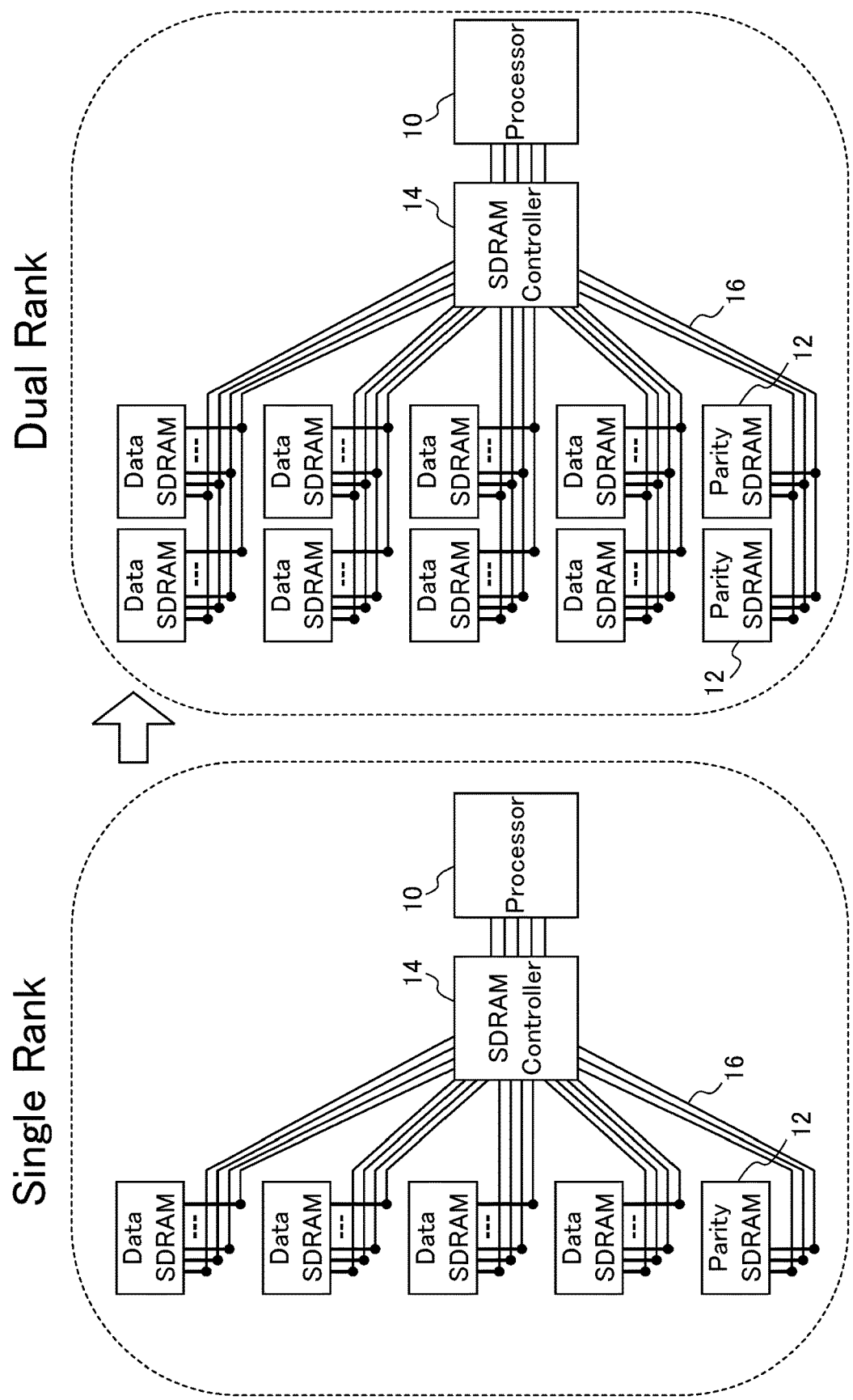
FIG. 19C is an explanatory view explaining a configuration where the processor is not connected directly to an SDRAM device but is connected to the SDRAM controller through a different bus compared to the configuration of FIG. 19A.
Figure 20:
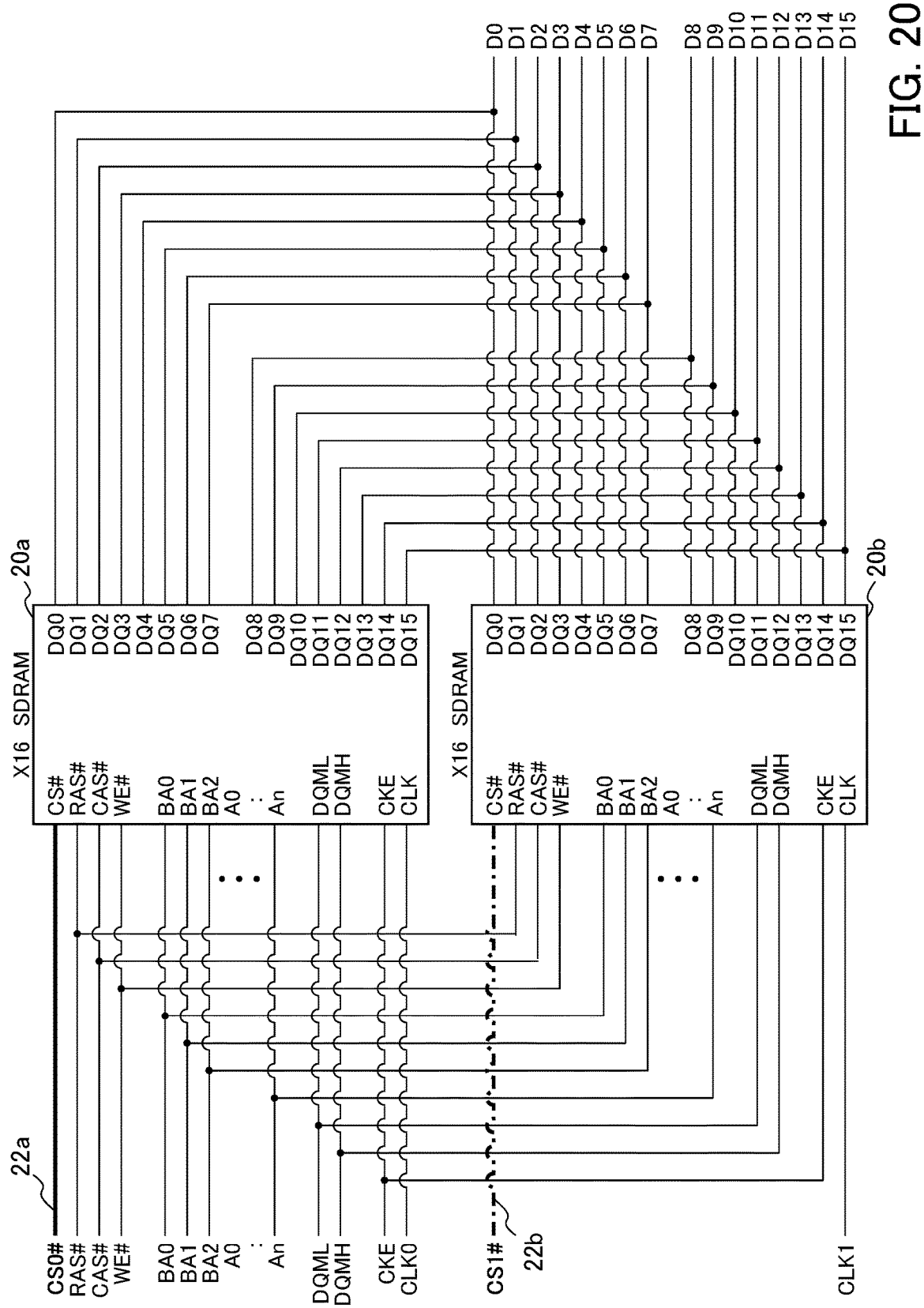
FIG. 20 is an explanatory view explaining control over data using a CS# signal in a dual-rank SDRAM configuration.

FIGS. 15A, 15B, and 15C show a circuit configuration of a memory according to an eighth embodiment of the present invention. Similar to the configuration of the second embodiment, the configuration shown in the example of FIGS. 15A to 15C is a two-rank configuration including three SDRAM devices 200*a*-1, 200*a*-2, and 200*a*-3. Unlike in the second embodiment, a data bus width is doubled to 32 bits. Further, the width of parity/ECC is also doubled to 16 bits or less. Briefly, in the memory of the eighth embodiment, a bit width (an upper limit of the bit width) for each of data and parity/ECC is doubled from the bit width of the second embodiment. Unlike in the second embodiment, in the eighth embodiment, the bit width is doubled by using the SDRAM devices 200*a*-1, 200*a*-2, and 200*a*-3 each having the number of bits doubled to 32 (×32).

As shown in FIGS. 15A to 15C, each of the SDRAM devices 200*a*-1 to 200*a*-3 includes four types of data mask signal terminals, DQM0 to DQM3. These data mask signal terminals offer byte-wise data masking capability for 32-bit data. In the eighth embodiment, a data mask signal DQM0-114*a* representing Rank 0 is applied to all the terminals DQM0 to DQM3 of the SDRAM device 200*a*-1 to make this SDRAM device responsible for Rank 0.

The SDRAM device 200*a*-2 also includes the four types of terminals, DQM0 to DQM3. A data mask signal DQM1-114*b* representing Rank 1 is applied to all these terminals to make the SDRAM device 200*a*-2 responsible for data in Rank 1. A configuration for connecting the SDRAM device 200*a*-3 responsible for parity/ECC is the same as that of the SDRAM device 100*e*-3 of the second embodiment (FIG. 9), except that the bit width of the parity/ECC is doubled from 16 bits to 32 bits. Like the above-described SDRAM device 200*a*-1, etc., the SDRAM device 200*a*-3 includes the four types of data mask signal terminals, DQM0 to DQM3 to which data mask signals are to be applied. The data mask signal DQM0-114*a* representing Rank 0 is applied to the lower-order terminals DQM0 and DQM1 to make the lower-order 16 bits function as bits for parity/ECC in Rank 0. The data mask signal DQM1-114*b* representing Rank 1 is applied to the higher-order terminals DQM2 and DQM3 to make the higher-order 16 bits function as bits for parity/ECC in Rank 1.

In the eighth embodiment, a multi-rank SDRAM memory having a two-rank configuration can be formed using the three SDRAM devices 200*a*. Removing the SDRAM device 200*a*-2 from this configuration obviously results in a one-rank SDRAM memory. Thus, a two-rank memory (including the three SDRAM devices 200*a*) and a one-rank memory (including the two SDRAM devices 200*a*-1 and 200*a*-3) can be formed freely using a printed wiring board prepared for realizing the configuration of FIGS. 15A to 15C. In other words, a one-rank memory and a two-rank memory can be realized by a single printed wiring board design. This also applies to the above-described examples such as the second embodiment.

Ninth Embodiment

FIGS. 16A, 16B, 16C, and 16D show a circuit configuration of a memory according to a ninth embodiment of the present invention. FIGS. 16A to 16D show an example of a four-rank configuration with a data bus width of 32 bits. Parity/ECC has a bit width of not exceeding eight bits. This configuration uses an SDRAM device 200b-1, an SDRAM device 200b-2, an SDRAM device 200b-3, an SDRAM device 200b-4, and an SDRAM device 200b-5 each having a data width of 32 bits (×32).

Briefly, the configuration of the ninth embodiment is formed by increasing the number of ranks from two to four, compared to the configuration of the eighth embodiment. Meanwhile, regarding the bit width of the parity/ECC, the number of bits is reduced from a number of 16 or less to a number of eight or less. As a result, the SDRAM device 200b responsible for data includes four SDRAM devices 200b-1, 200b-2, 200b-3, and 200b-4. This means that the number of SDRAM devices required for data is twice the number of SDRAM devices required in the eighth embodiment. Meanwhile, like in the eighth embodiment, only the one SDRAM device 200b-5 is required for the parity/ECC.

Briefly, to achieve the four-rank configuration, the SDRAM devices 200b-1, 200b-2, 200b-3, and 200b-4 are provided to be responsible for corresponding ones of ranks. A data mask signal DQM0-114a, a data mask signal DQM1-114b, a data mask signal DQM2-114c, and a data mask signal DQM3-114d are connected to the SDRAM devices 200b-1, 200b-2, 200b-3, and 200b-4 respectively. By doing so, if any of the ranks is selected, data about the SDRAM device 200b corresponding to the selected rank is output (input).

The four types of data mask signals DQM0-114a, DQM1-114b, DQM2-114c, and DQM3-114d are applied to the four types of terminals DQM0 to DQM3 respectively of the SDRAM device 200b-5 responsible for the parity/ECC. As a result, if any of the data mask signals is negated, any eight-bit data of the 32-bit data width is output (input) as the parity/ECC. Each of The SDRAM devices 200b has a data width of 32 bits and this 32-bit data is divided into four eight-bit data. A data mask signal corresponding to each eight-bit data is applied to a corresponding one of the four types of terminals DQM0 to DQM3. Thus, if any of the data mask signals is negated, eight-bit data corresponding to the negated data mask signal becomes usable as the parity/ECC.

As described above, each of the SDRAM devices 200b is prepared for a corresponding rank. Thus, a memory with an arbitrary number of ranks can be formed easily by adjusting the number of the SDRAM devices 200b. Specifically, in the ninth embodiment, the four-rank memory is formed using the five SDRAM devices 200b. Meanwhile, a three-rank memory can be formed easily using the four SDRAM devices 200b (200b-1, 2, 3, and 5). A two-rank memory can be formed easily using the three SDRAM devices 200b (200b-1, 2, and 5) (like in the eighth embodiment). A one-rank memory can be formed easily using the two SDRAM devices 200b (200b-1 and 5) (like in the eighth embodiment). Further, a one-rank memory, a two-rank memory, a three-rank memory, and a four-rank memory can be formed easily using a printed wiring board same as a printed wiring board for realizing the configuration of the ninth embodiment.

Tenth Embodiment

FIGS. 15A, 15B, 15C, 17A, and 17B show a circuit configuration of a memory according to a tenth embodiment of the present invention. The tenth embodiment shows a two-rank configuration with a data bus width of 64 bits. Parity/ECC has a bit width of not exceeding 16 bits. This configuration uses an SDRAM device 200a-1, an SDRAM device 200a-2, an SDRAM device 200a-3, an SDRAM device 200c-1, and an SDRAM device 200c-2 each having a data width of 32 bits (×32).

Briefly, the configuration of the tenth embodiment is formed by doubling a data bus width to 64 bits in the configuration of the eighth embodiment. Thus, a circuit configuration corresponding to FIGS. 15A, 15B, and 15C is the same as that described above in the eighth embodiment. The memory of the tenth embodiment has a 64-bit width achieved by adding a configuration of FIGS. 17A and 17B corresponding to the circuit configuration of the eighth embodiment responsible for the data section. The configuration of parity/ECC will not be described as it is the same as that of the eighth embodiment. Thus, the operation of the tenth embodiment is substantially the same as that of the eighth embodiment, and therefore the operation of the memory as a whole will not be described.

As described above, in the tenth embodiment, the two-rank memory is formed using five SDRAM devices 200. A one-rank memory can obviously be formed using three SDRAM devices 200 (200a-1, 200a-3, and 200c-1). Thus, a two-rank memory (including the five SDRAM devices 200) and a one-rank memory (including the three SDRAM devices 200) can be formed freely using a printed wiring board prepared for realizing the configuration of FIGS. 15A, 15B, 15C, 17A, and 17B. In other words, a one-rank memory and a two-rank memory can be realized by a single printed wiring board design.

Eleventh Embodiment

FIGS. 16A, 16B, 16C, 16D, 16E, 18A, 18B, 18C, and 18D show a circuit configuration of a memory according to an eleventh embodiment of the present invention. The eleventh embodiment shows a four-rank configuration with a data bus width of 64 bits. Parity/ECC has a bit width of not exceeding 8 bits. This configuration uses an SDRAM device 200b-1, an SDRAM device 200b-2, an SDRAM device 200b-3, an SDRAM device 200b-4, an SDRAM device 200b-5, an SDRAM device 200d-1, an SDRAM device 200d-2, an SDRAM device 200d-3, and an SDRAM device 200d-4 each having a data width of 32 bits (×32).

Briefly, the configuration of the eleventh embodiment is formed by doubling a data bus width to 64 bits in the configuration of the ninth embodiment. Thus, a circuit configuration corresponding to FIGS. 16A to 16E is the same as that described above in the ninth embodiment. The memory of the eleventh embodiment has a 64-bit width achieved by adding a configuration of FIGS. 18A to 18D corresponding to the circuit configuration of the ninth embodiment responsible for the data section. The configuration of parity/ECC will not be described as it is the same as that of the ninth embodiment. Thus, the operation of the eleventh embodiment is substantially the same as that of the ninth embodiment, and therefore the operation of the memory as a whole will not be described.

As described above, in the eleventh embodiment, the four-rank memory is formed using nine SDRAM devices 200. A three-rank memory can obviously be formed using seven SDRAM devices 200 (200b-1, 200b-2, 200b-3, 200b-5, 200d-1, 200d-2, and 200d-3). Further, a two-rank memory can easily be formed using five SDRAM devices 200 (200b-1, 200b-2, 200b-5, 200d-1, and 200d-2) A one-rank memory can easily be formed using three SDRAM devices 200 (200b-1, 200b-5, and 200d-1). Further, a one-rank memory, a two-rank memory, a three-rank memory, and a four-rank memory can be formed easily using a printed wiring board same as a printed wiring board for realizing the configuration of the eleventh embodiment.

<Effect>

As described above, in the present examples, a rank to be accessed is selected using DQM (data mask signal) instead of CS# (chip select signal). Data output (input) is controlled only by determining whether or not data is to be masked. This can achieve faster data access than the conventional CS# control method by eliminating performance penalty of wait time insertion for avoiding a conflict between ranks in some cases. Further, a rank is selected using a low-order bit of an address to increase an apparent page size in an SDRAM fast page mode. This is expected to improve performance.

If any of the following configurations is employed, for example, the number of SDRAM devices for parity/ECC can be smaller than the number of ranks, thereby reducing waste:
(i) To realize parity/ECC of not exceeding eight bits using an SDRAM device having a 16-bit data port;
(ii) To realize parity/ECC of not exceeding eight bits using an SDRAM device having a 32-bit data port;
(iii) To realize parity/ECC of not exceeding 16 bits using an SDRAM device having a 32-bit data port; and
(iv) To realize parity/ECC of not exceeding 24 bits in a multi-rank memory having three ranks or more using an SDRAM device having a 32-bit data port.

The DQM control is applicable to the memories of the above-described configurations. This DQM control may be executed by an SDRAM controller or by a processor further functioning as the SDRAM controller.

<Comparison Between Patent Documents, and Consideration>

(1) The patent document 1 described above discloses a technique allowing use of a memory module having a bus width larger than the width of an internal bus in an electronic device. To achieve this, according to the technique disclosed by patent document 1, data input and data output to and from data input/output terminals are made in parallel between segments while a signal for identifying data is decoded partially to generate a mask signal (as described in Claim 1, for example). However, the present invention controls SDRAM devices and is intended for increasing a memory capacity and improving performance. In contrast, The technique described in patent document 1 largely differs from the technique of the present invention in that the technique in patent document 1 controls a memory module and is intended to use a memory module having a bus width wider than internal bus width of an electronic device.

Patent document 1 describes nothing about parity or an ECC. It is difficult to apply the technique of patent document 1 to a memory module with parity/ECC. A common memory module with parity/ECC generally has only one data mask signal for parity/ECC. Hence, selection of a segment is difficult based on the technique of patent document 1. As a result, the technique of patent document 1 is considered to be applicable only to a memory module without parity/ECC. By contrast, according to the technique of the present invention, the invention can be implemented as a memory configuration with parity/ECC as described above, which cannot be handled by patent document 1. Thus, the technique of the present invention makes it possible to realize a highly-reliable memory.

Further, the technique of the present invention can reduce the number of SDRAM devices for parity/ECC, compared to the conventional multi-rank control using CS# (chip select signal) The technique of the present invention can also contribute to improvement of memory access performance.

(2) The technique of patent document 2 described above is to deliver a DQM signal (data mask signal) using an address line so as to coincide with timing of not using the address line (specifically, timing of negating CS#). Patent document 2 states that signal lines for the data mask signal can be reduced accordingly. Thus, the technique of patent document 2 considerably differs from the technique of the present invention in terms of purpose and technical principle to be employed. The data mask signal in patent document 2 is used for general purpose of controlling access to a byte lane. Unlike that of the present invention, this data mask signal is not used for selection of a rank.

(3) The technique of patent document 3 described above is intended to provide an SDRAM interface as an integrated interface for housing two sets of "a processor and an SDRAM" into an SIP. The technique of patent document 3 considerably differs from the technique of the present invention in terms of purpose and technical principle to be employed. The data mask signal in patent document 3 is used for general purpose of controlling access to a byte lane. Unlike that of the present invention, this data mask signal is not used for selection of a rank.

While the embodiment of the present invention has been described in detail, the above-described embodiment merely shows the specific examples for implementing the present invention. The technical scope of the present invention is not limited to the above-descried embodiment. Various changes can be made to the present invention within a range not deviating from the substance of the present invention. These changes are also covered by the technical scope of the present invention.

EXPLANATION OF REFERENCE NUMERALS

10 Processor
12 SDRAM device
14 SDRAM controller
16 Data line
20a, 20b, 20c, 20d SDRAM device
22a DQM0
22b DQM1
100a, 100b, 100c, 100d, 100e, 100f, 100g, 100h, 100i, 100j SDRAM device
104 Conflict
106 Processor address
108 Active command address
110 Read/write command address
112 Rank bit
114a DQM0
114b DQM1
114c DQM2
114d DQM3
200a, 200b, 200c, 200d SDRAM device

What is claimed is:

1. A multi-rank SDRAM control method of controlling a multi-rank SDRAM formed by connecting data ports of multiple SDRAM devices,
   wherein each of the ranks of the multi-rank SDRAM is directly connected to a same set of data lines for data input or data output as different ranks of the multi-rank SDRAM such that the data input or the data output is only performed for one of the ranks of the multi-rank SDRAM at a time, and
   wherein, in each of the multiple SDRAM devices, a chip select signal is common to all the ranks, data mask signals are separated for each rank, and only a data mask signal of the SDRAM device of a rank to be accessed is negated, whereby an access to the rank is executed.

2. The multi-rank SDRAM control method according to claim 1, wherein the data mask signal is a signal for masking data to be read or to be written in units of byte lanes.

3. The multi-rank SDRAM control method according to claim 1, wherein one or more SDRAM devices of the multiple SDRAM devices are SDRAM devices for parity or an ECC, or for parity and an ECC.

4. An SDRAM controller that executes the multi-rank SDRAM control method according to claim 1.

5. A multi-rank SDRAM control method of controlling a multi-rank SDRAM formed by connecting data ports of multiple SDRAM devices,
   wherein each of the ranks of the multi-rank SDRAM is directly connected to a same set of data lines for data input or data output as different ranks of the multi-rank SDRAM such that the data input or the data output is only performed for one of the ranks of the multi-rank SDRAM at a time,
   wherein, in each of the multiple SDRAM devices, a chip select signal is common to all the ranks, data mask signals are separated for each rank, and only a data mask signal of the SDRAM device of a rank to be accessed is negated, whereby an access to the rank is executed,
   wherein the multi-rank SDRAM has as many ranks as any power of two, and the rank is selected using a low-order bit of an address of the multi-rank SDRAM, and
   wherein an address bit group in a place one bit higher than the low-order bit used for selecting the rank is used as a column address of the multiple SDRAM devices.

* * * * *